(12) United States Patent
Chuang et al.

(10) Patent No.: US 12,417,918 B2
(45) Date of Patent: Sep. 16, 2025

(54) SEMICONDUCTOR DEVICE HAVING DOPED GATE DIELECTRIC LAYER AND METHOD FOR FORMING THE SAME

(71) Applicant: Taiwan Semiconductor Manufacturing Co., Ltd., Hsinchu (TW)

(72) Inventors: Yao-Teng Chuang, Hsinchu (TW); Kuei-Lun Lin, Keelung (TW); Te-Yang Lai, Hsinchu (TW); Da-Yuan Lee, Jhubei (TW); Weng Chang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 415 days.

(21) Appl. No.: 18/152,601

(22) Filed: Jan. 10, 2023

(65) Prior Publication Data
US 2023/0317790 A1 Oct. 5, 2023

Related U.S. Application Data

(60) Provisional application No. 63/411,441, filed on Sep. 29, 2022, provisional application No. 63/362,051, filed on Mar. 29, 2022.

(51) Int. Cl.
*H01L 21/28* (2025.01)
*H10D 30/67* (2025.01)
(Continued)

(52) U.S. Cl.
CPC ..... *H01L 21/28185* (2013.01); *H10D 30/673* (2025.01); *H10D 30/6757* (2025.01);
(Continued)

(58) Field of Classification Search
CPC ............. H01L 21/28185; H10D 30/01; H10D 30/014; H10D 30/019–0198;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

TW 201812862 A 4/2018
TW 202004999 A 1/2020
(Continued)

*Primary Examiner* — Cheung Lee
(74) *Attorney, Agent, or Firm* — Slater Matsil, LLP

(57) ABSTRACT

In an embodiment, a semiconductor device is provided, which includes a first doped gate dielectric layer and a second doped gate dielectric layer, wherein the first doped gate dielectric layer and the second doped gate dielectric layer comprise a high-k material doped with a dipole dopant. The second doped gate dielectric layer has a second concentration of the first dipole dopant. The concentration of the dipole dopant in the first doped gate dielectric layer is greater than the concentration, and the concentration peak of the dipole dopant in the first doped gate dielectric layer is deeper than the concentration peak of the dipole dopant in the second doped gate dielectric layer. A first gate electrode over the first doped gate dielectric layer, and a second gate (Continued)

electrode over the second doped gate dielectric layer, the first gate electrode and the second gate electrode have a same width.

20 Claims, 66 Drawing Sheets

(51) Int. Cl.
*H10D 62/10* (2025.01)
*H10D 84/01* (2025.01)
*H10D 84/03* (2025.01)

(52) U.S. Cl.
CPC ....... *H10D 62/121* (2025.01); *H10D 84/0128* (2025.01); *H10D 84/038* (2025.01)

(58) Field of Classification Search
CPC ................. H10D 30/43; H10D 30/435; H10D 30/501–509; H10D 30/673; H10D 30/6735; H10D 30/674; H10D 30/6757; H10D 62/121; H10D 62/822; H10D 62/83; H10D 64/01; H10D 64/017; H10D 64/685; H10D 64/691; H10D 84/01; H10D 84/0128; H10D 84/0144; H10D 84/0181; H10D 84/038; H10D 84/8311; H10D 84/8312; H10D 84/83138; H10D 84/8314; H10D 84/8316; H10D 84/85; H10D 84/851–852

See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 10,825,736 | B1 * | 11/2020 | Zhang ................ H10D 84/0144 |
| 11,121,041 | B2 | 9/2021 | Chen et al. |
| 11,171,003 | B2 | 11/2021 | Liao et al. |
| 11,177,259 | B2 | 11/2021 | Cheng et al. |
| 2021/0134951 | A1 | 5/2021 | Chen et al. |
| 2021/0343958 | A1 | 11/2021 | Vasen et al. |
| 2021/0391225 | A1 | 12/2021 | Cheng et al. |
| 2022/0077162 | A1 | 3/2022 | Hong et al. |

FOREIGN PATENT DOCUMENTS

| | | |
|---|---|---|
| TW | 202114221 A | 4/2021 |
| TW | 202211390 A | 3/2022 |

\* cited by examiner

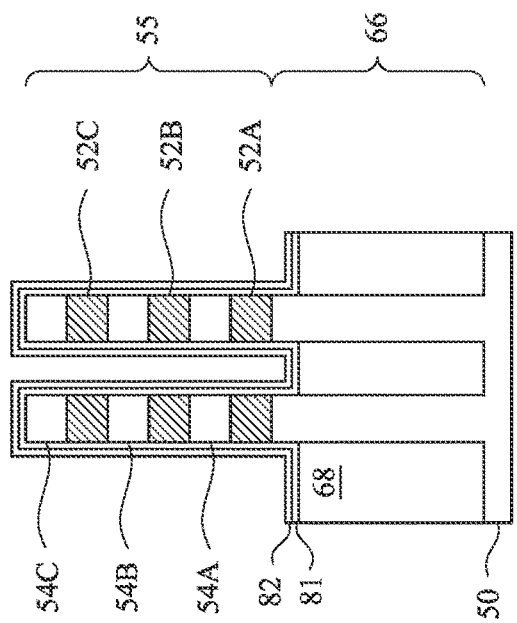
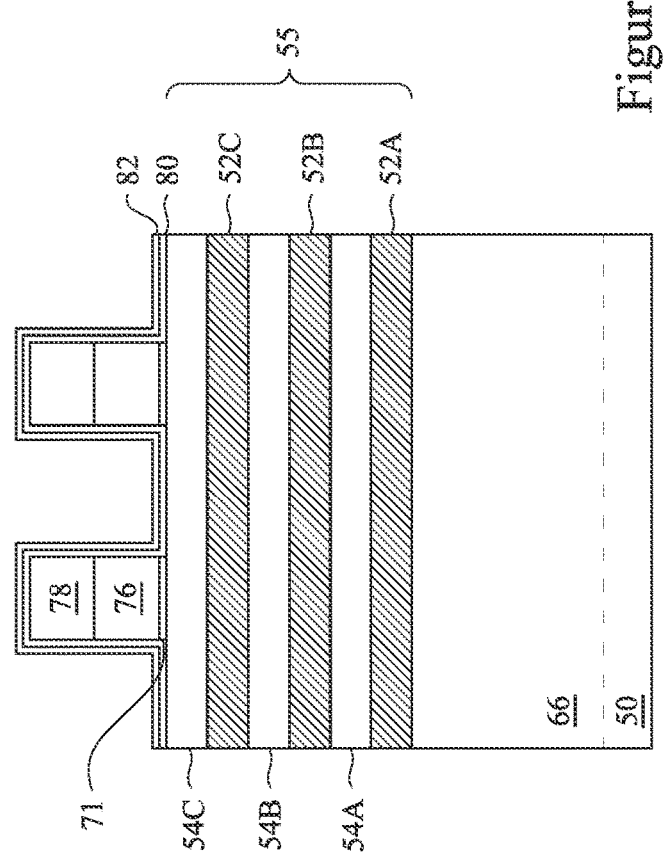
Figure 7A
Figure 7B

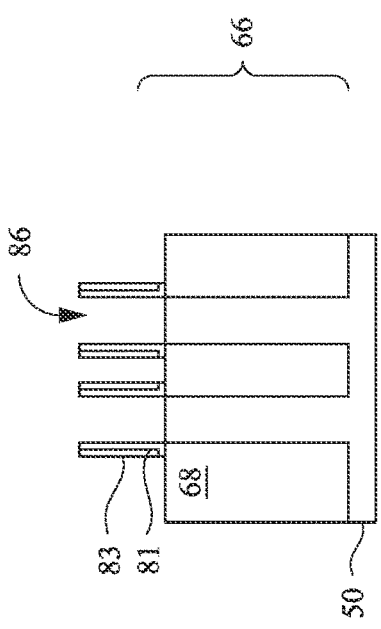
Figure 11A
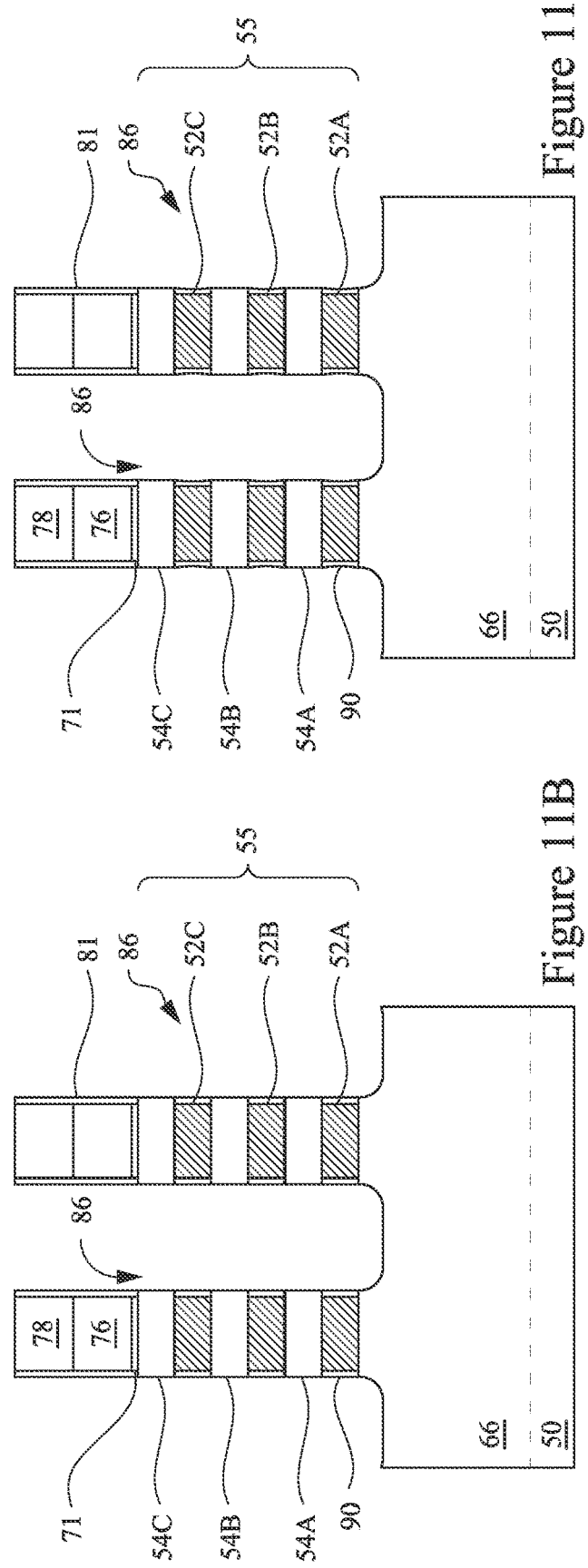
Figure 11B
Figure 11C

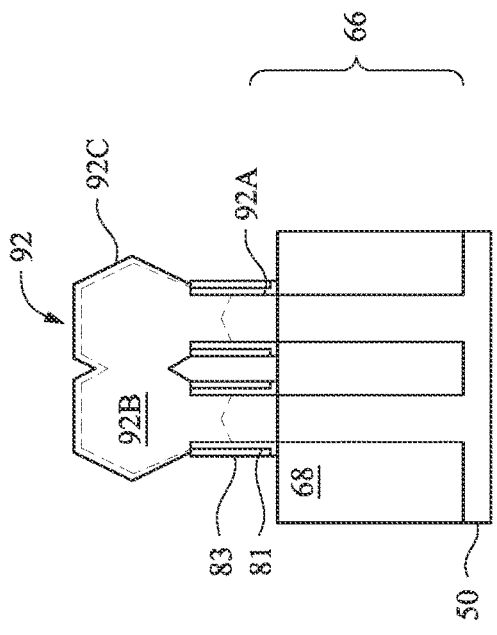
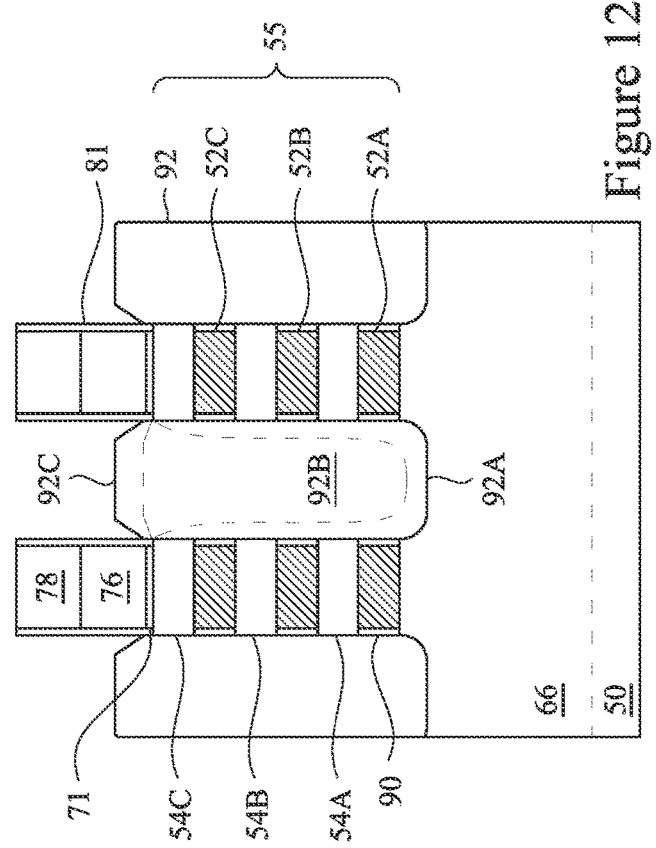
Figure 12A
Figure 12B

US 12,417,918 B2

SEMICONDUCTOR DEVICE HAVING DOPED GATE DIELECTRIC LAYER AND METHOD FOR FORMING THE SAME

PRIORITY CLAIM AND CROSS-REFERENCE

This application claims the benefit of U.S. Provisional Application No. 63/362,051, filed on Mar. 29, 2022, and entitled with "Single Metal gate for N/PFETs Vt Offering by Dipole Application," and U.S. Provisional Application No. 63/411,441, filed on Sep. 29, 2022, and entitled with "Semiconductor Device having Doped Gate Dielectric Layer and Method for Forming the Same", which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, 25B, 26A, 26B, 27A, 27B, 28A, 28B, 29A, 29B, 30A, 30B, 30C, 31A, 31B, 31C, 32A, 32B, 32C, 33A, 33B, 34A, 34B, 35A, and 35B are cross-sectional views of intermediate stages in the manufacturing of nano-FETs, in accordance with some embodiments.

DETAILED DESCRIPTION

Figure 1:
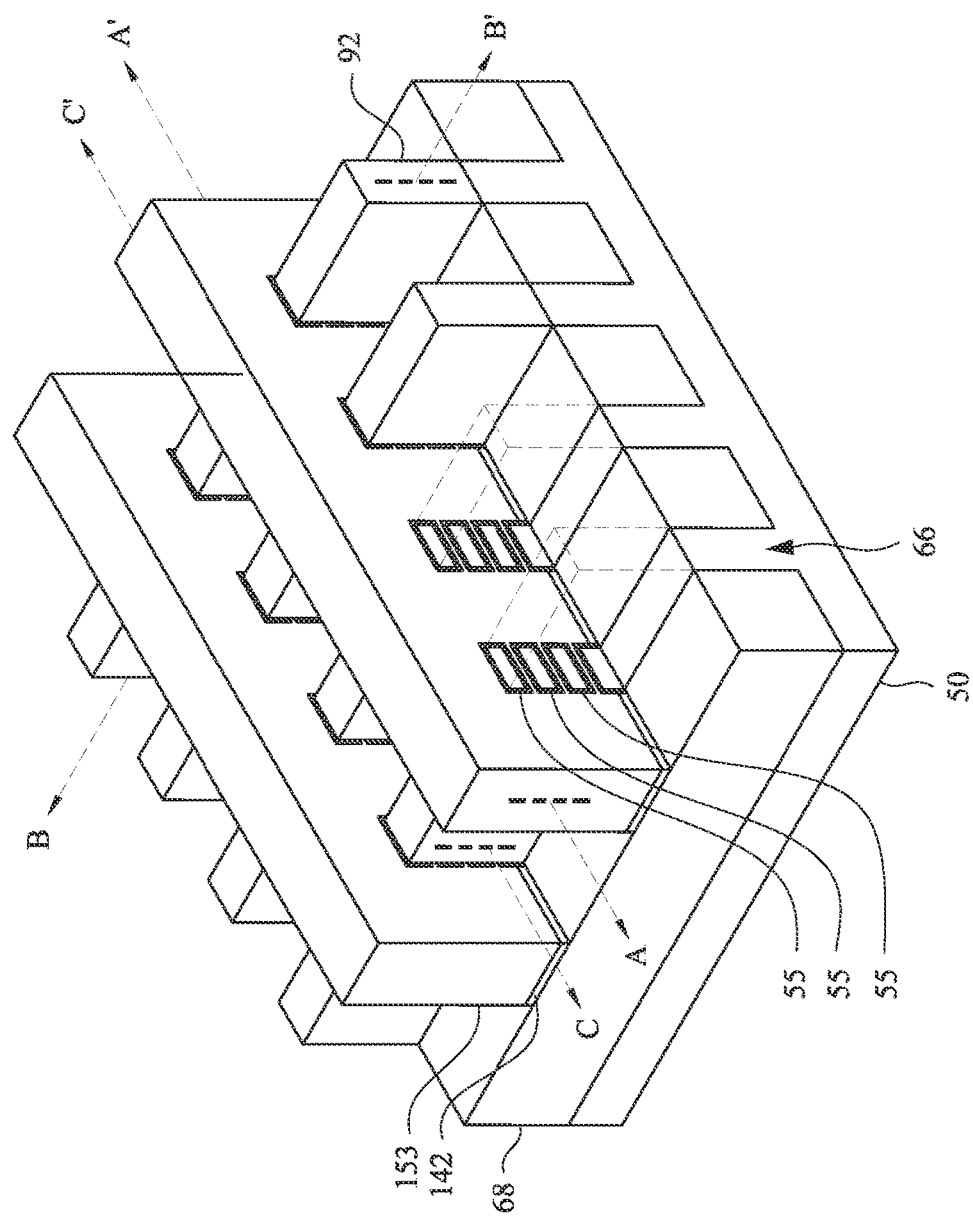
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed in greater detail below, embodiments illustrated in the present disclosure provide semiconductor devices which comprise doped gate dielectric layers. In particular, the doped dielectric layers are doped with one or more dipole dopants so as to affect the threshold voltages of gate structures and provide the gate structures to have various threshold voltages in various regions. In some embodiments, each dipole dopant material may be doped into a gate dielectric layer by an individual doping loop. Thus, the concentration and concentration profiles of each dipole dopant in one or more doped gate dielectric layers may be individually controlled.

Embodiments are described below in a particular context, e.g., a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs 10 (e.g., nanowire FETs, nanosheet FETs, or the like) in a three-dimensional view, in accordance with some embodiments. The nano-FETs 10 comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 is illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layer 142 are over top surfaces of the fins 66 and along top surfaces, sidewalls, and bottom surfaces of the nanostructures 55. Gate electrodes 153 are over the gate dielectric layer 142. Epitaxial source/drain regions 92 are disposed on the fins 66 on opposing sides of the gate dielectric layers 142 and the gate electrodes 153.

FIG. 1 further illustrates reference cross-sections that are used in later figures. Cross-section A-A' is along a longitudinal axis of a gate electrode 153 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 32C are cross-sectional views of intermediate stages in the manufacturing of nano-FETs 10, in accordance with some embodiments. FIGS. 2 through 5, 6A, 13A, 14A, 15A, 16A, 17A, 18A, 19A, 20A, 21A, 22A, 23A, 24A, 25A, 26A, 27A, 28A, 29A, 30A, 31A, and 32A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 22B, 23B, 24B, 25B, 26B, 27B, 28B, 29B, 30B, 31B, and 32B illustrate reference cross-section B-B' illustrated in FIG. 1. FIGS. 7A, 8A, 9A, 10A, 11A, 12A, 12C, 13C, 30C, 31C, and 32C illustrate reference cross-section C-C' illustrated in FIG. 1. FIGS. 2-15B, 30C, 31C, and 32C illustrate features in either the first region 50A, the second region 50B, or the third region 50C.

Figure 2:
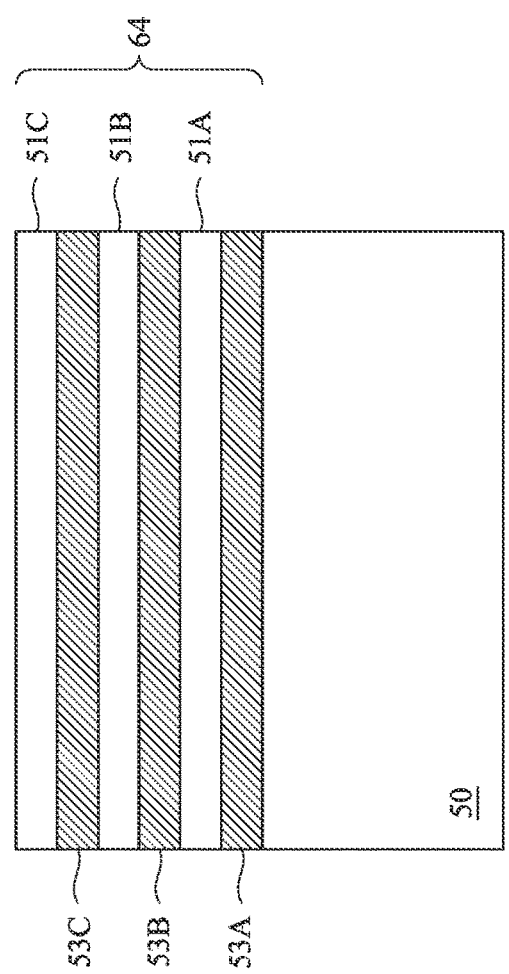

In FIG. 2, a substrate 50 is provided for forming the nano-FETs 10. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material. Similarly, the second semiconductor layers 53 of the second semiconductor material may be removed without significantly removing the first semiconductor layers 51. For purposes of illustration and as discussed in greater detail below, the first semiconductor layers 51 will be removed, and the second semiconductor layers 53 will be patterned to form channel regions of the nano-FETs 10. Nevertheless, in some embodiments, the second semiconductor layer 53 will be removed, and the first semiconductor layer 51 may be patterned to form channel regions of the nano-FETs 10.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like.

Figure 3:
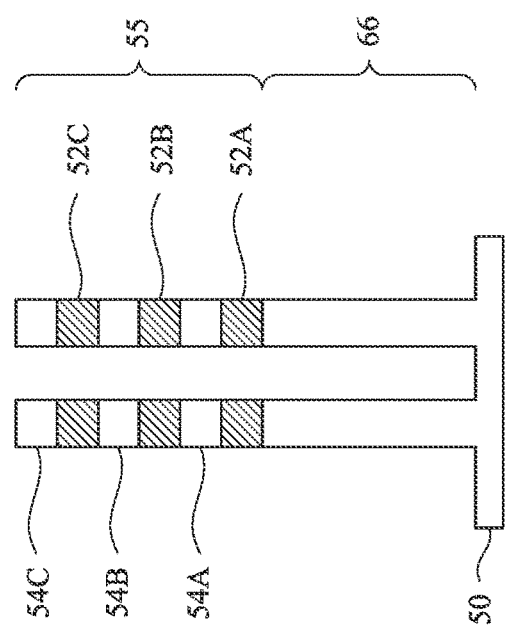

Referring to FIG. 3, fins 66 are formed in the substrate 50, and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66 and the nanostructures 55.

FIG. 3 illustrates each of the fins 66 and the nanostructures 55 as having a consistent width throughout, in some embodiments, the fins 66 and/or the nanostructures 55 may have tapered sidewalls such that a width of each of the fins 66 and/or the nanostructures 55 increases in a direction towards the substrate 50. In such embodiments, each of the nanostructures 55 may have a different width and be trapezoidal in shape.

Figure 4:
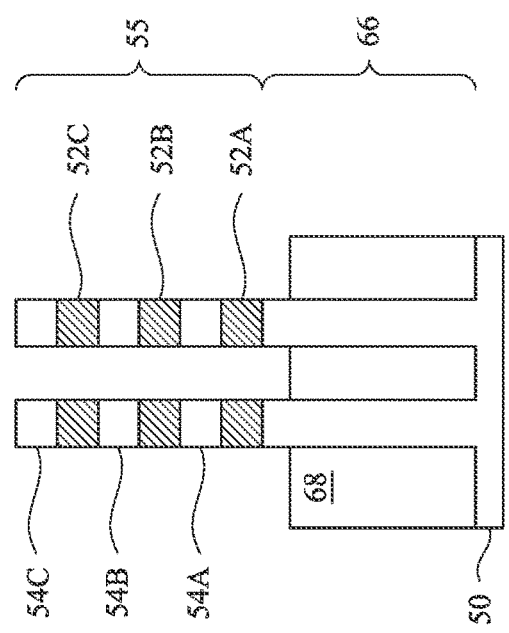

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the first region 50A and the second region 50B protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further in FIG. 4, appropriate wells (not separately illustrated) may be formed in the fins 66 and nanostructures 55, and/or the substrate 50. The wells may have a conductivity type opposite from a conductivity type of source/drain regions that will be subsequently formed in each of the n-type region and the p-type region. In some embodiments, a p-type well is formed in the n-type region, and an n-type well is formed in the p-type region. In some embodiments, a p-type well or an n-type well is formed in both the n-type region and the p-type region. The n-type well may be formed by performing an n-type impurity implant. The n-type impurities may be phosphorus, arsenic, antimony, or the like implanted in the region to a concentration in the range of $10^{13}$ cm$^{-3}$ to $10^{14}$ cm$^{-3}$. The p-type well may be formed by performing a p-type impurity implant. The p-type impurities may be boron, boron fluoride, indium, or the like implanted in the region to a concentration in the range of $10^{13}$ cm$^{-3}$ to $10^{14}$ cm$^{-3}$. After the implants are implanted, an anneal process may be performed to repair damage and activate the p-type and/or n-type impurities that were implanted. In some embodiments in which epitaxial structures are epitaxially grown for the fins 66 and the nanostructures 55, the grown materials may be in situ doped during growth, which may obviate the implantations, although in situ and implantation doping may be used together.

Figure 5:
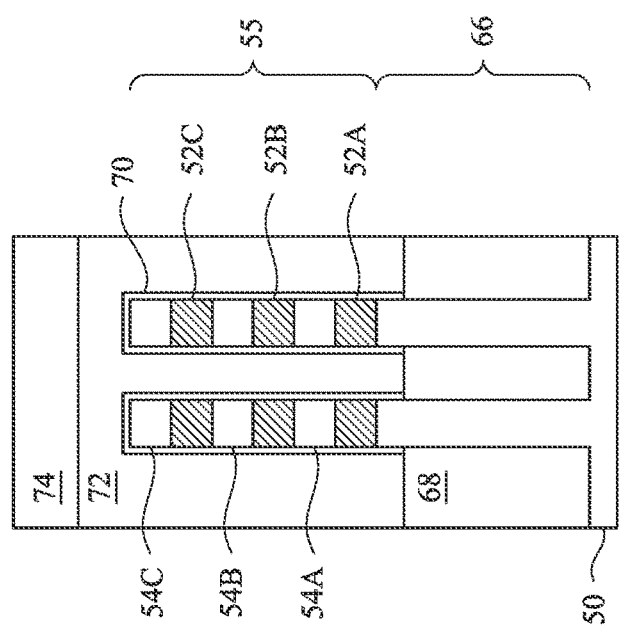

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a chemical mechanical polishing (CMP). The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
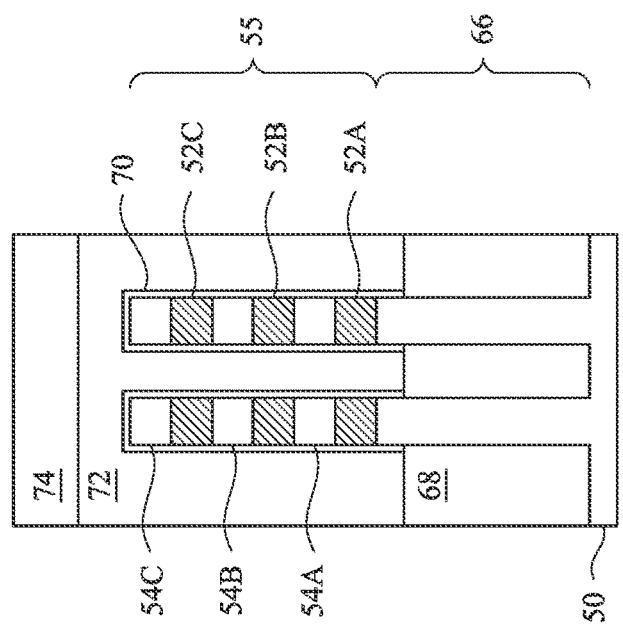
Figure 6B:
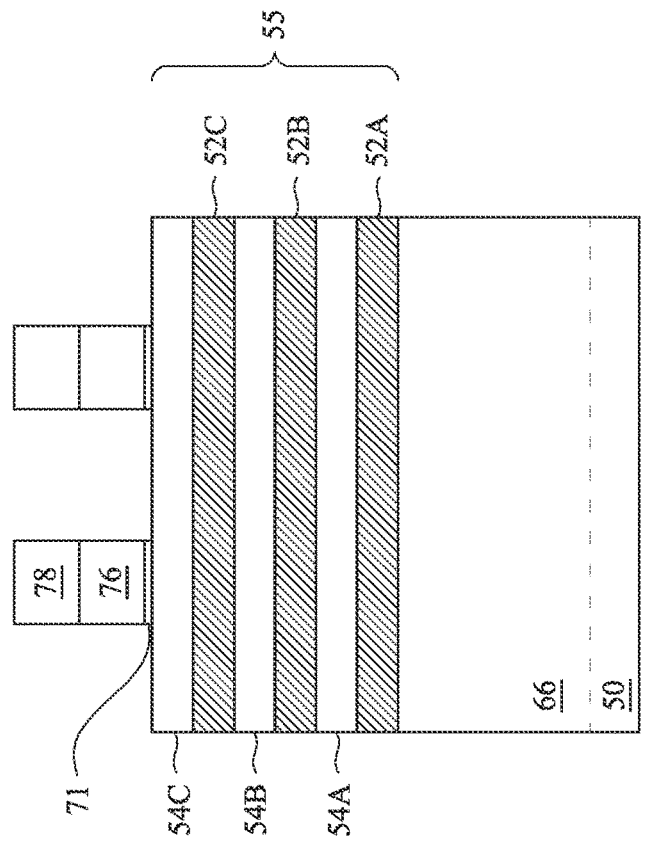

FIGS. 6A through 32C illustrate various additional steps in the manufacturing of nano-FETs 10, in accordance with some embodiments. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68, along top surfaces and sidewalls of the fins 66, the nanostructures 55 and the masks 78, and along sidewalls of the dummy gates 76 and the dummy gate dielectrics 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After forming the first spacer layer 80 and prior to forming the second spacer layer 82, implants for lightly doped source/drain (LDD) regions (not separately illustrated) may be performed. Appropriate type impurities (e.g., n-type or p-type) may be implanted into the fins 66 and/or the nanostructures 55. The n-type impurities may be any of the n-type impurities previously described, and the p-type impurities may be any of the p-type impurities previously described. The LDD regions may have a concentration of impurities in the range of $10^{15}$ cm$^{-3}$ to $10^{19}$ cm$^{-3}$. An anneal process may be used to repair implant damage and to activate the implanted impurities.

Figure 8A:
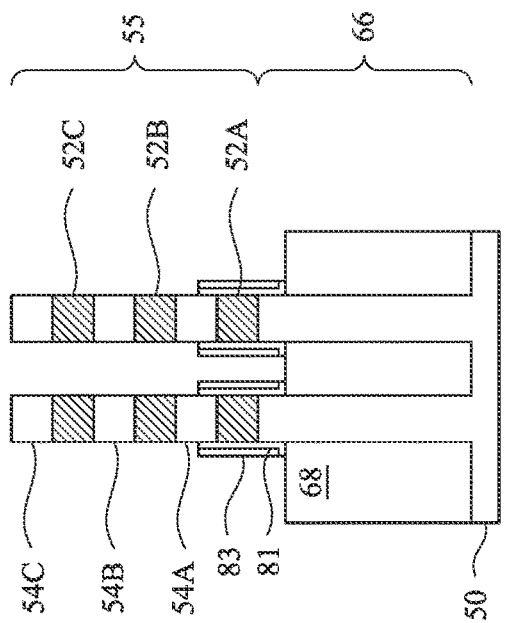
Figure 8B:
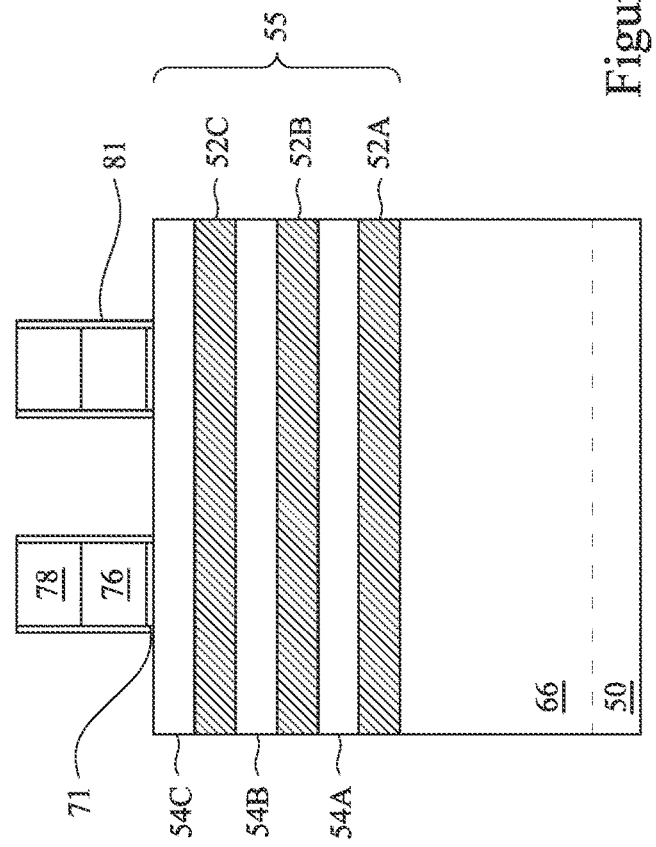

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-align subsequently formed source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etch process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 act as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, a different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
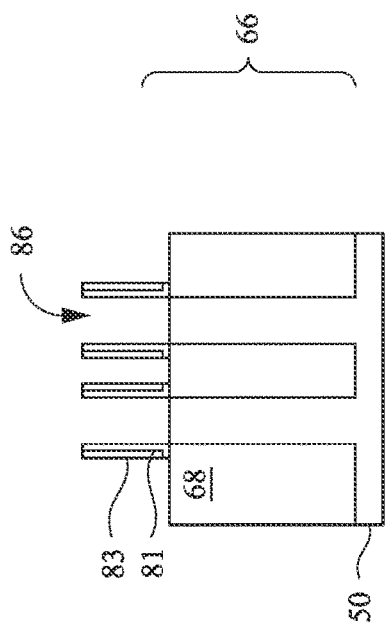
Figure 9B:
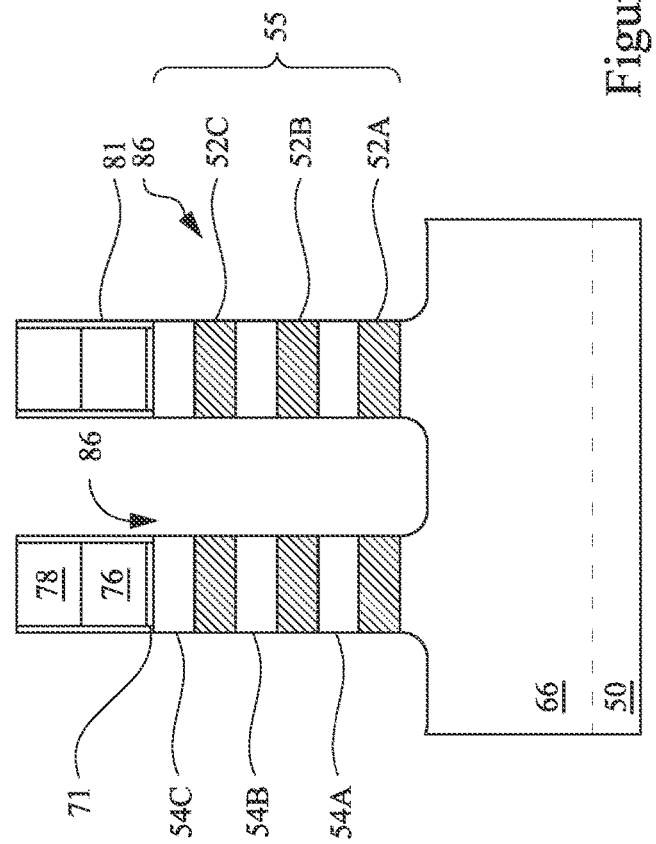

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
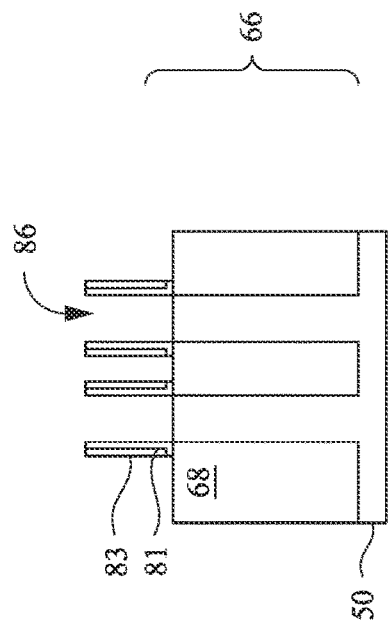
Figure 10B:
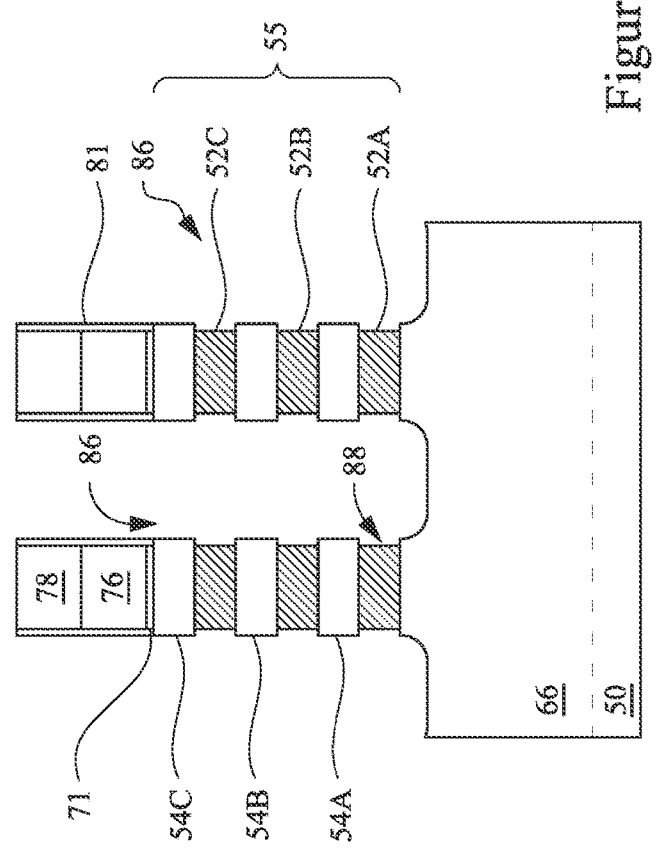

In FIGS. 10A and 10B, portions of sidewalls of the layers of the nanostructures 55 formed of the first semiconductor materials (e.g., the first nanostructures 52) exposed by the first recesses 86 are etched to form sidewall recesses 88. Although sidewalls of the first nanostructures 52 in sidewall recesses 88 are illustrated as being straight in FIG. 10B, the sidewalls may be concave or convex. The sidewalls may be etched using isotropic etching processes, such as wet etch or the like.

In FIGS. 11A-11C, first inner spacers 90 are formed in the sidewall recess 88. The first inner spacers 90 may be formed by depositing an inner spacer layer over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the first region 50A and the second region 50B, the outer sidewalls of the first inner spacers 90 may extend beyond or be recessed from sidewalls of the second nanostructures 54.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers are recessed from sidewalls of the first nanostructures 52. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figure 12C:
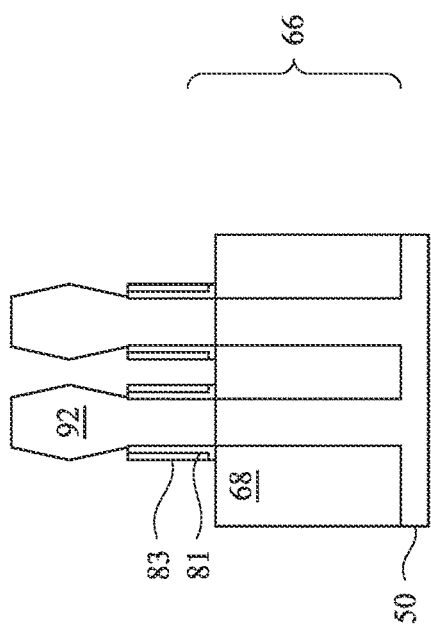

In FIGS. 12A-12C, epitaxial source/drain regions 92 are formed in the first recesses 86. Source/drain region(s) may refer to a source or a drain, individually or collectively dependent upon the context. In some embodiments, the epitaxial source/drain regions 92 may exert stress on the second nanostructures 54, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs 10.

The epitaxial source/drain regions 92 may include any acceptable material, such as appropriate for the n-type or p-type device. For example, when n-type devices are formed, the epitaxial source/drain regions 92 may include materials exerting a tensile strain in the channel regions, such as silicon, SiC, SiCP, SiP, or the like. Likewise, when p-type devices are formed, the epitaxial source/drain regions 92 may include materials exerting a compressive strain in the channel regions, such as SiGe, SiGeB, Ge, GeSn, or the like.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal process. The source/drain regions may have an impurity concentration of between about $1 \times 10^{19}$ atoms/cm³ and about $1 \times 10^{21}$ atoms/cm³. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92, upper surfaces of the epitaxial source/drain regions 92 have facets which expand laterally outward beyond sidewalls of the nanostructures 55. In some embodiments, these facets cause adjacent epitaxial source/drain regions 92 of a same device to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed on a top surface of the STI regions 68, thereby blocking or restricting the lateral epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
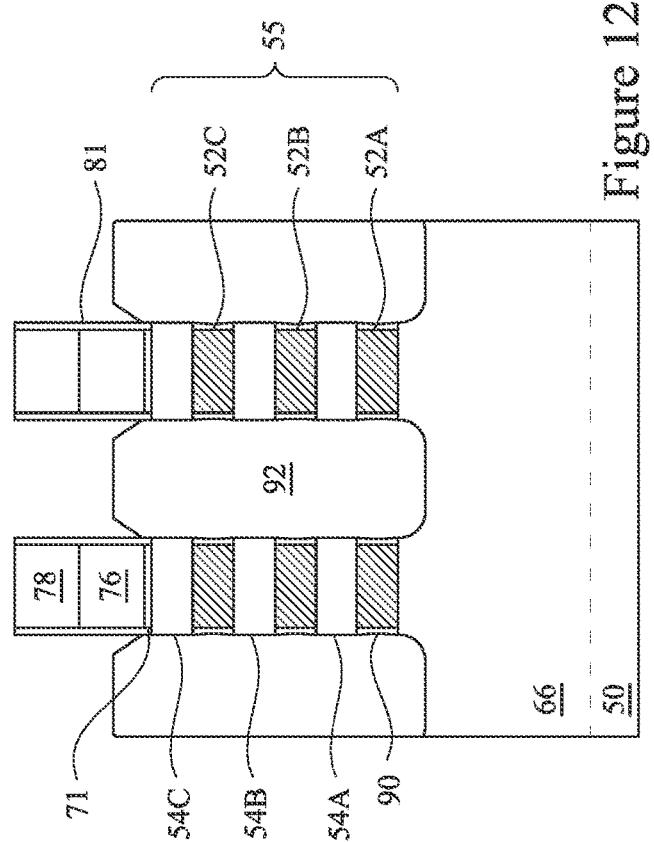

FIG. 12D illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12D, the epitaxial source/drain regions 92 may be formed in contact with the first inner spacers 90 and may extend past sidewalls of the second nanostructures 54.

Figure 13A:
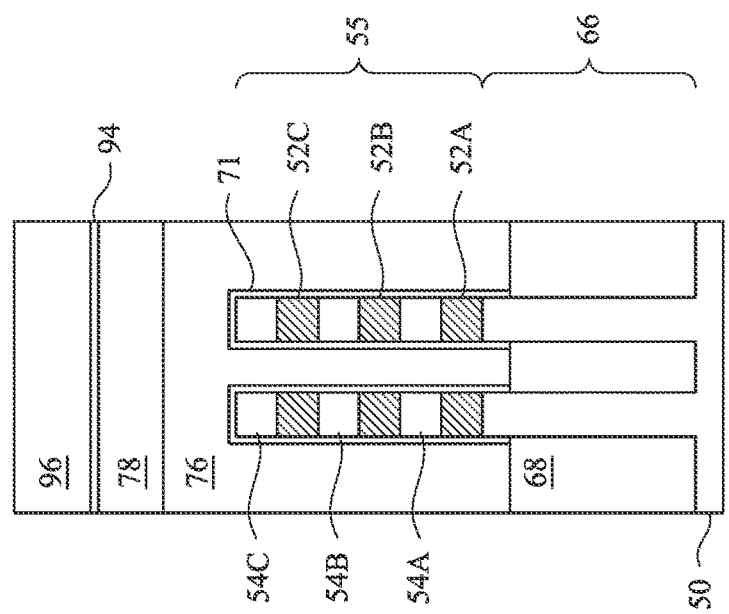
Figure 13B:
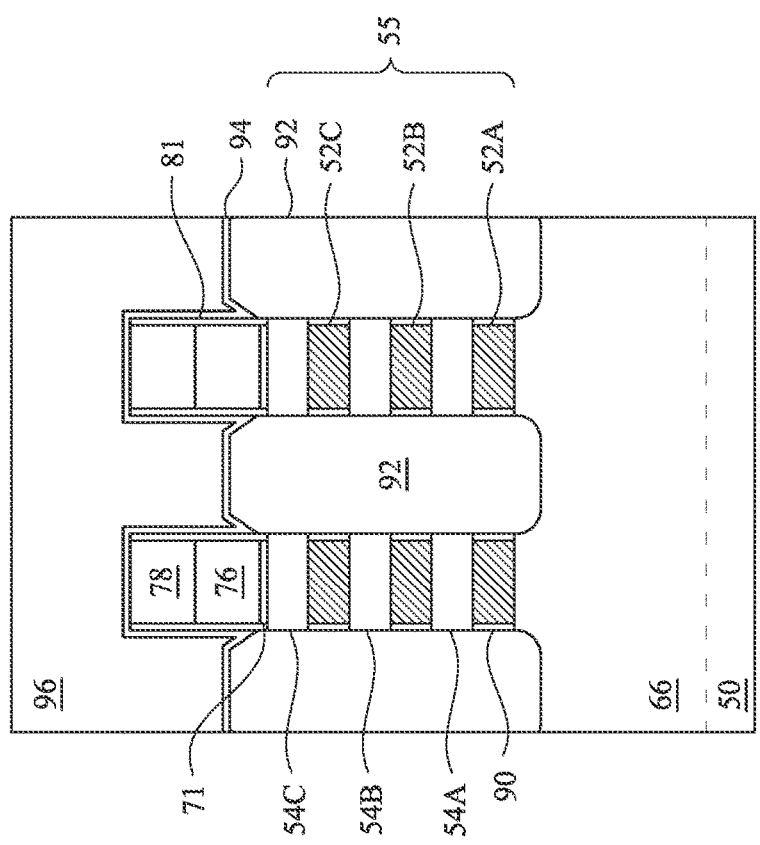
Figure 13C:
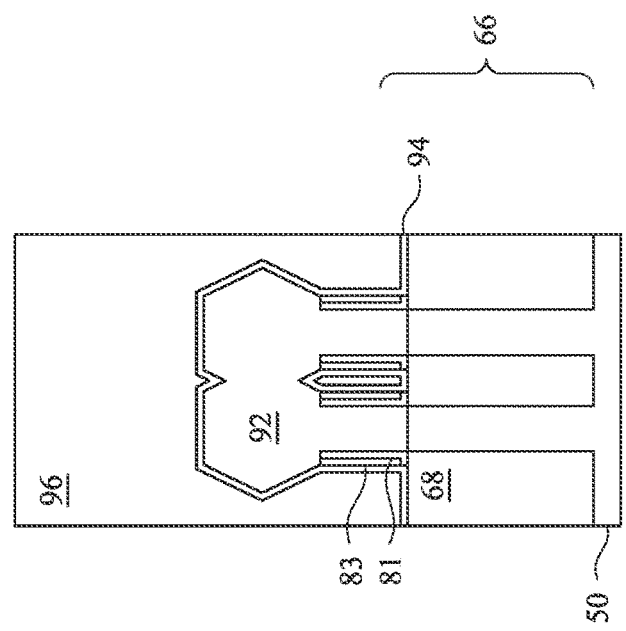

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as silicon nitride, silicon oxide, silicon oxynitride, or the like, having a different etch rate than the material of the first ILD 96.

Figure 14A:
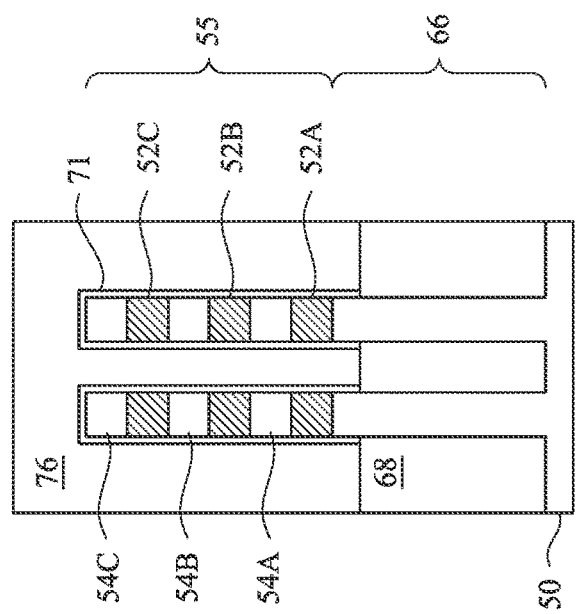
Figure 14B:
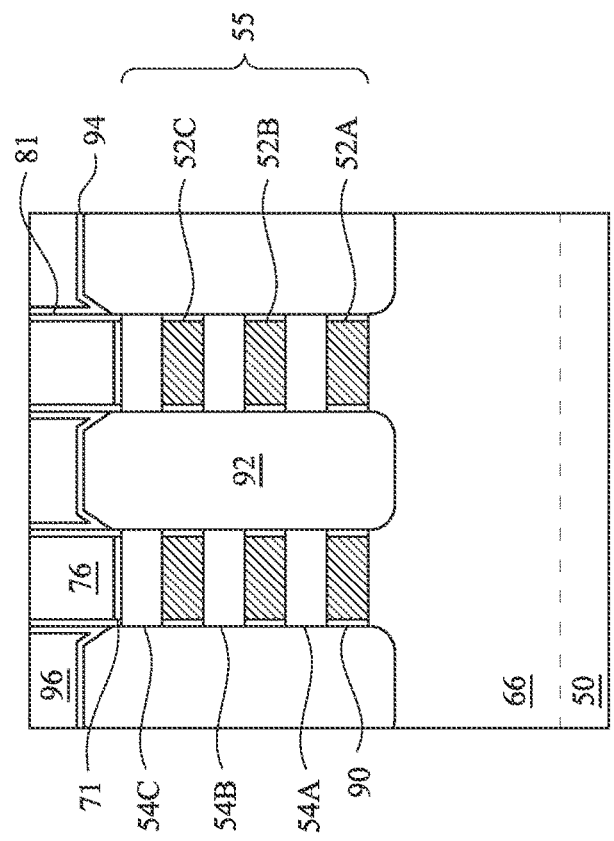

In FIGS. 14A and 14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with the top surface of the masks 78 and the first spacers 81.

Figure 15A:
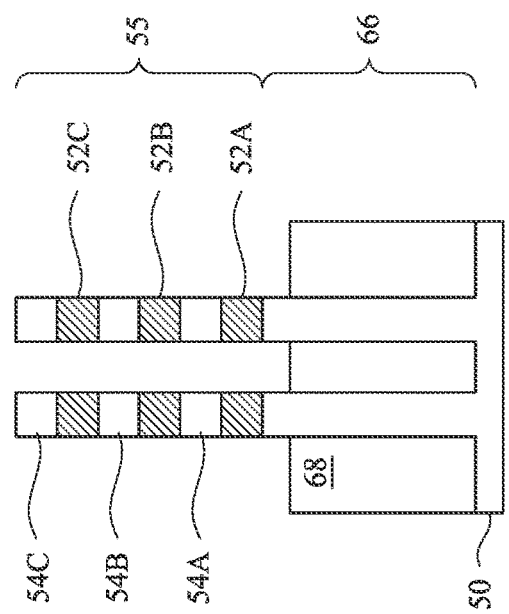
Figure 15B:
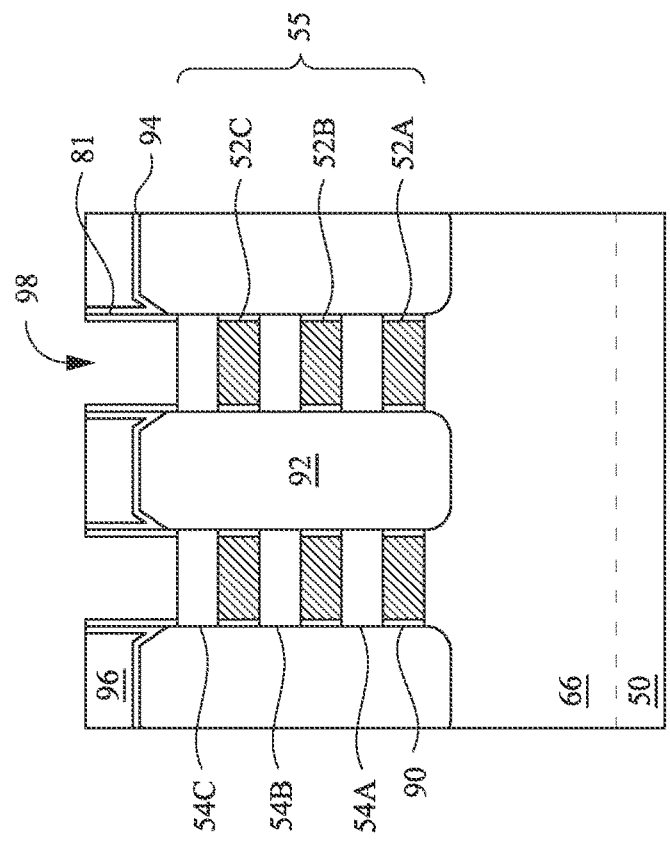

In FIGS. 15A and 15B, the dummy gates 76 and the masks 78 (if present), are removed in one or more etching steps so that second recesses 98 are formed. Portions of the dummy gate dielectrics 71 in the second recesses 98 are also removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55, which act as the channel regions, are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16A:
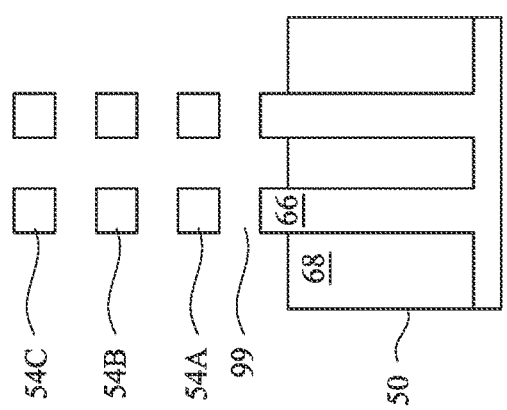
Figure 16B:
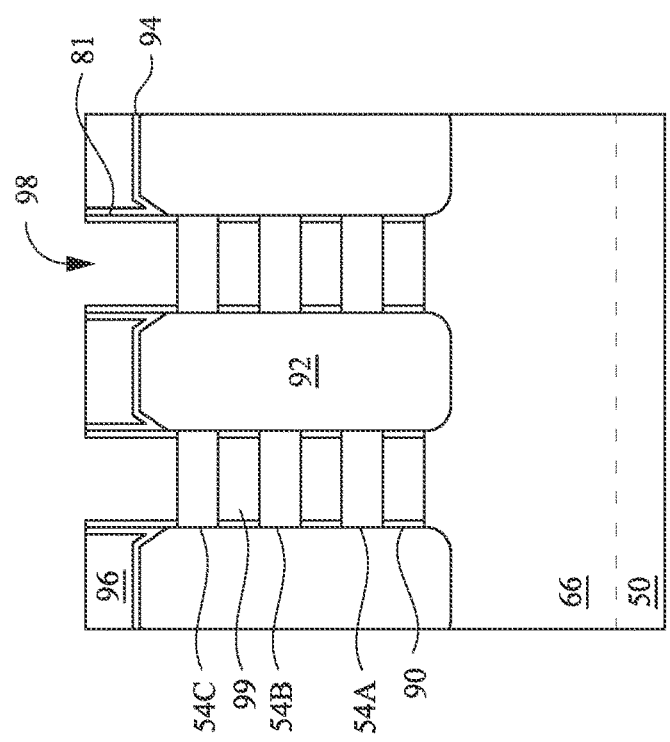

In FIGS. 16A and 16B, the first nanostructures 52 are removed, thereby forming openings 99 between the second nanostructures 54 and/or the fins 66. The first nanostructures 52 may be removed by an isotropic etching process such as wet etch or the like using etchants which are selective to the materials of the first nanostructures 52, while the second nanostructures 54, the substrate 50, the STI regions 68 remain relatively unetched as compared to the first nanostructures 52. In some embodiments in which the first nanostructures 52 include, e.g., SiGe, and the second nanostructures 54A-54C include, e.g., Si or SiC, tetramethylammonium hydroxide (TMAH), ammonium hydroxide (NH4OH), or the like may be used to remove the first nanostructures 52. In some embodiments in which the first nanostructures 52 include, e.g., Si or SiC, and the second nanostructures 54 include, e.g., SiGe, hydrogen fluoride, another fluorine-based etchant, or the like may be used to remove the first nanostructures 52.

The processes described above may be used to form various types of devices (e.g., transistors) in different regions of the substrate. For example, in FIGS. 17A and 17B, three device regions of the substrate 50, such as a first region 50A, a second region 50B, and a third region 50C, are illustrated, and three different types of devices are formed in the first region 50A, the second region 50B, and the third region 50C as discussed in greater detail below. In some embodiments, the first region 50A and the second region 50B have a same conductivity type, such as a p-type. For example, in an embodiment, both the first region 50A and the second region 50B are for forming p-type devices, such as PMOS transistors (e.g., p-type nano-FETs), or n-type devices, such as NMOS transistors (e.g., n-type nano-FETs). In some embodiments, the first region 50A and the second region 50B are for forming different devices and with the same conductivity type. In such embodiment, the first region 50A may be a logic device region, and the second region 50B may be an I/O device region. Alternatively, both the first region 50A and the second region 50B are the logic device region or the I/O region with different functional circuits and with the same conductivity type. In some embodiments, the third region 50C may have a conductivity type different from the first region 50A and the second region 50B. For example, the third region 50C is for forming the n-type devices when the first region 50A and the second region 50B are for forming the p-type devices. Alternatively, the third region 50C is for forming the p-type devices while the first region 50A and the second region 50B are for forming the n-type devices. The first region 50A, the second region 50B, and the third region 50C may be physically separated from each other, and any number of device features (e.g., other active devices, doped regions, isolation structures, etc.) may be disposed therebetween. Although one first region 50A, one second region 50B, and one third region 50C are illustrated, any number of first regions 50A, second regions 50B, and third regions 50C may be provided. It is noted the device as illustrated in FIGS. 2-16B may be implemented in any of the first to third regions 50A, 50B, and 50C.

Figure 17A:
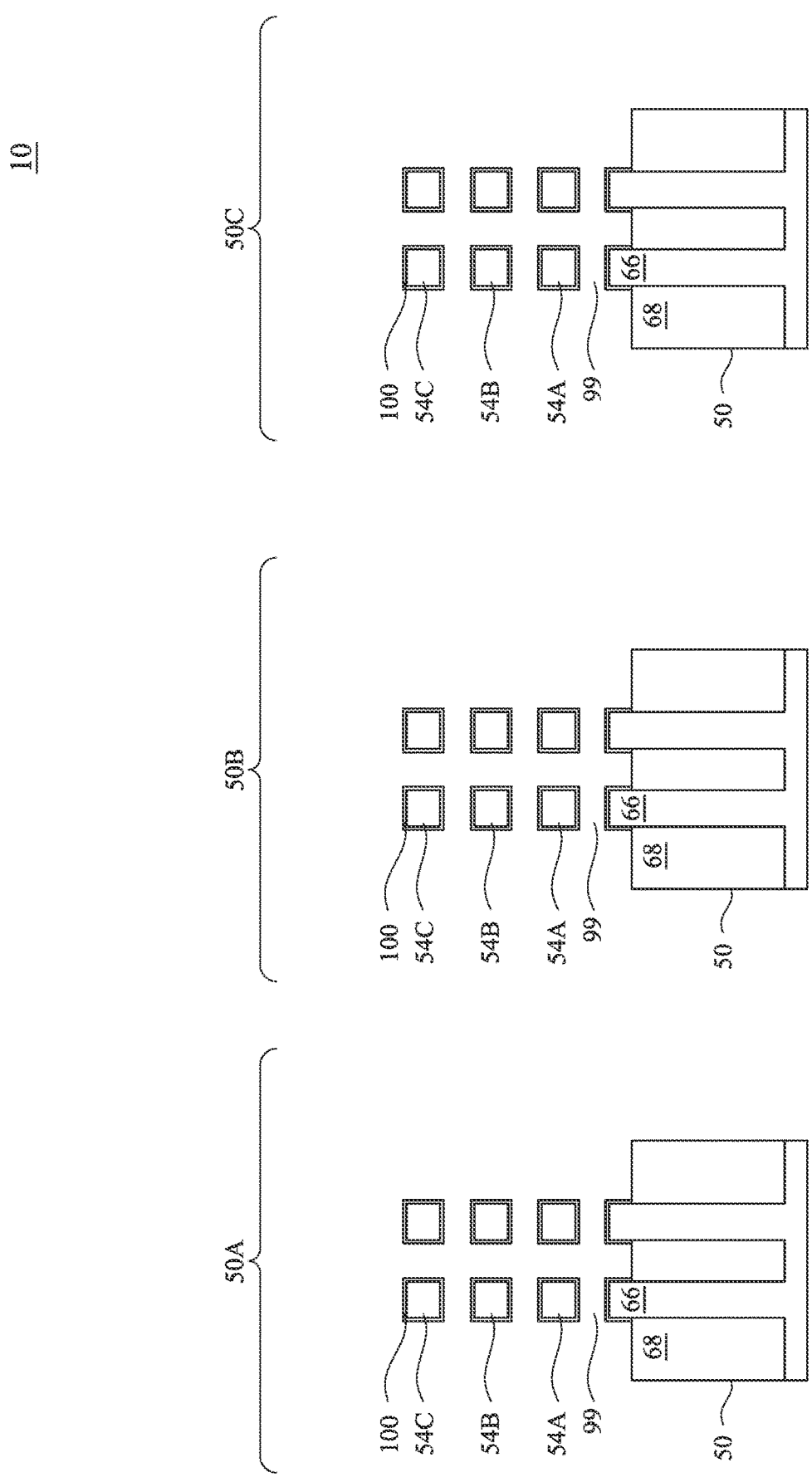
Figure 17B:
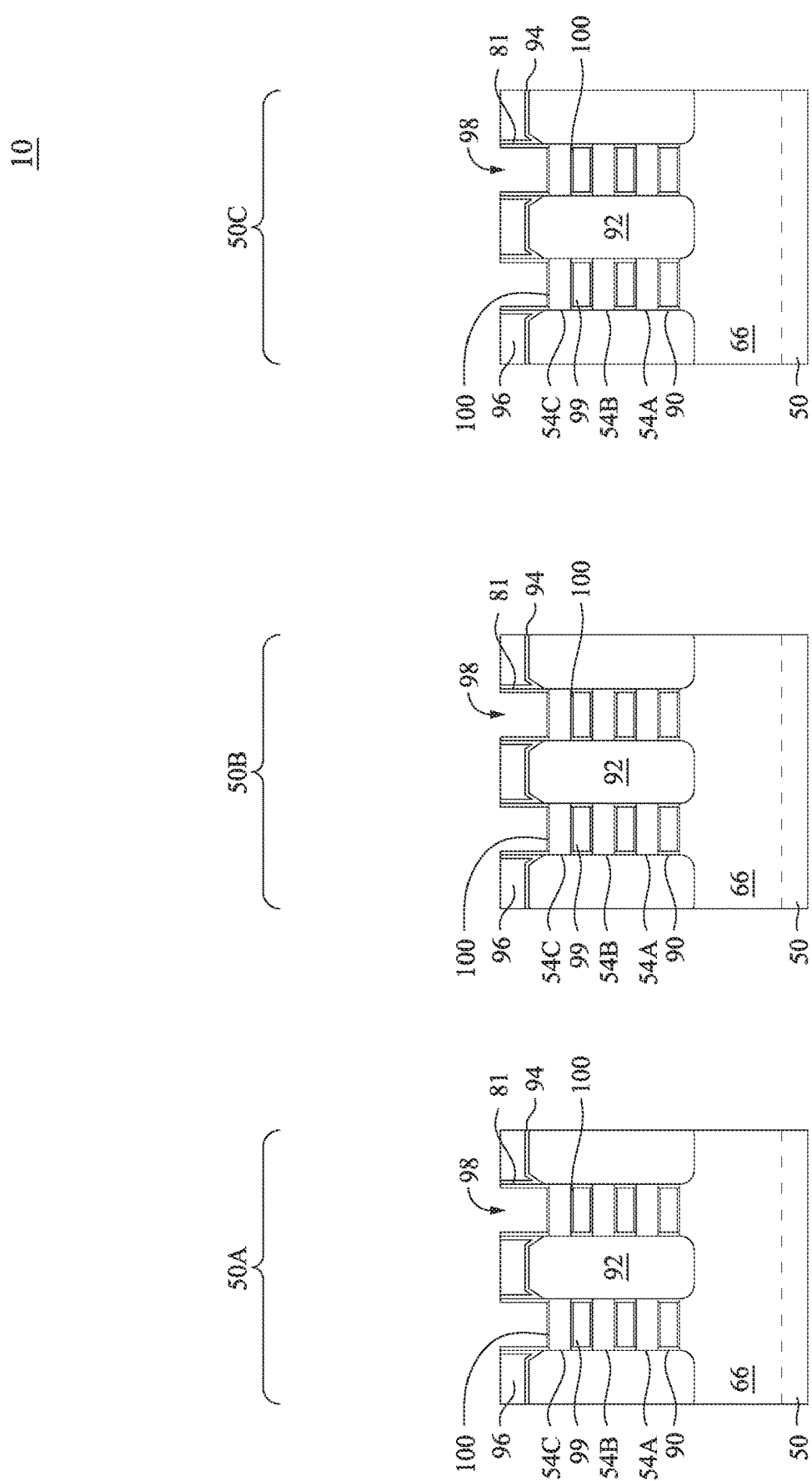

Replacement gates are formed in the second recesses 98 and the openings 99. In FIGS. 17A and 17B, an interfacial layer 100 is formed over exposed surfaces of the second nanostructures 54 and the fins 66 in the first region 50A, the second region 50B, and the third region 50C in accordance with some embodiments. The interfacial layer 100 may include silicon oxide. The interfacial layer 100 may have a thickness of about 10 angstroms to about 30 angstroms. In some embodiments, chemical oxidization using an oxidizing agent such as SPM (a mixture of $H_2SO_4$ and $H_2O_2$), SC1 (a mixture of $NH_4OH$ and $H_2O_2$), or ozone-deionized water (a mixture of $O_3$ and deionized water) is performed to oxidize exterior portions of the second nanostructures 54 and the fins 66. In some embodiments, to form the interfacial layer 100, a thermal oxidization is performed by treating (e.g., soaking) the second nanostructures 54 and the fins 66 in an oxygen-containing gas source, where the oxygen-containing gas source includes, e.g., $N_2O$, $O_2$, a mixture of $N_2O$ and $H_2$, or a mixture of $O_2$ and $H_2$, as examples. The thermal oxidization may be performed at a temperature between about 500° C. and about 1000° C. Note that in the illustrated embodiments, the interfacial layer 100 is formed by oxidizing the exterior portions of the second nanostructures 54 and the fins 66 into an oxide, and therefore, the interfacial layer 100 is selectively formed over the exposed surfaces of the second nanostructures 54, and the fins 66, and is not formed over other surfaces, such as the sidewalls of the first inner spacers 90 and the first spacers 81.

Figure 18A:
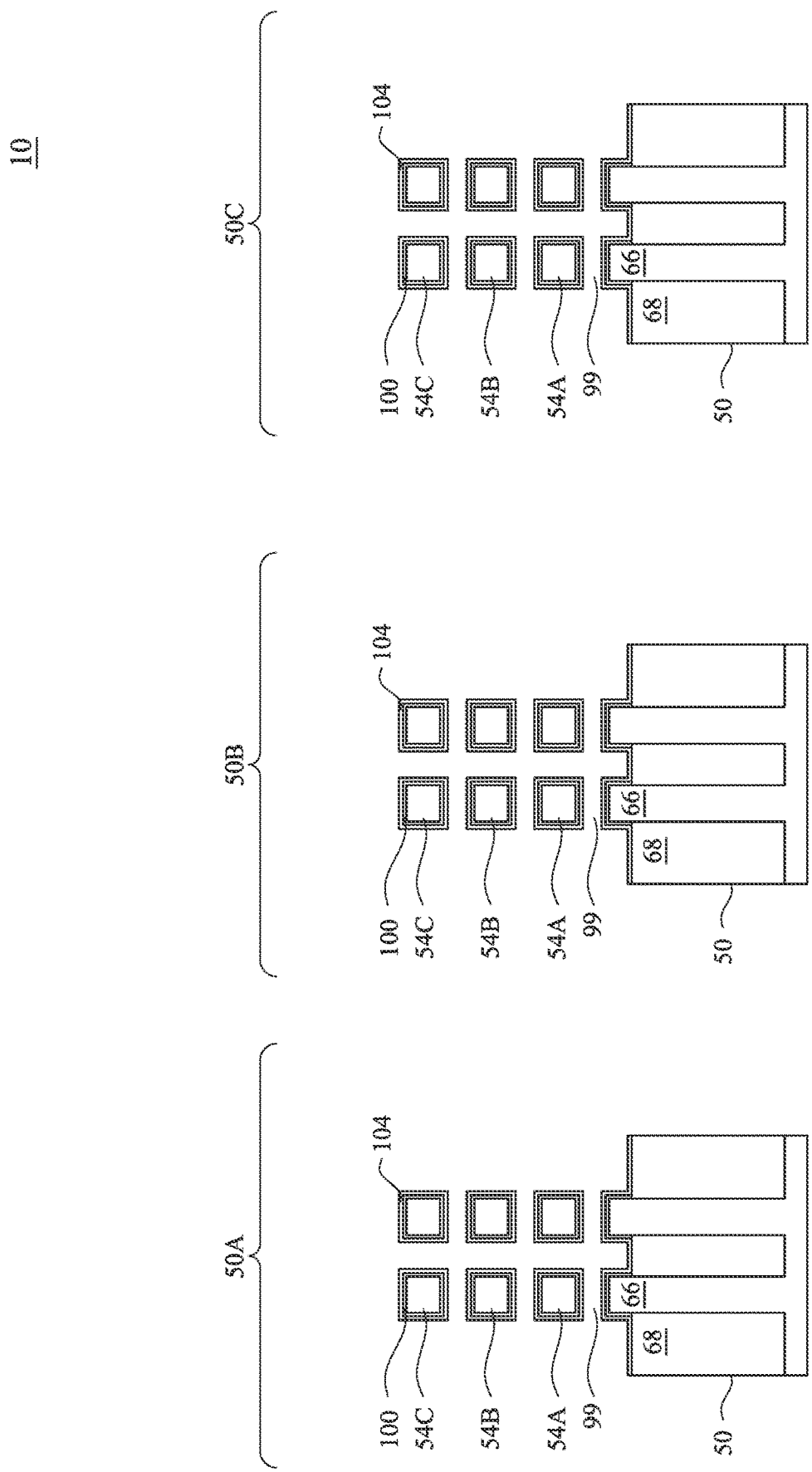
Figure 18B:
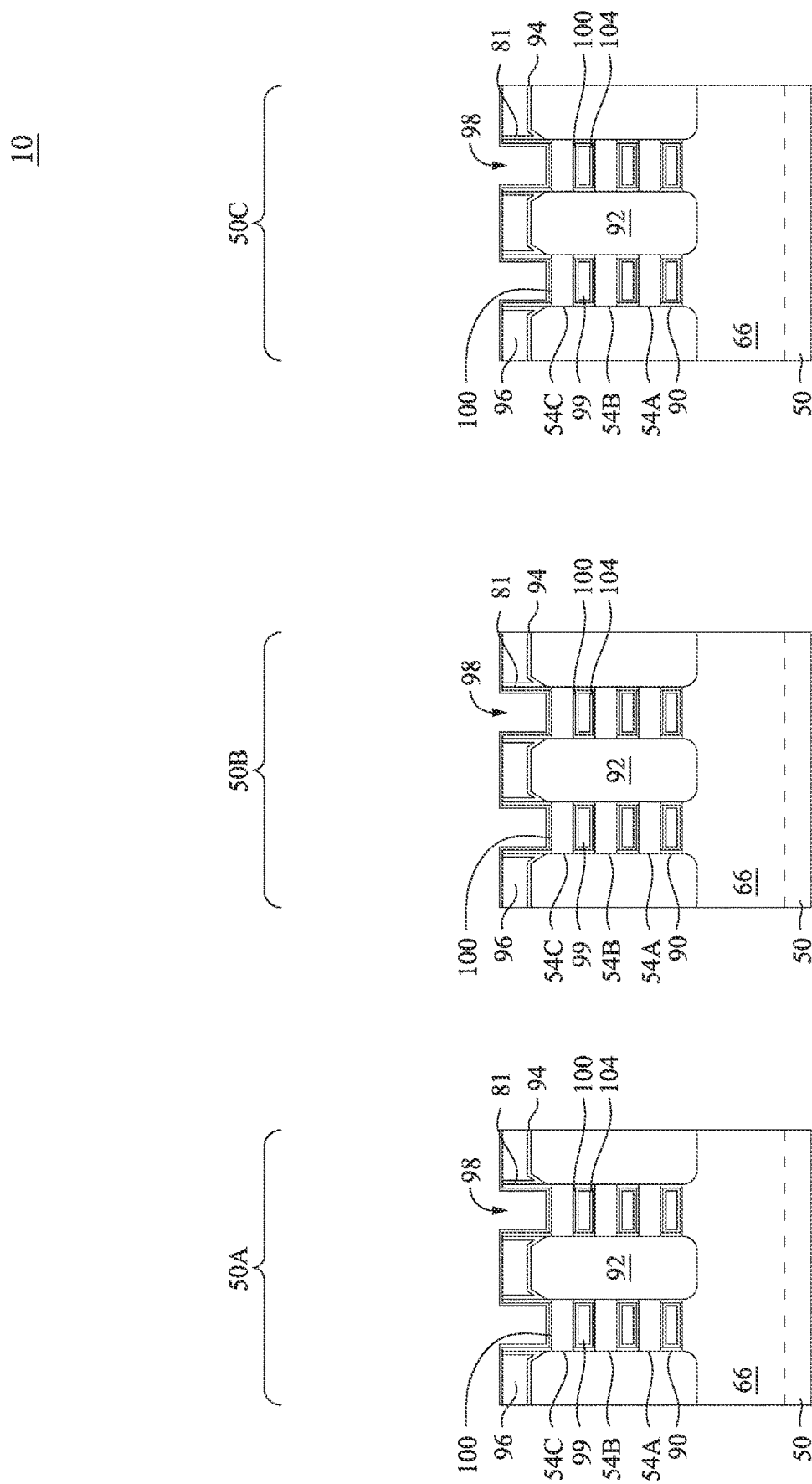

In FIGS. 18A and 18B, a first gate dielectric layer 104 is formed in the second recesses 98 and the openings 99 in the first region 50A, the second region 50B, and the third region 50C, in accordance with some embodiments. The first gate dielectric layer 104 may be deposited over the interfacial layer 100 (e.g., wrapping around the second nanostructures 54), along sidewalls of the first spacers 81, and along the upper surface of the first ILD 96. In an example embodiment, the first gate dielectric layer 104 may be a high-k material, for example, having a dielectric constant higher than 7.0 and may include metal oxide or metal silicate. For example, the first gate dielectric layer 104 may include the oxide or the silicate of Hf, Zr, or the like, or a combination thereof. The first gate dielectric layer 104 may have a thickness T of about 5 angstroms to about 30 angstroms. The formation methods of the first gate dielectric layer 104 may include Molecular-Beam Deposition (MBD), ALD, PECVD, or the like. In some embodiments, the first gate dielectric layer 104 is formed by ALD at a temperature between about 200° C. and about 400° C.

Next, one or more doping loops (e.g., the doping loop illustrated in FIG. 36 may be performed one or more times) may be performed to dope one or more dipole dopant materials into a respective gate dielectric layer in one or more device regions. The dipole dopant materials may create differentials in the electrical potential of gate structures and thus may affect the threshold voltages Vt of the gate structures.

Figure 19A:
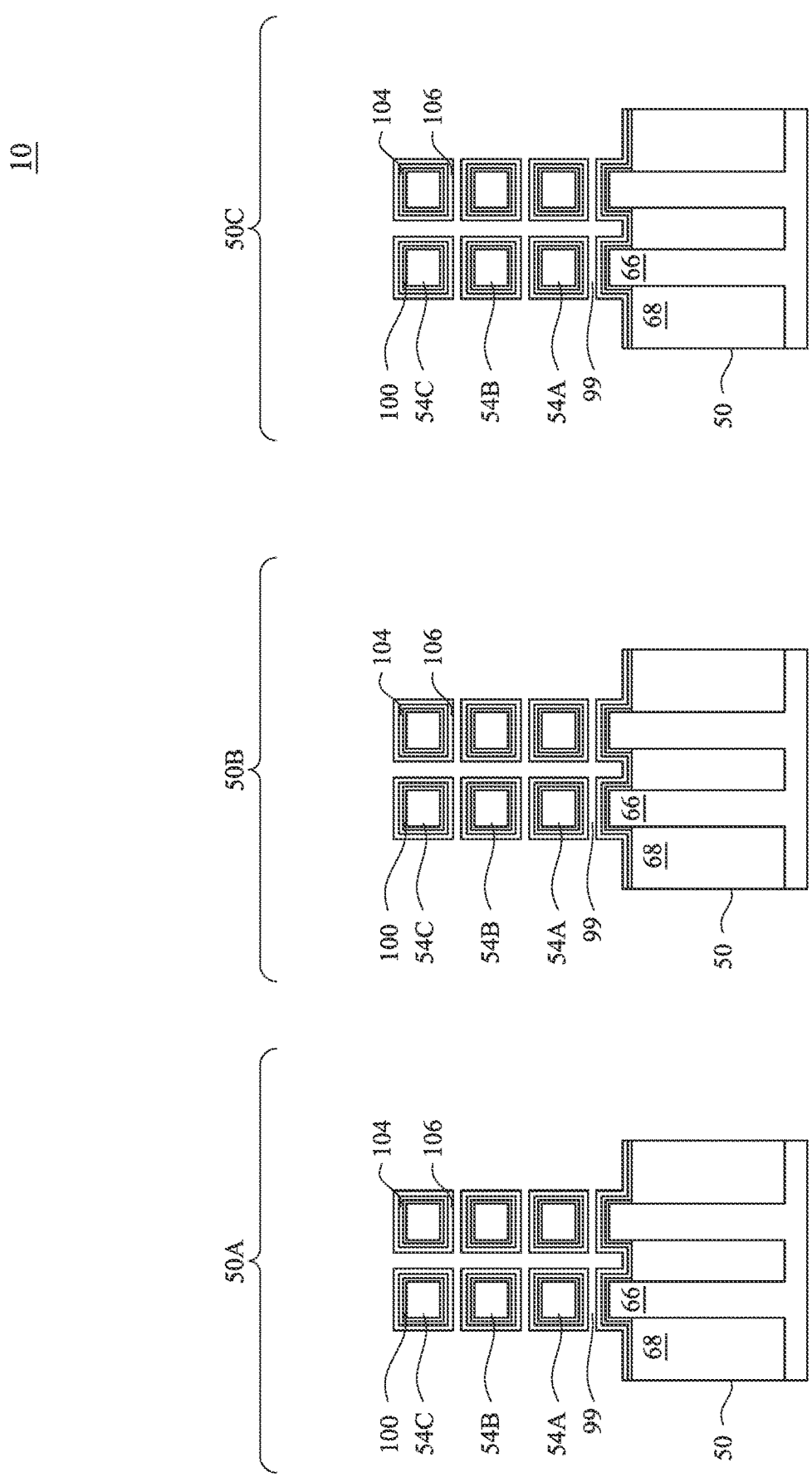
Figure 19B:
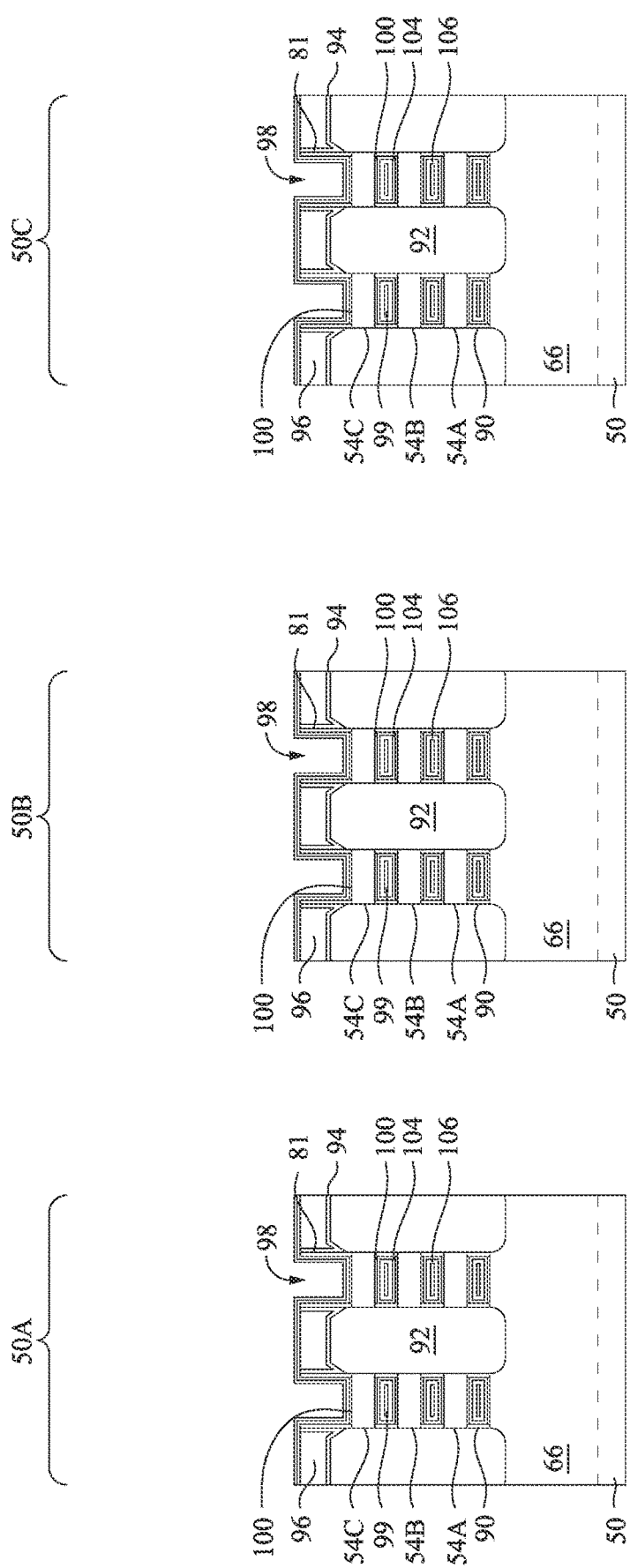

Referring to FIGS. 19A to 21C, a first doping loop is performed to form a first doped gate dielectric layer 112 (see below, FIGS. 21A and 21B) in the first region 50A. In FIGS. 19A and 19B, step S302 is performed (see FIG. 36). A first dipole layer 106 is formed (e.g., conformally) over the first gate dielectric layer 104 in the first region 50A, the second region 50B, and the third region 50C in accordance with some embodiments. The first dipole layer 106 may be an oxide or a nitride of a first dipole dopant. In some embodiments in which the first region 50A and the second region 50B are for forming p-type devices (e.g., PMOS transistors), the first dipole layer 106 may include $La_2O_3$, MgO, SrO, $Y_2O_3$, or the like, and the first dipole dopant in the first dipole layer 106 may be an n-type dipole dopant material such as La, Mg, Sr, Y, an element having a stronger oxygen attraction than Si, or the like. The dipole dopant material doped in a gate dielectric layer may form dipole moments with the material of the interfacial layer 100, thereby creating differentials in the electrical potential of the overall gate structure, and thus the threshold voltage Vt of the gate structure may be adjusted. The n-type dipole dopant may decrease the threshold voltage Vt of a gate structure (for either an NMOS device or a PMOS device). The first dipole layer 106 may be formed by any suitable deposition methods such as ALD or CVD. A thickness of the first dipole layer 106 may be in a range from 1 nm to 10 nm. For example, the first dipole layer 106 may be formed by the ALD with 2 to 20 deposition cycles.

Figure 20A:
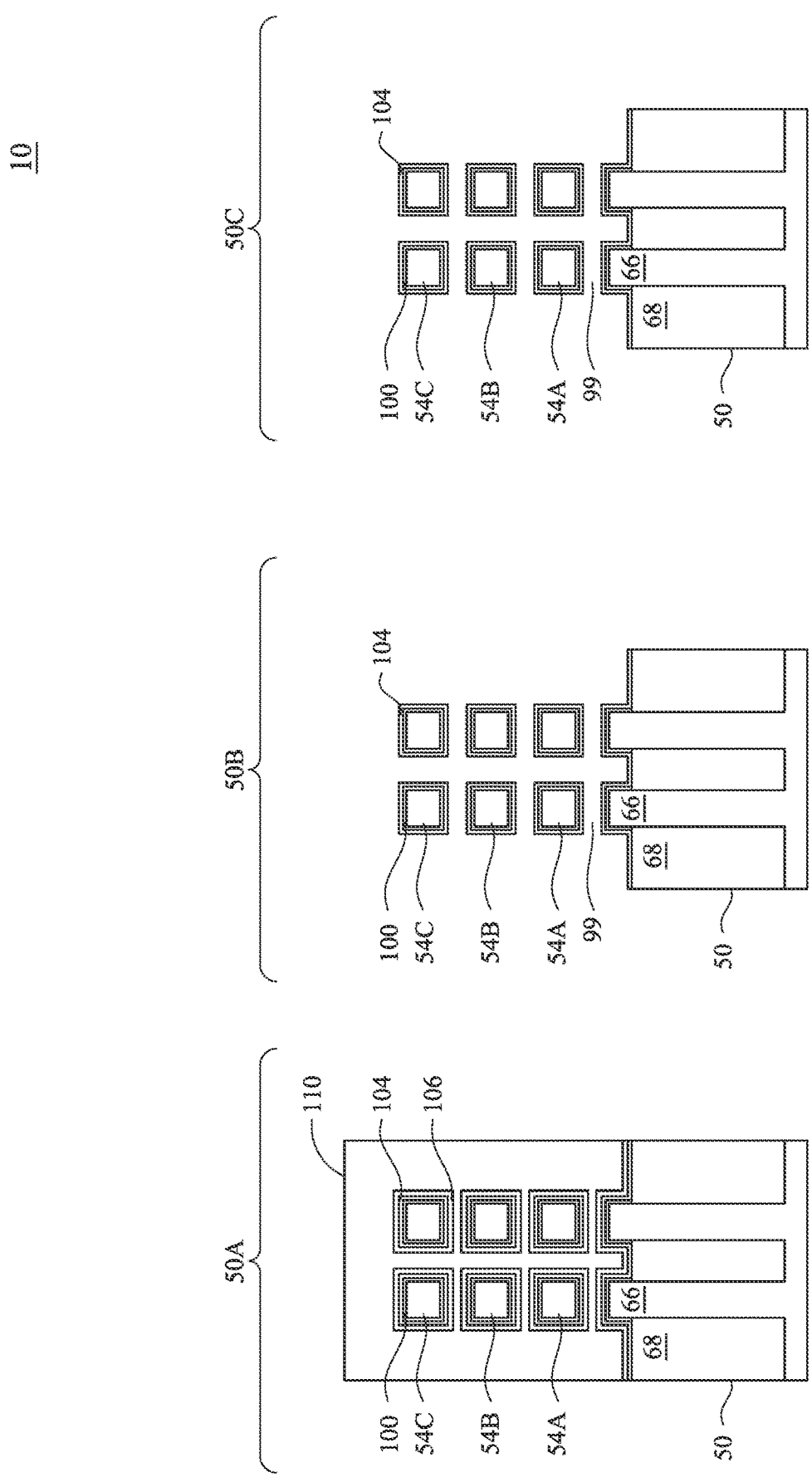
Figure 20B:
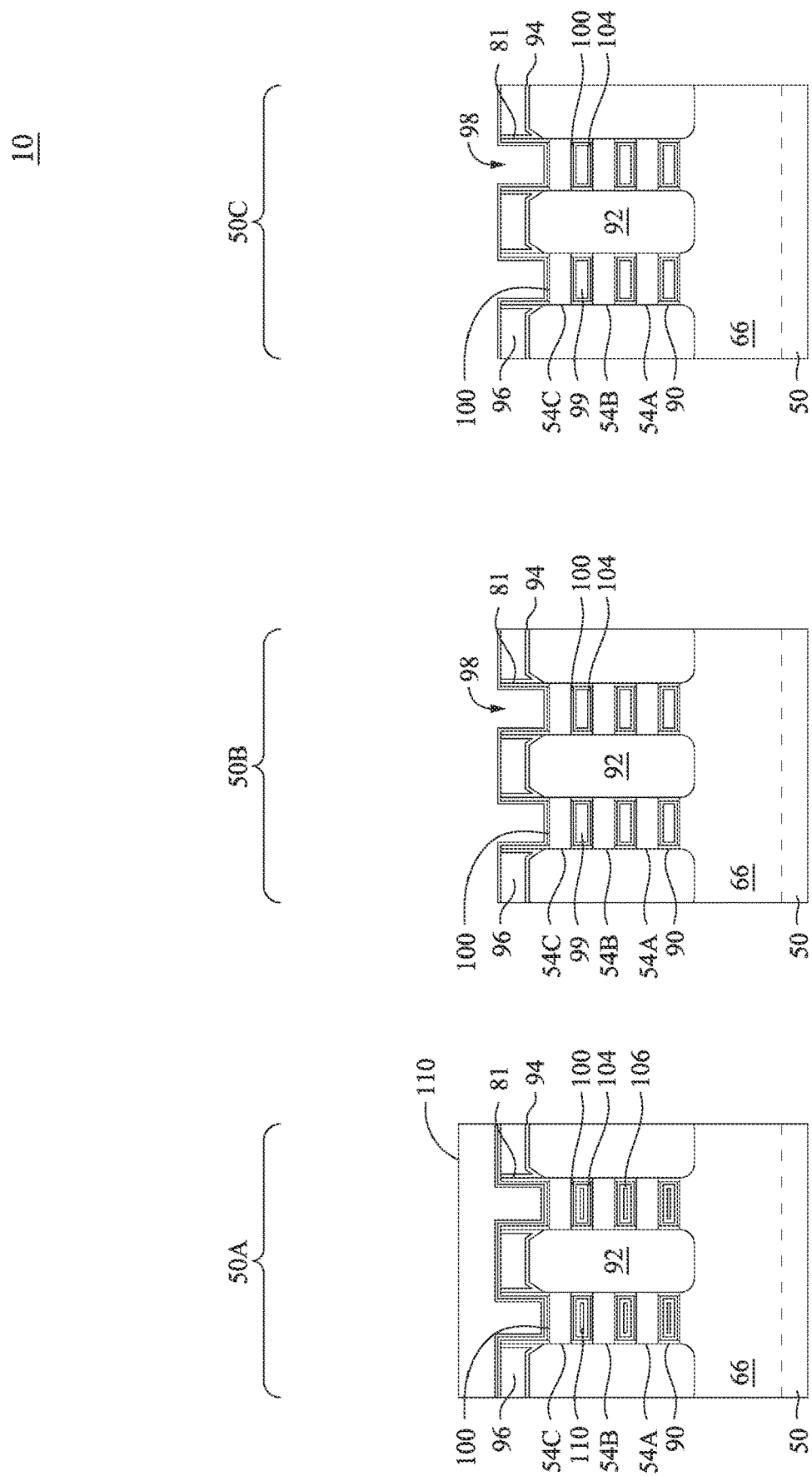
Figure 36:
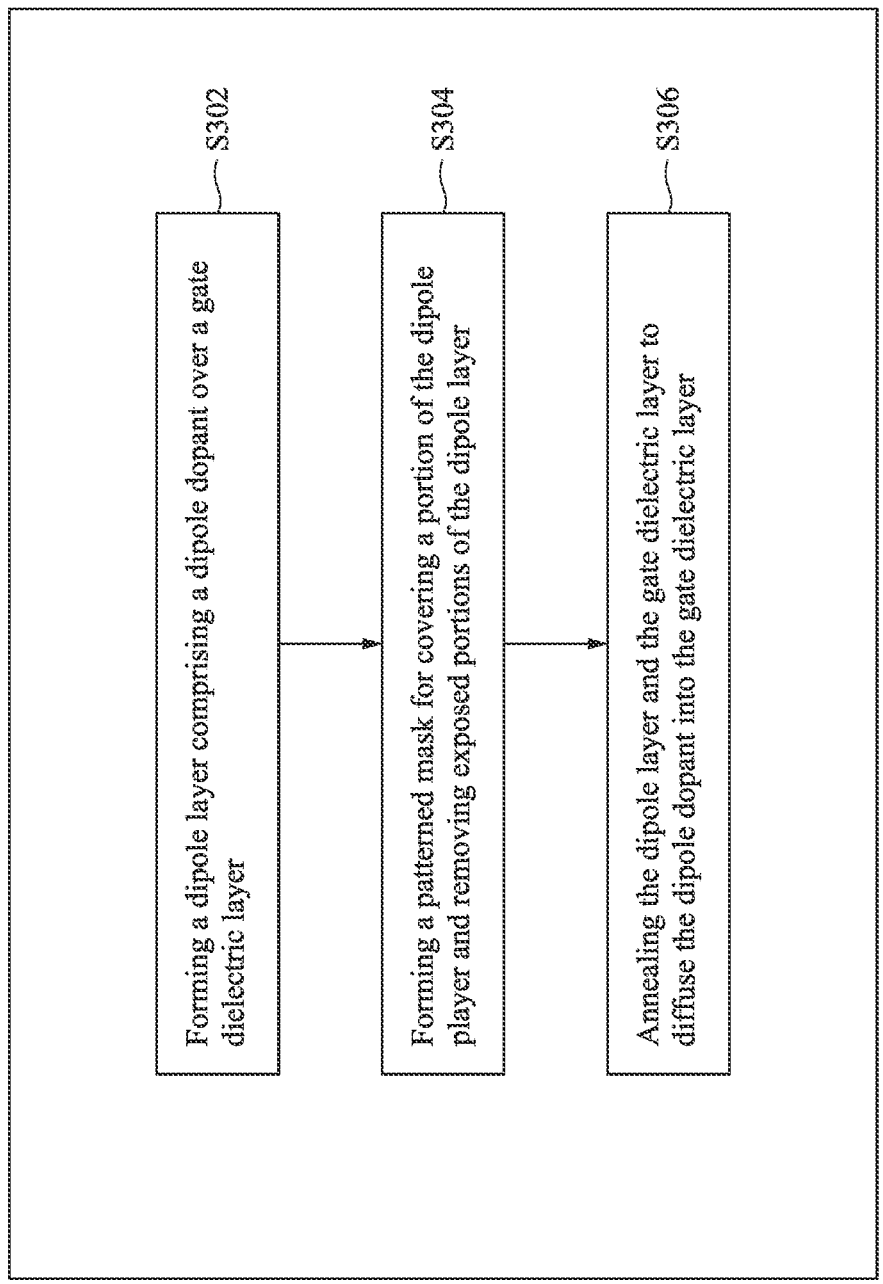
FIG. 36 is a flow chart of a doping loop of doping a dipole dopant into a gate dielectric layer, in accordance with some embodiments.
Figure 36:
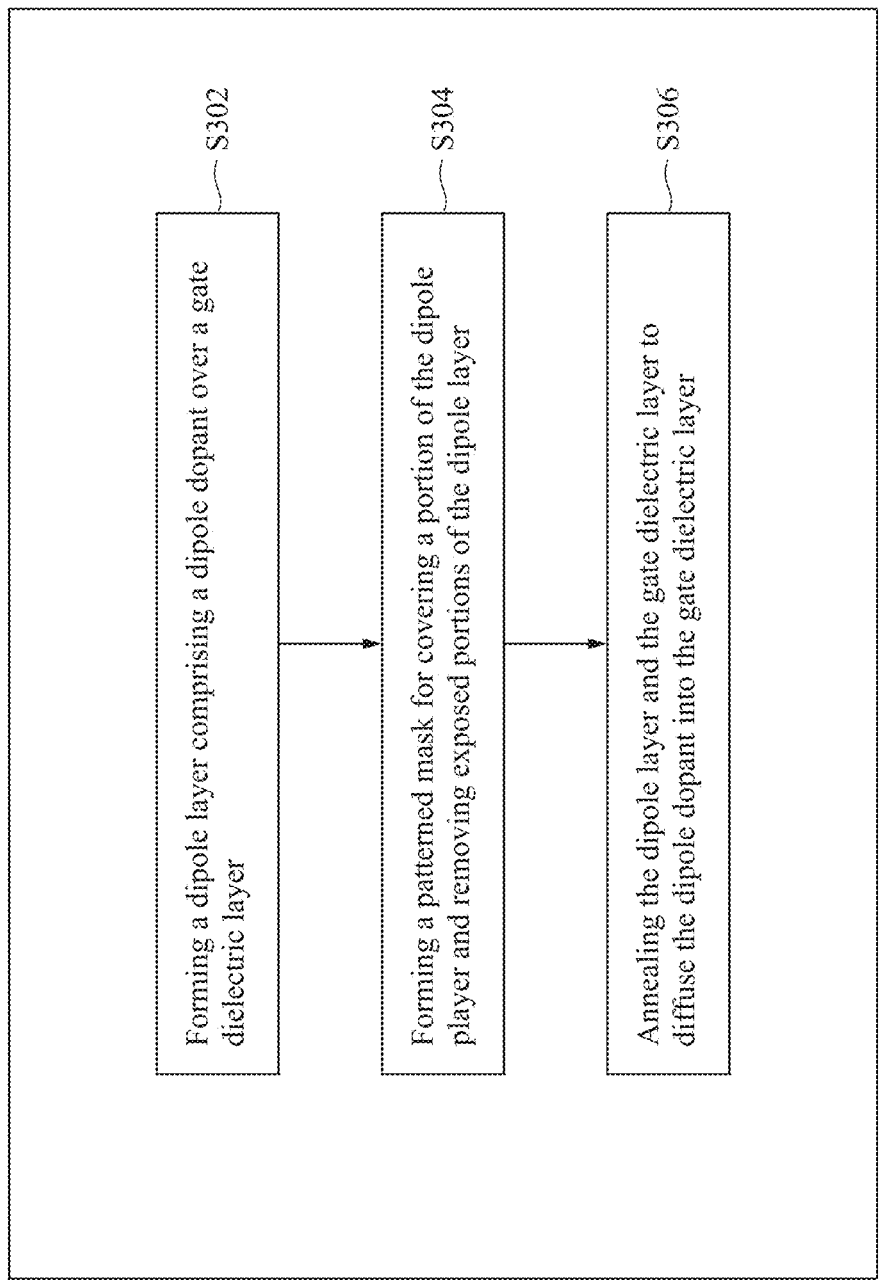

In FIGS. 20A and 20B, step S304 is performed (see FIG. 36). A patterned mask 110 is formed to cover the first region 50A and expose the second region 50B and the third region 50C, and the first dipole layer 106 is removed in the second region 50B and the third region 50C in accordance with some embodiments. For example, the patterned mask 110 is formed and patterned to expose the first dipole layer 106 in the second region 50B and the third region 50C while shielding (e.g., protecting) the first dipole layer 106 in the first region 50A from removal. In some embodiments, the patterned mask 110 is formed by a mask layer covering the first dipole layer 106 in the first region 50A, the second region 50B, and the third region 50C, and removing the mask layer to expose the first dipole layer 106 in the second region 50B and the third region 50C. The mask layer may be patterned using a photoresist layer formed over the mask layer and patterning the photoresist layer such that portions of the photoresist layer disposed in the second region 50B and the third region 50C are removed to expose portions of the mask layer in the second region 50B and the third region 50C. Portions of the mask layer in the second region 50B and the third region 50C are then etched, thereby forming the patterned mask 110 as illustrated in FIGS. 20A and 20B. The photoresist layer is removed after the mask layer in the second region 50B and the third region 50C is removed by an ashing process and/or a wet clean process. The patterned mask 110 may include an oxide layer (e.g., $TiO_2$, $SiO_2$, $Al_2O_3$), a nitride layer (e.g., TiN), an organic bottom anti-reflective coating (BARC), or a combination thereof. In some embodiments, the patterned mask 110 may be a patterned photoresist layer.

The first dipole layer 106 in the second region 50B and the third region 50C is removed by a suitable etching process, such as a wet etch. After the first dipole layer 106 in the second region 50B and the third region 50C is removed, the patterned mask 110 may be removed by a suitable process, for example, by a wet etch process that uses an etchant having a higher etch rate for the material of the patterned mask 110 than etch rates of the materials of the first gate dielectric layer 104 and the first dipole layer 106.

Figure 21A:
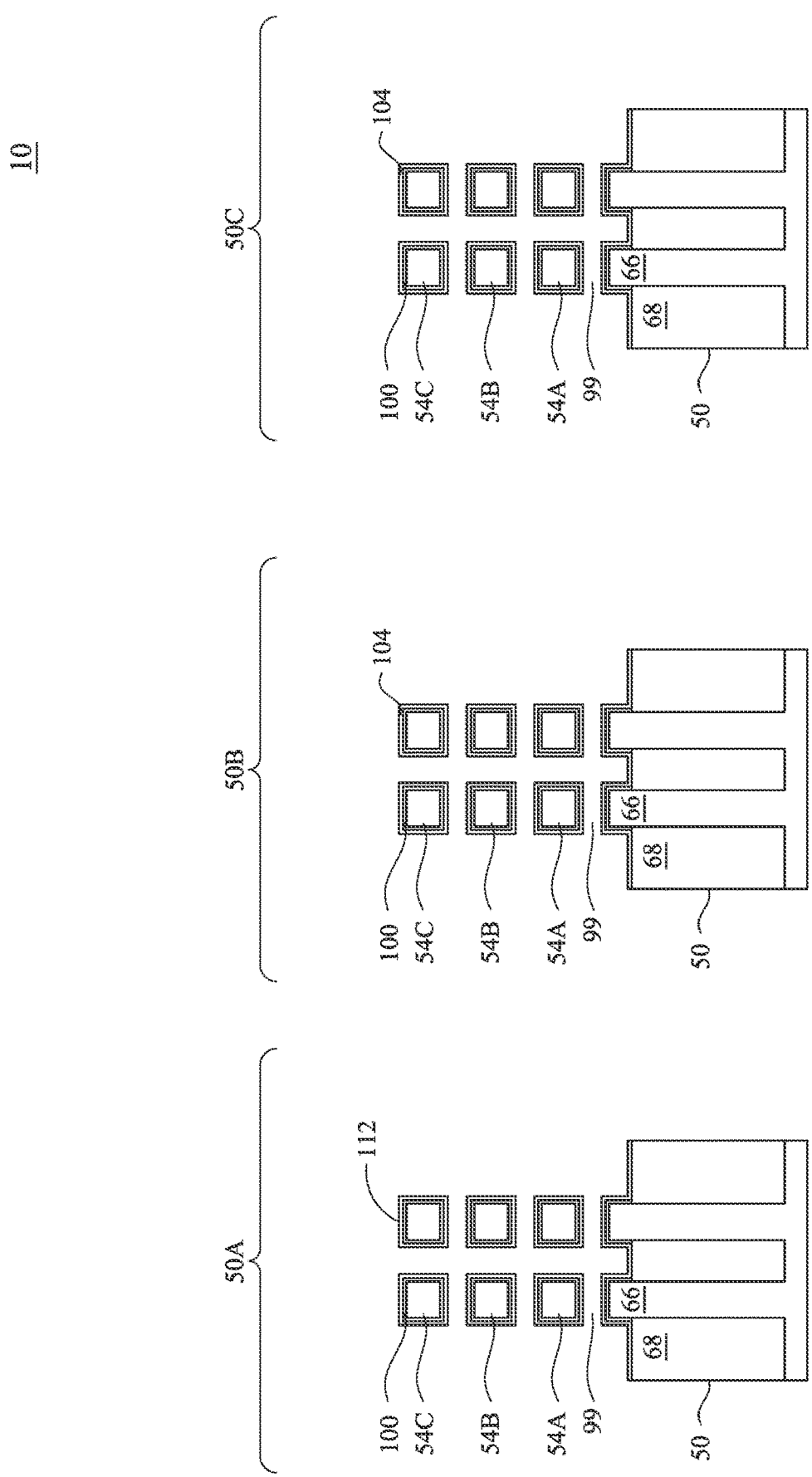
Figure 21B:
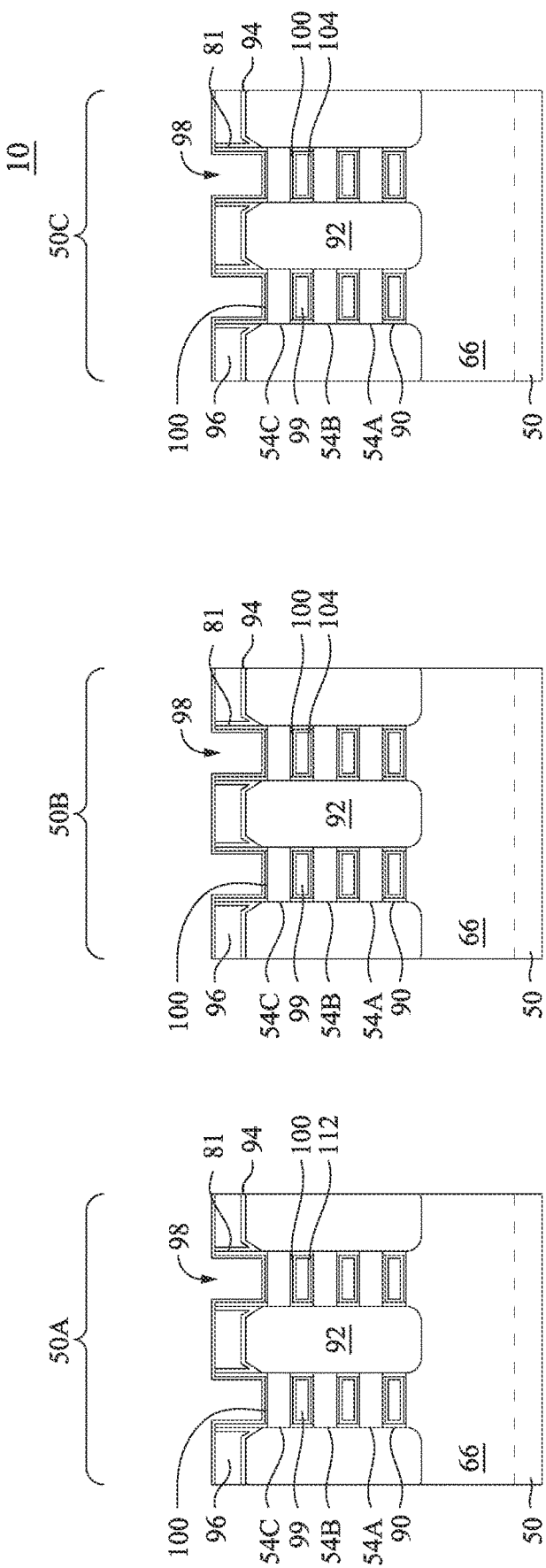

In FIGS. 21A and 21B, step S306 is performed (see FIG. 36). A first anneal process is performed to diffuse the first dipole dopant in the first dipole layer 106 into the first gate dielectric layer 104, thereby forming a first doped gate dielectric layer 112 in the first region 50A in accordance with some embodiments. In some embodiments, the first anneal process is a soak anneal. The soak anneal may include applying a fixed temperature of about 450° C. to about 950° C. for about 5 seconds to 300 seconds in an ambient environment of $N_2$, $NH_3$, $O_2$, $N_2O$, or a combination thereof. In some embodiments, the first anneal process may be a spike anneal. The spike anneal may include applying a fixed temperature of about 450° C. to about 750° C. for about 5 seconds to about 120 seconds and rapidly raising the temperature to a peak temperature of about 1050° C. and sustaining the peak temperature in a short period, such as about 0.5 seconds to about 5 seconds, after which the temperature is rapidly reduced.

Figure 21C:
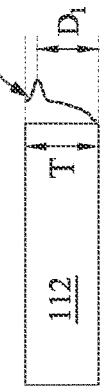
FIGS. 21C and 24C illustrate dipole dopant concentration profiles along a thickness direction of a gate dielectric layer, in accordance with some embodiments.

The first dipole dopant is dispersed in the first doped gate dielectric layer 112. FIG. 21C illustrates a concentration profile of the first dipole dopant in the first doped gate dielectric layer 112 along a thickness direction of the first doped gate dielectric layer 112. In some embodiments, sufficient amounts of the first dipole dopant may be in the first doped gate dielectric layer 112 with a sufficient thickness of the first dipole layer 106 and a sufficient thermal budget of the first anneal process. In some embodiments, the first doped gate dielectric layer 112 may have an average atomic concentration of the first dipole dopant of about 1E12 atoms/cm³ to about 1E16 atoms/cm³. In some embodiments, a distance $D_1$ from a concentration peak of the first dipole dopant in the first doped gate dielectric layer 112 along its thickness direction to a bottom surface of the first doped gate dielectric layer 112 is greater than a half or ⅔ of the thickness T of the first doped gate dielectric layer 112, and the concentration peak may be offset from an upper surface of the first doped gate dielectric layer 112.

After the first anneal process is applied, the remaining portions of the first dipole layer 106 in the first region 50A are removed. The first dipole layer 106 may be removed by a suitable etching method, for example, by a wet etch process that etches the first dipole layer 106 at a faster rate than the first doped gate dielectric layer 112 in the first region 50A and the first gate dielectric layer 104 in the second region 50B and the third region 50C.

Figure 22A:
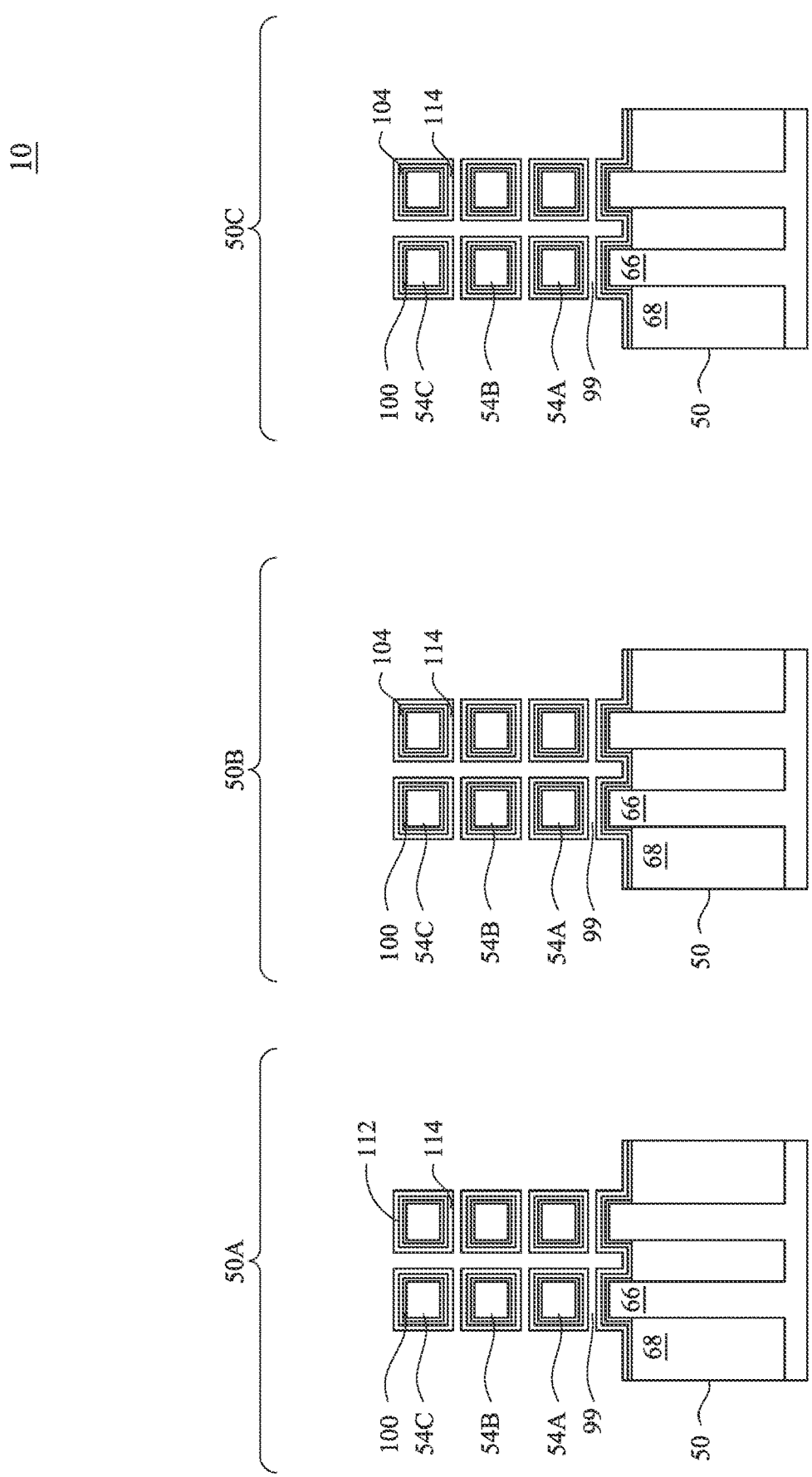
Figure 22B:
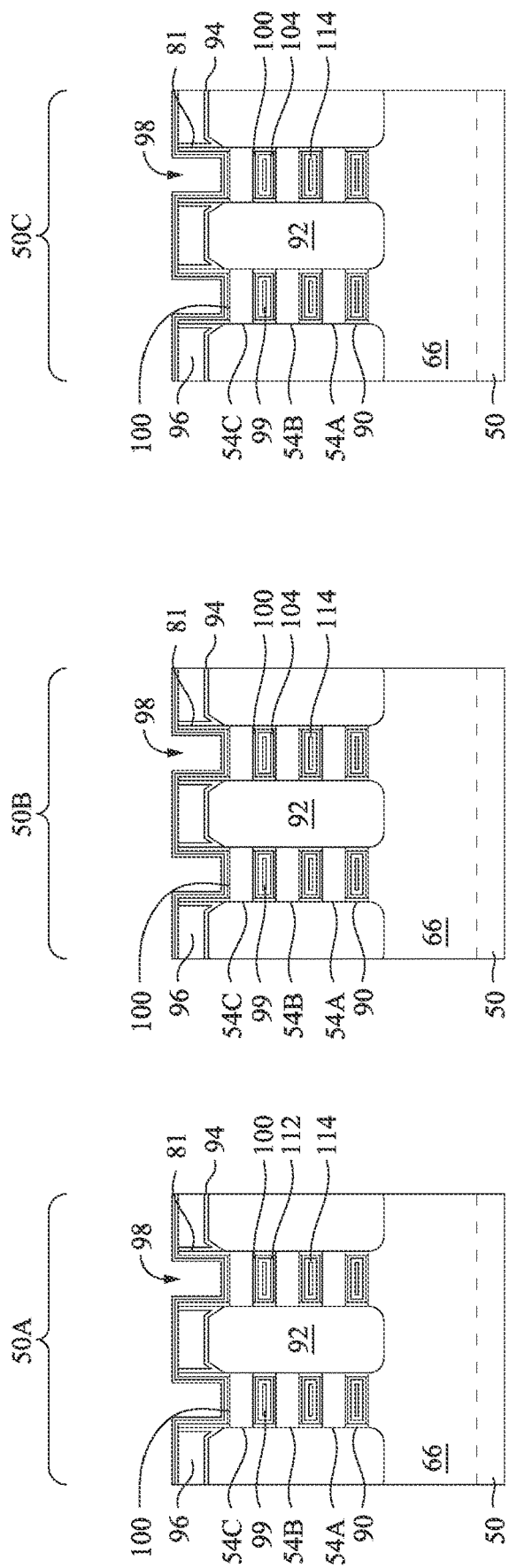

Next referring to FIGS. 22A to 24C, a second dipole loop (e.g., steps S302-S306 as illustrated in FIG. 36) is performed to form a second doped gate dielectric layer 118 (see below, FIGS. 24B and 24C) in the second region 50B, in accordance with some embodiments. In FIGS. 22A and 22B, a second dipole layer 114 may be formed over the first doped gate dielectric layer 112 in the first region 50A and the first gate dielectric layer 104 in the second region 50B and the third region 50C. The second dipole layer 114 may be an oxide or a nitride of the first dipole dopant (e.g., an n-type dipole dopant). In some embodiments, the second dipole layer 114 is formed of a same material as the first dipole layer 106 and has a thickness different from the thickness of the first dipole layer 106, such as being thinner than the first dipole layer. For example, the second dipole layer 114 may have a thickness of 1 nm to 8 nm, which may be 0.05 to 0.99 of or equal to the thickness of the first dipole layer 106. In some embodiments, the second dipole layer 114 may be formed by ALD, such as by 2 to 16 ALD deposition cycles.

Figure 23A:
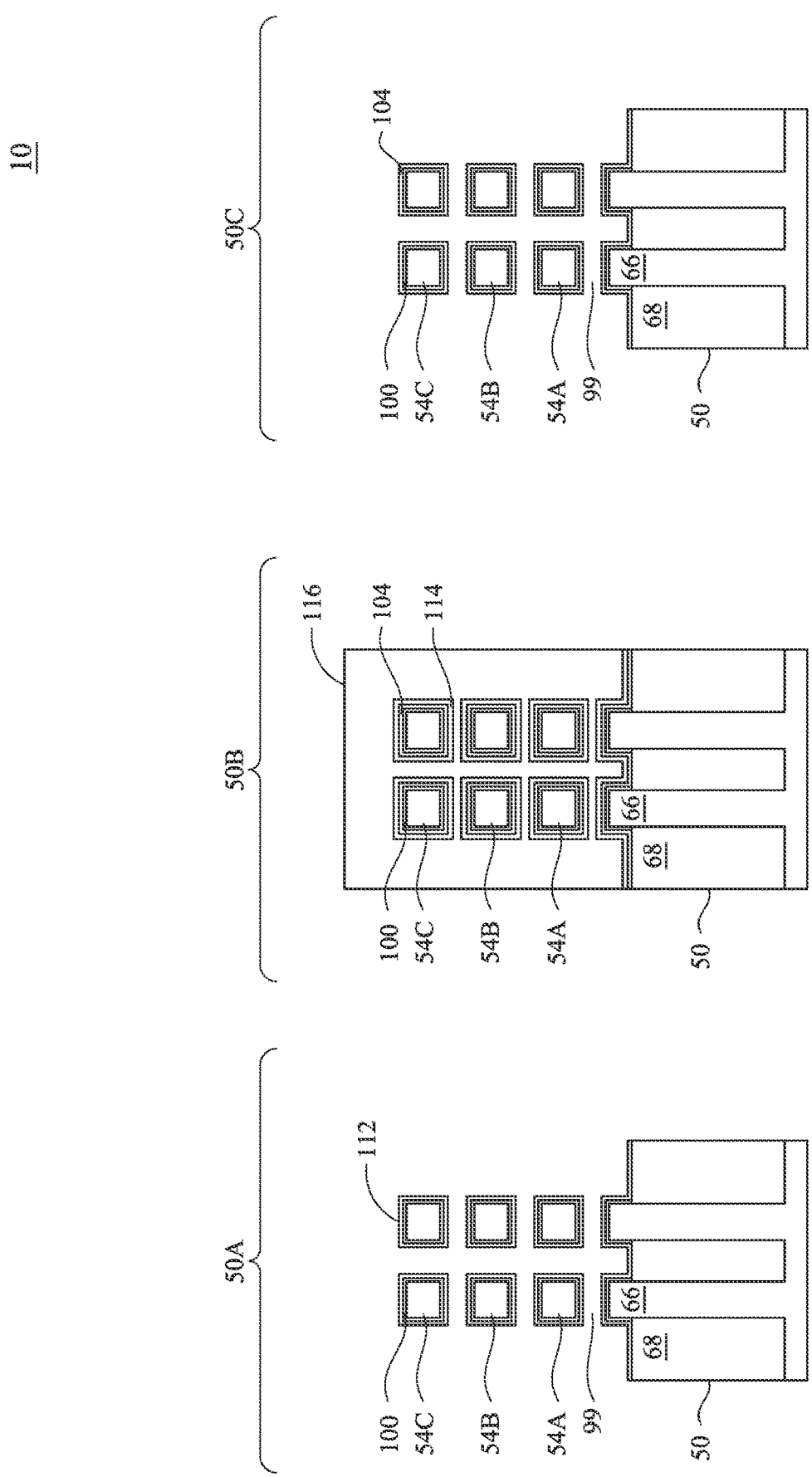
Figure 23B:
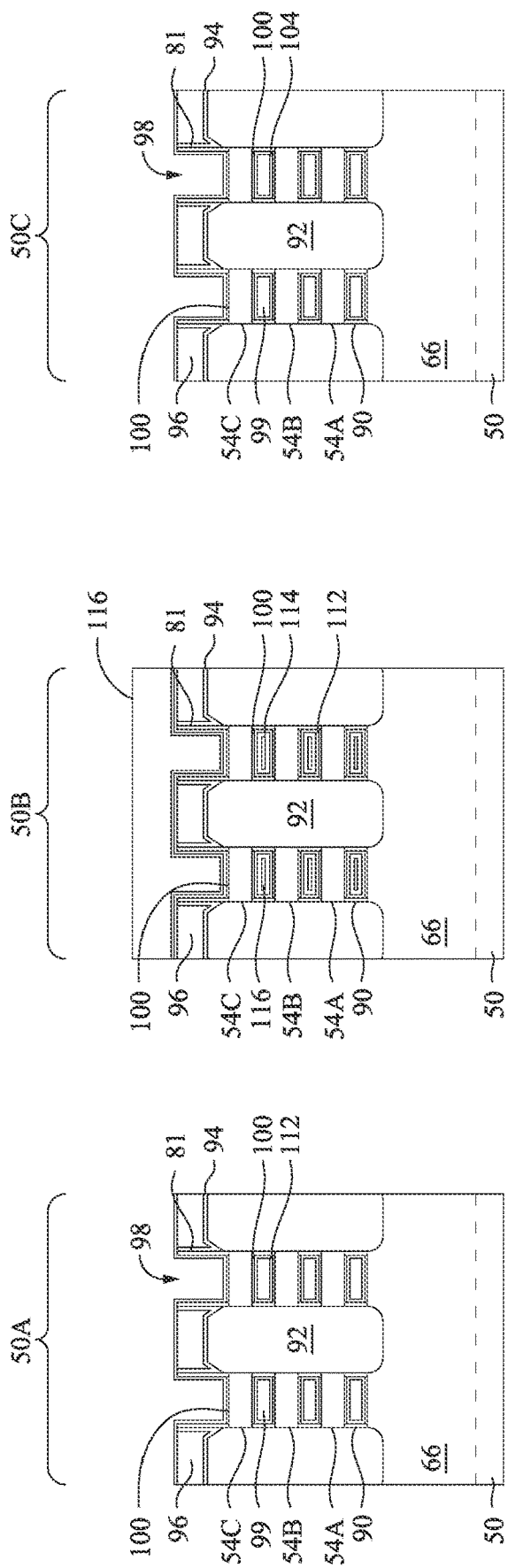

In FIGS. 23A and 23B, a patterned mask layer 116 is formed to cover the second region 50B and expose the first region 50A and the third region 50C. The exposed portions of the second dipole layer 114, such as the second dipole layer 114 in the first region 50A and the third region 50C, may be removed. The patterned mask layer 116 may be formed of a same or similar material as the patterned mask 110 using a same or similar formation method. A suitable etching process, such as a wet etch, may be performed to remove the second dipole layer 114 in the first region 50A and the third region 50C, while the patterned mask layer 116 shields (e.g., protects) the second region 50B from the etching process. After the second dipole layer 114 in the second region 50B is removed, the patterned mask layer 116 may be removed by a suitable process, for example, by a wet etch process that uses an etchant having a higher etch rate for the material of the patterned mask layer 116 than etching rates of materials of the second dipole layer 114, the first doped gate dielectric layer 112, and the first gate dielectric layer 104.

Figure 24A:
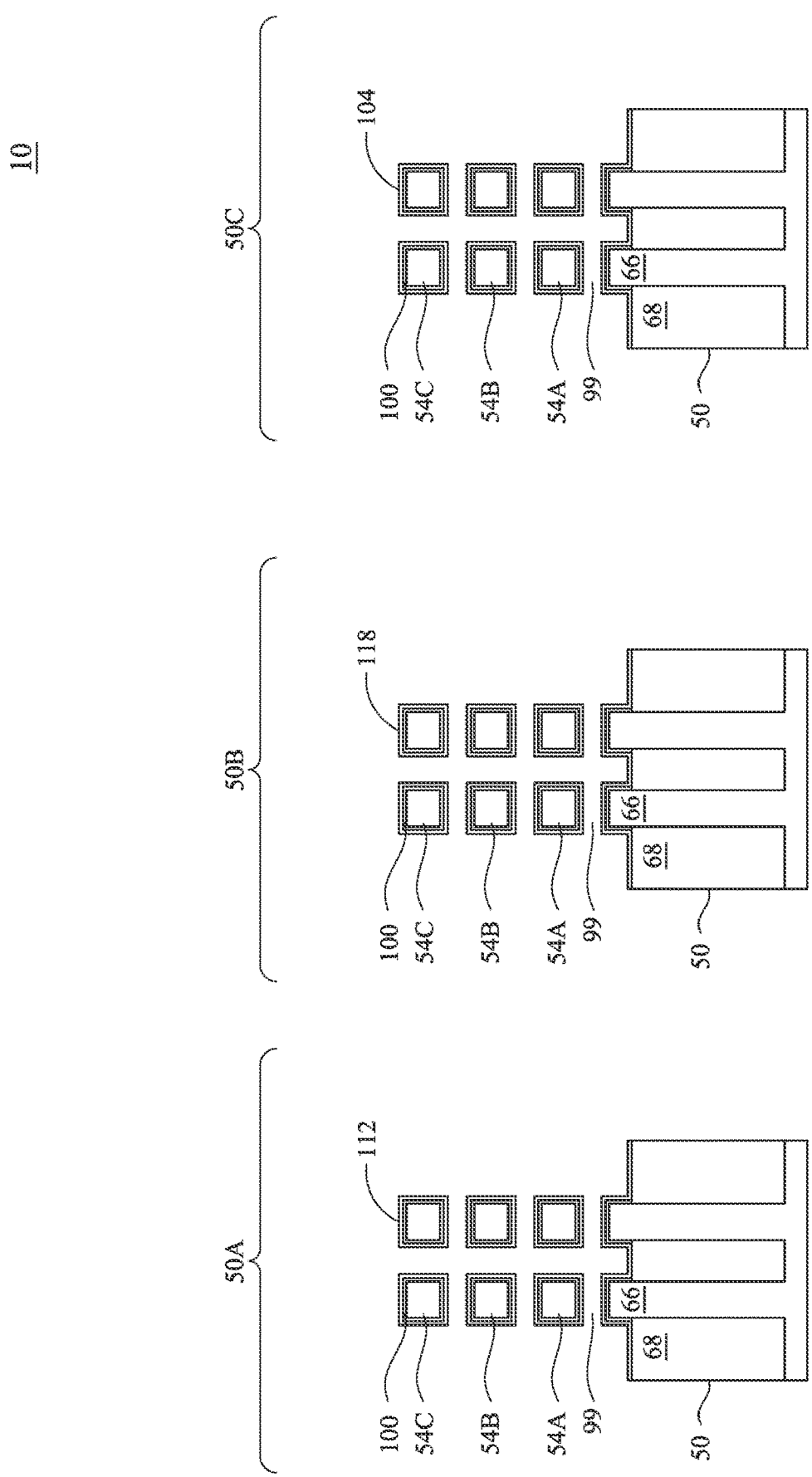
Figure 24B:
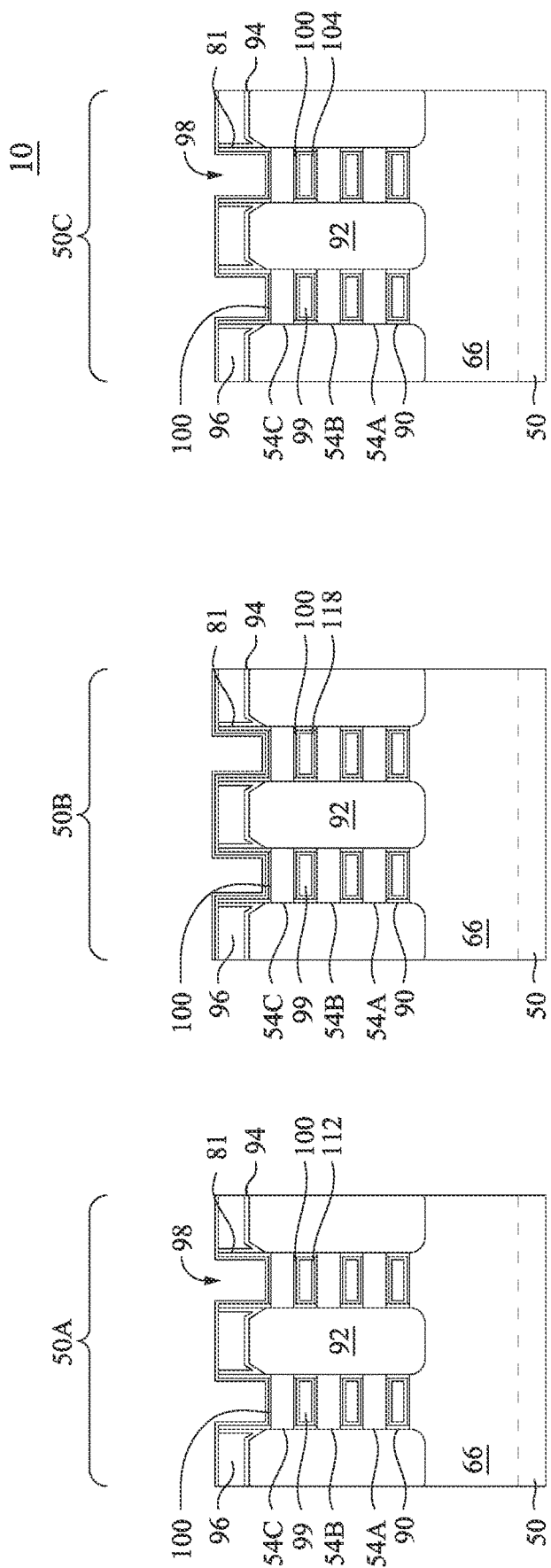

In FIGS. 24A and 24B, a second anneal process is then performed to diffuse the first dipole dopant in the second dipole layer 114 into the first gate dielectric layer 104 in the second region 50B, thereby forming a second doped gate dielectric layer 118 in the second region 50B, in accordance with some embodiments. The second anneal process may be the soak anneal or the spike anneal. In some embodiments, the second anneal process is the same as the first anneal process, such as being one of the soak anneal or the spike anneal same as the first anneal, with same temperature, time, and thermal budget. In some embodiments, the second anneal process may have a lower temperature and/or a shorter period of time as compared to that of the first anneal process so as to bring less impact to the first dipole dopant in the first doped gate dielectric layer 112. Sufficient amounts of the first dipole dopant may be diffused into the first gate dielectric layer 104 to form the second doped gate dielectric layer 118 when a low thermal budget is provided by the second anneal process because the thickness of the second dipole layer 114 is thin. In some embodiments, the second anneal process is a soak anneal process, which may include applying a fixed temperature of about 450° C. to about 900° C. for about 5 seconds to 300 seconds, or about 400° C. to about 750° C. for about 3 seconds to 200 seconds, in an ambient environment of $N_2$, $NH_3$, $O_2$, $N_2O$, or a combination thereof. In some embodiments, the first anneal process is a spike anneal, which may include applying a fixed temperature of about 450° C. to about 750° C. for about 5 seconds to about 120 seconds and rapidly raising the temperature to a peak temperature of about 1050° C. or about 900° C. and sustaining the peak temperature in a short period, such as about 0.5 seconds to about 5 seconds or to about 3 seconds, after which the temperature is rapidly reduced.

Figure 24C:
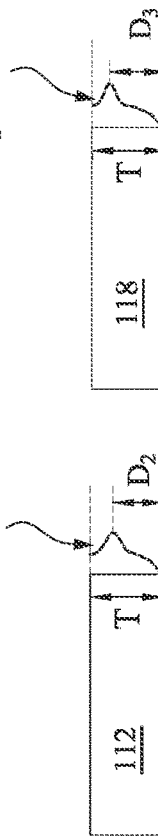

FIG. 24C illustrates concentration profiles of the first dipole dopant in the first doped gate dielectric layer 112 and the second doped gate dielectric layer 118 along their thickness directions after the second anneal process, in accordance with some embodiments. In some embodiments, the concentration peak of the first dipole dopant moves toward the interfacial layer 100 and the respective nanostructure 54A-54C (e.g., toward a bottom surface of the first doped gate dielectric layer 112) after the second anneal process. For example, a distance $D_2$ of the concentration peak of the first dipole dopant in the first doped gate dielectric layer 112 to the bottom surface of the first doped gate dielectric layer 112 after the second anneal process is smaller than the distance $D_1$, which is the distance of the concentration peak of the first dipole dopant to the bottom surface of the first doped gate dielectric layer 112 before the second anneal process. In addition, the distance $D_2$ is also smaller than a distance $D_3$ of the concentration peak of the first dipole dopant in the second doped gate dielectric layer 118 to the bottom surface of the second doped gate dielectric layer 118 because the first dipole dopant in the first doped gate dielectric layer 112 is annealed by both the first anneal process and the second anneal process.

Figure 25A:
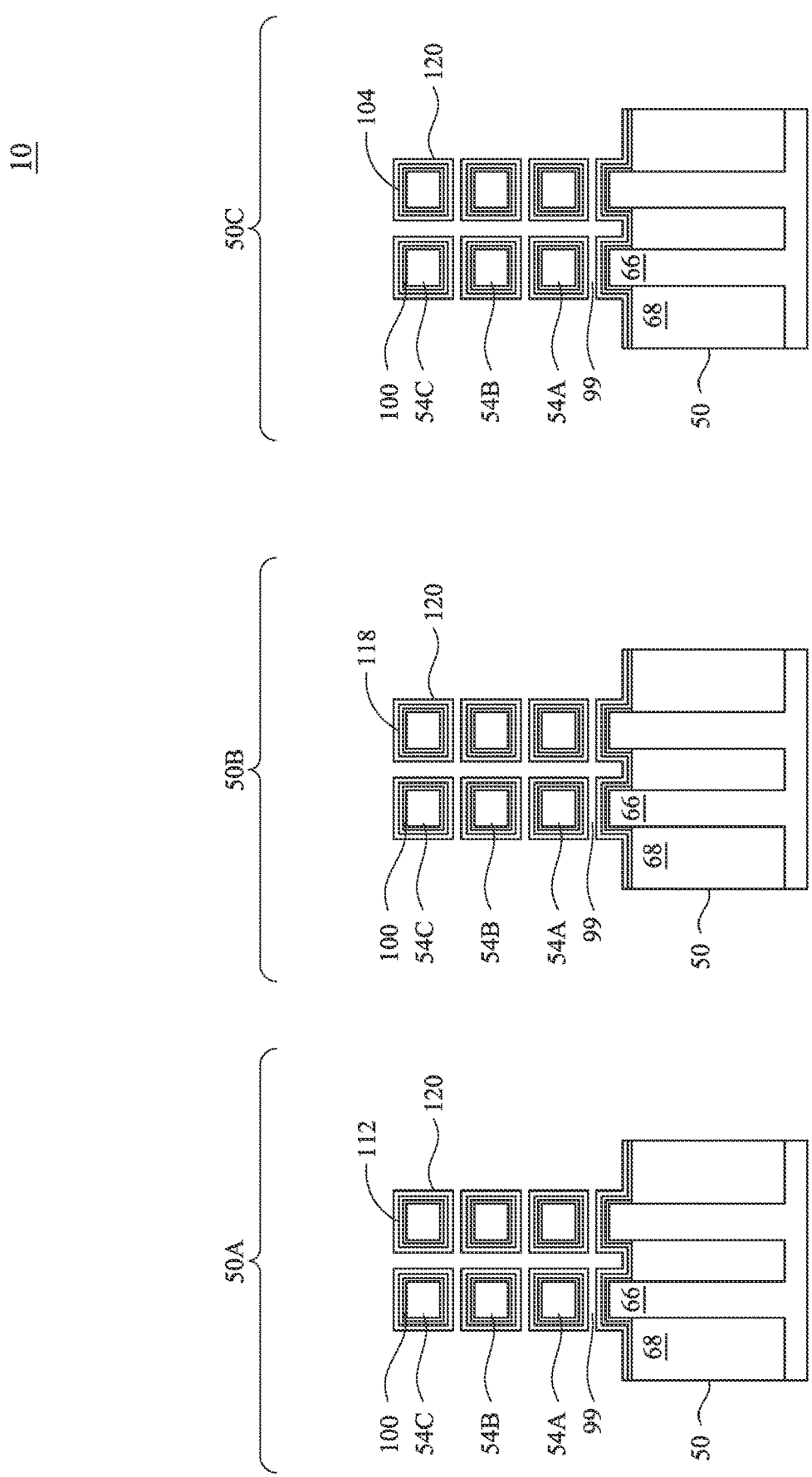
Figure 25B:
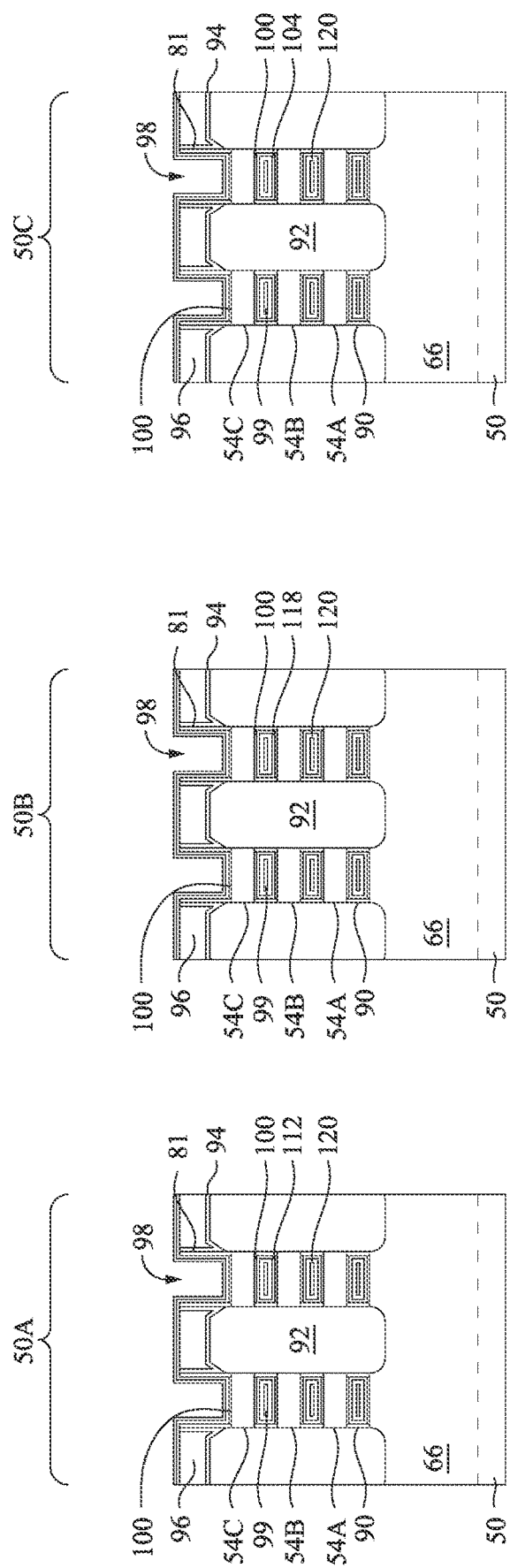

Referring to FIGS. 25A to 27B, a third doping loop (e.g., steps S302-S306 as illustrated in FIG. 36) is performed to form a third doped gate dielectric layer 126 (see below, FIGS. 27A and 27B) in the third region 50C, in accordance with some embodiments. In FIGS. 25A and 25B, a third dipole layer 120 may be formed over the first doped gate dielectric layer 112 in the first region 50A, the second doped gate dielectric layer 118, and the first gate dielectric layer 104 in the third region 50C. The third dipole layer 120 may be an oxide or a nitride of a second dipole dopant, such as $TiO_2$, $Al_2O_3$, AN, $Ga_2O_3$, $In_2O_3$, $Nb_2O_5$, $ZnO_2$, or the like. The second dipole dopant may be different from the first dipole dopant. For example, the second dipole dopant may be a dipole dopant having a different type from that of the first dipole dopant, such as an n-type dipole dopant, though the second dipole dopant may have a same type as the first dipole dopant. In some embodiments, the third dipole layer 120 comprises a p-type dipole dopant, such as but not limited to Ti, Al, Ga, In, Nb, Zn, or an element having a weaker oxygen attraction than Si, or the like. In some embodiments, the second dipole dopant may have a greater diffusivity than the first dipole dopant, for example, Y, Lu, or Sr when the first dipole dopant is La. As such, sufficient amounts of the second dipole dopant may be diffused to the first gate dielectric layer 104 in the third region 50C in a limited thermal budget while not significantly impacting the first dipole dopant in the first doped gate dielectric layer 112 and the second doped gate dielectric layer 118. The third dipole layer 120 may have a thickness the same as or different from the thickness of the first dipole layer 106 or the thickness of the second dipole layer 114.

Figure 26A:
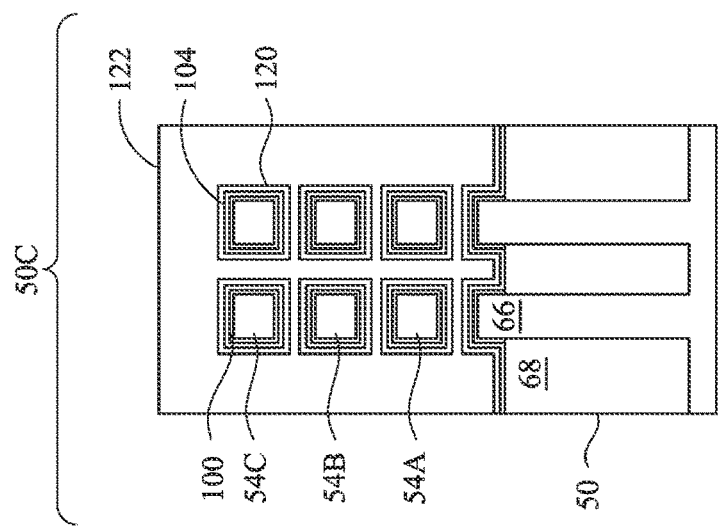
Figure 26A:
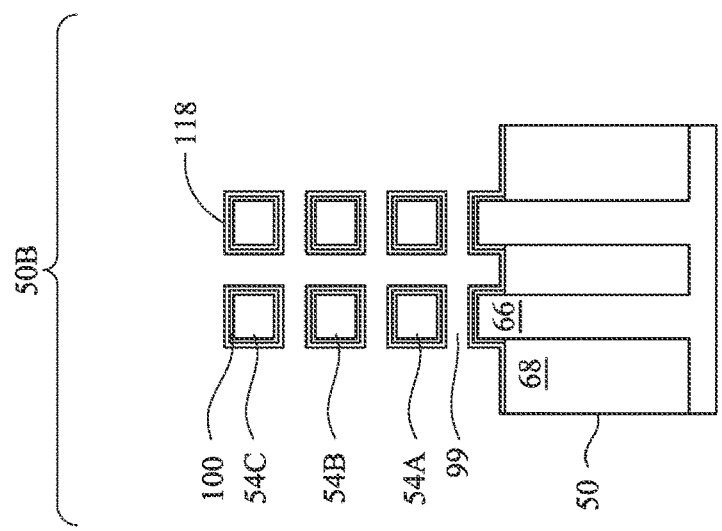
Figure 26A:
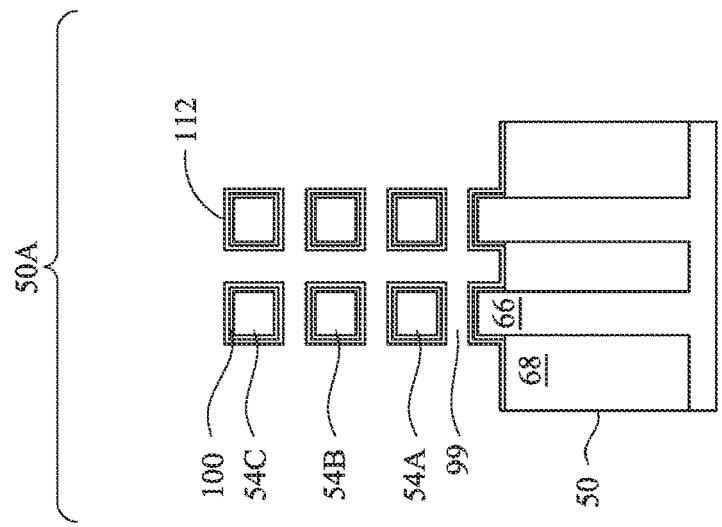
Figure 26B:
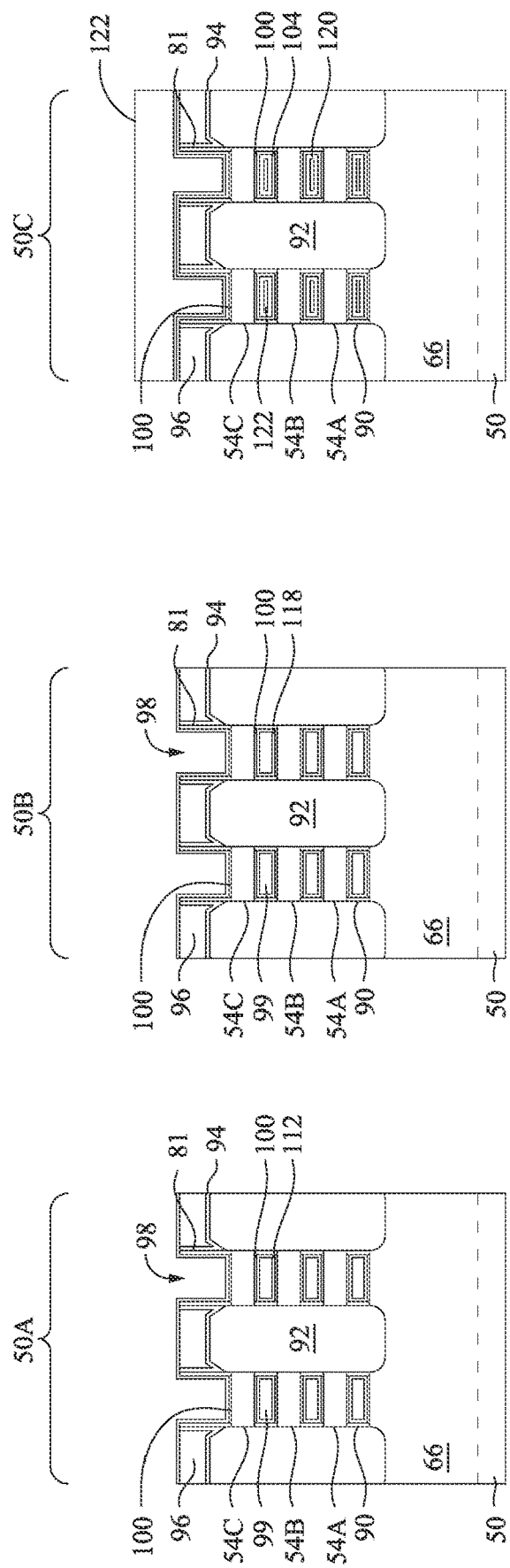

In FIGS. 26A and 26B, a patterned mask layer 122 is formed to cover the third region 50C and expose the first region 50A and the second region 50B. The exposed portions of the third dipole layer 120, such as the third dipole layer 120 in the first region 50A and the second region 50B, may be removed. The patterned mask layer 122 may be formed of a same or similar material as the patterned mask 110 using a same or similar formation method. A suitable etching process, such as a wet etch, may be performed to remove the third dipole layer 120 in the first region 50A and the second region 50B, while the patterned mask layer 122 shields (e.g., protects) the third region 50C from the etching process. After the third dipole layer 120 in the second region 50B is removed, the patterned mask layer 122 may be removed by a suitable process, for example, by a wet etch process that uses an etchant having a higher etch rate for the material of the patterned mask layer 122 than etching rates of materials of the third dipole layer 120, the first doped gate dielectric layer 112, and the second doped gate dielectric layer 118.

Figure 27A:
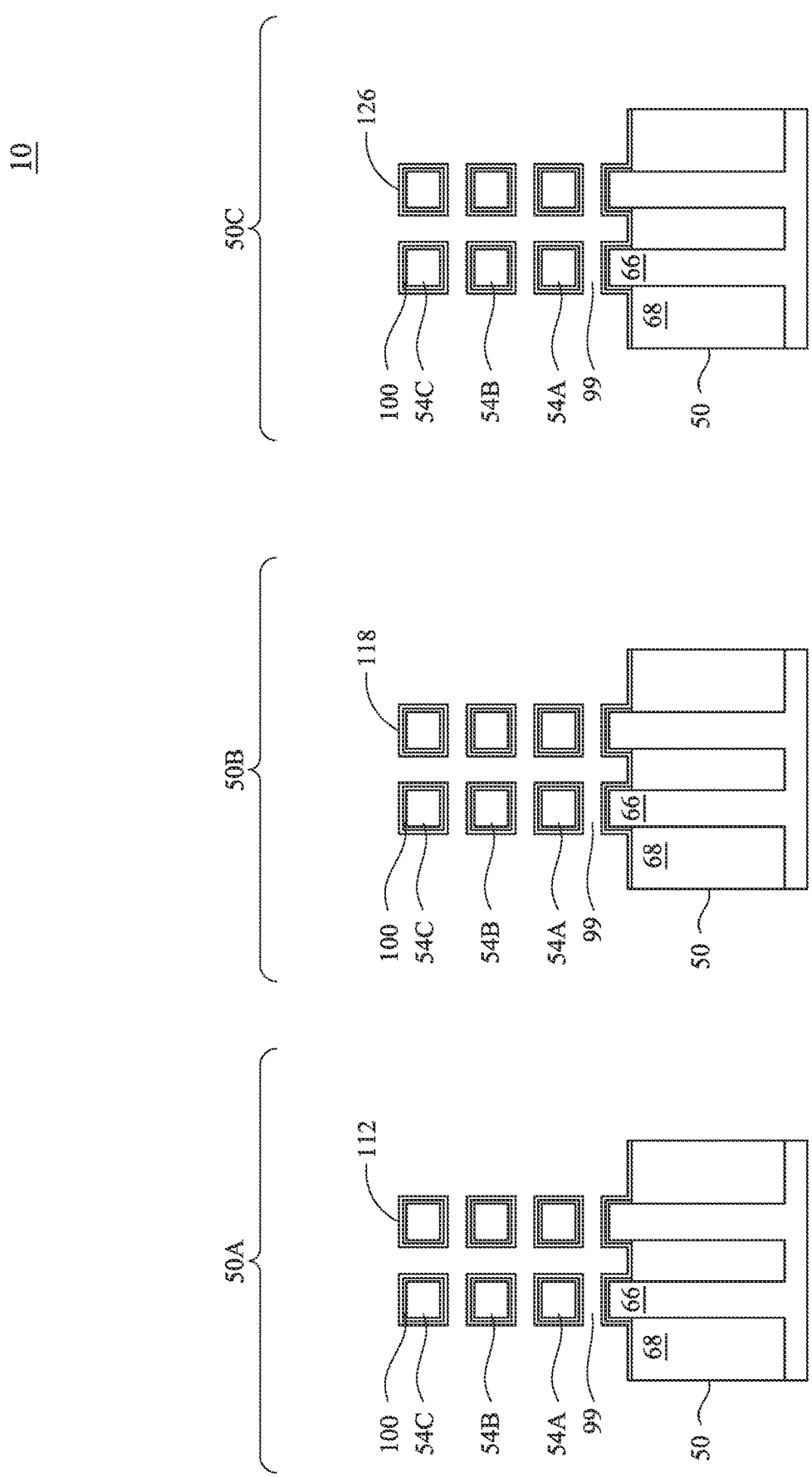
Figure 27B:
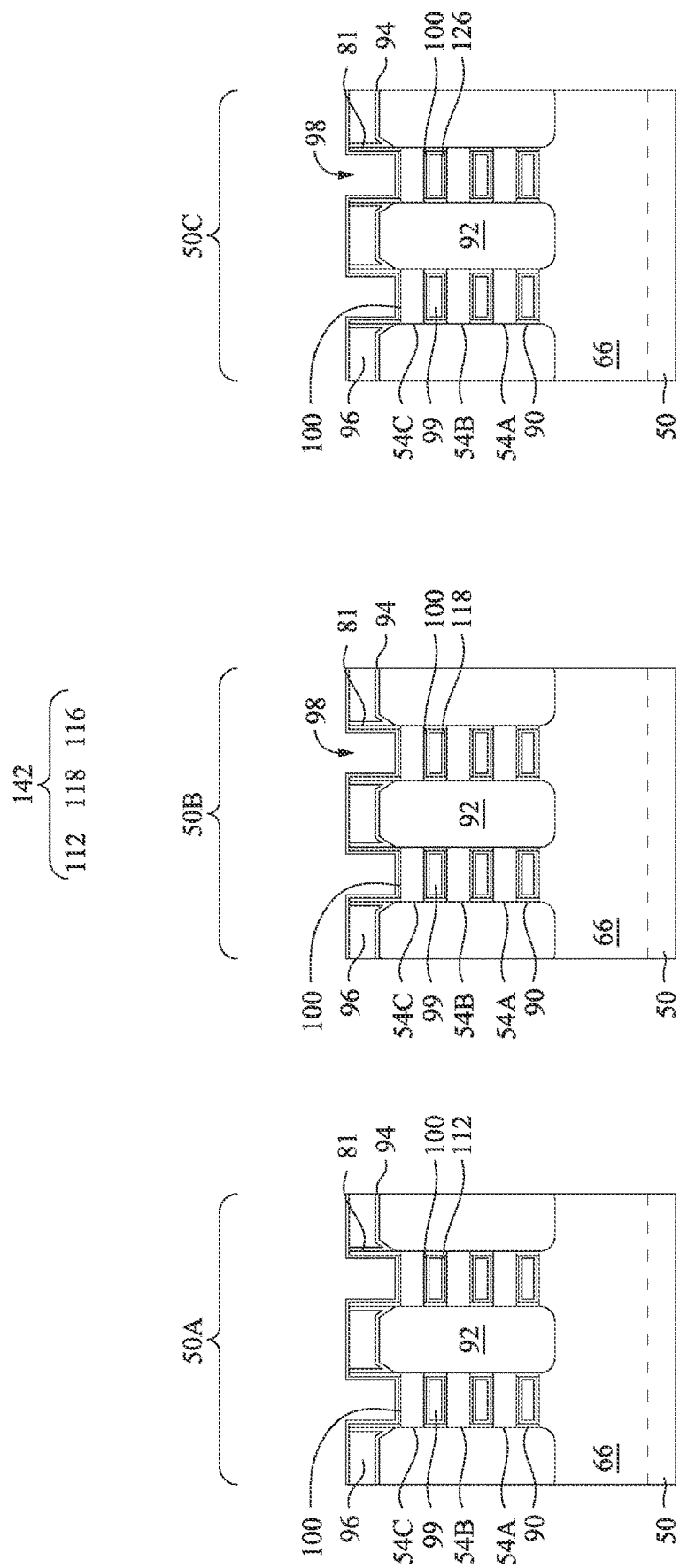
Figure 28A:
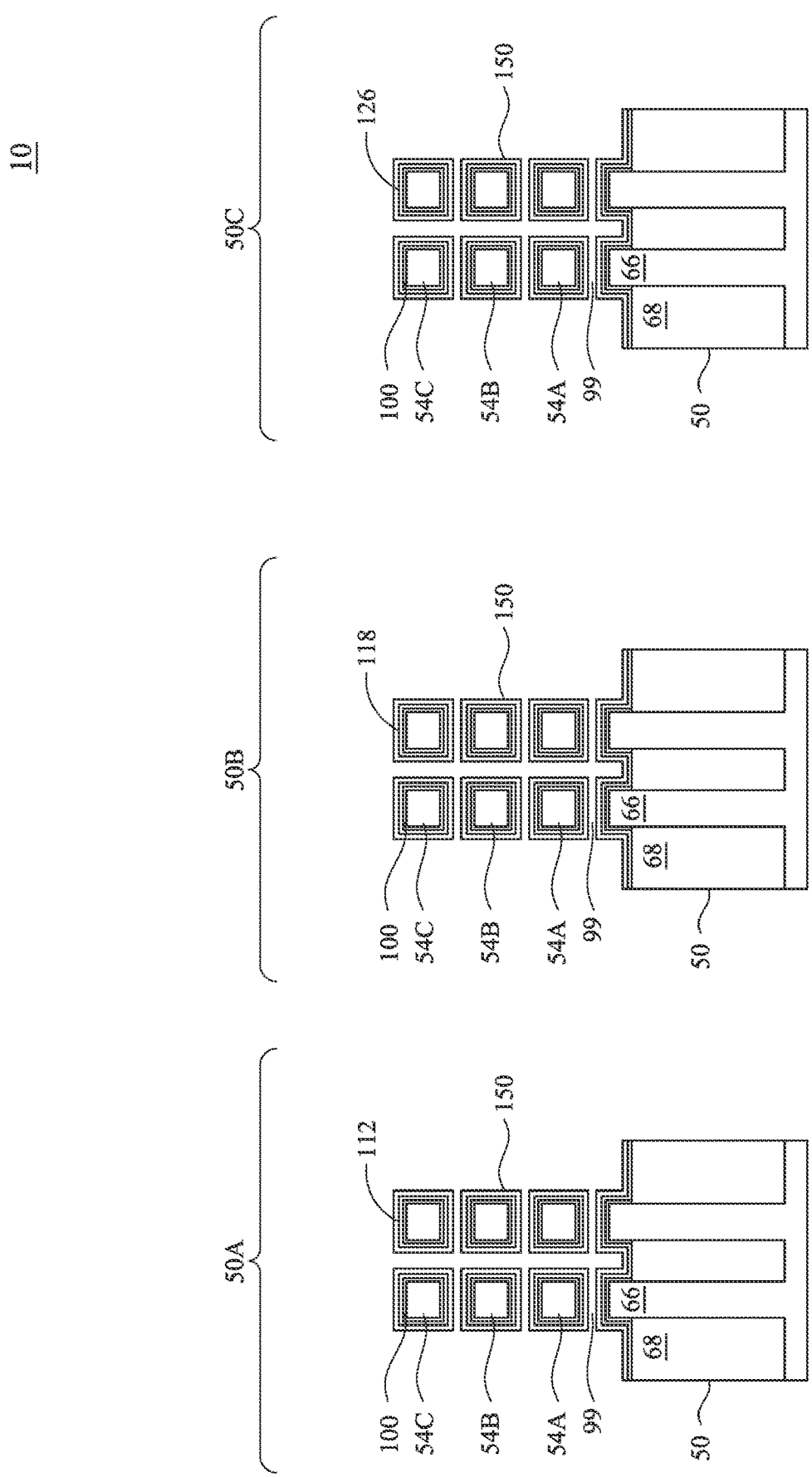
Figure 28B:
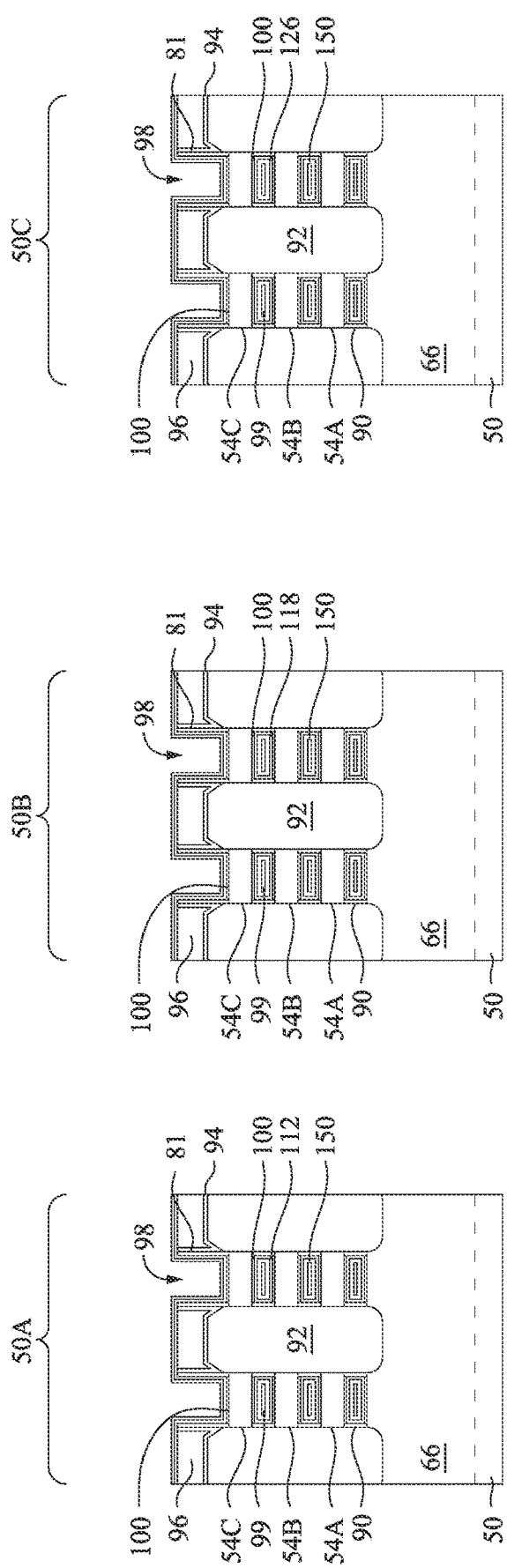

In FIGS. 27A and 27B, a third anneal process is performed to diffuse the third dipole dopant in the third dipole layer 120 into the first gate dielectric layer 104 in the second region 50B, thereby forming a third doped gate dielectric layer 126 in the second region 50B, in accordance with some embodiments. The third anneal process may be the soak anneal or the spike anneal. The third anneal process may be individually controlled. In some embodiments, the third anneal process may be the same as or similar to the first anneal process or the second anneal process, such as being one of the soak anneal or the spike anneal same as or similar to the first anneal process or the second anneal process, with same temperature, time, thermal budget. In some embodiments, the third anneal process may have a thermal budget less than the first thermal budget (e.g., shorter time period or lower temperature), or even less than the second thermal budget so as to bring less impact to the first dipole dopant in the first doped gate dielectric layer 112 and the second doped gate dielectric layer 118. Sufficient amounts of the second dipole dopant may be diffused to the first gate dielectric layer 104 to form the third doped gate dielectric layer 126 when the thermal diffusivity of the second dipole dopant is greater than the first dipole dopant. In some embodiments, the third doped gate dielectric layer 126 has an average atomic concentration of the second dipole dopant 1E12 atoms/cm$^3$ to 1E16 atoms/cm$^3$. After the third anneal process, the distances $D_2$ and $D_3$ may be reduced, and the distance $D_2$ may still be smaller than the distance $D_3$ because the first dipole dopant in the first doped gate dielectric layer 112 is annealed more times than the first dipole dopant in the second doped gate dielectric layer 118.

After the third anneal process is applied, the remaining portions of the third dipole layer 120 in the third region 50C are removed in accordance with some embodiments. The third dipole layer 120 may be removed by a suitable etching method, for example, by a wet etch process that etches the third dipole layer 120 at a faster rate than the first doped gate dielectric layer 112 in the first region 50A and the second doped gate dielectric layer 118 in the second region 50B.

It is appreciated that although the first doping loop, the second doping loop, and the third doping loop in the above-illustrated embodiments are performed in sequence, the sequence of the first doping loop, the second doping loop, and the third doping loop is not limited thereto since each of the first doping loop, the second doping loop, and the third doping loop can be individually performed and controlled. For example, the sequence of performing the first doping loop, the second doping loop, and the third doping loop may be changed in any manner when dipole dopants are some heavy atoms which may have a small thermal diffusivity and are not such thermal sensitive to heat. In such embodiments, the first doping loop may be performed after the second doping loop or the third doping loop. Also, although only three doping loops are illustrated in the above embodiments, more doping loops may also be performed for doping other dipole dopants into the doped regions or other regions.

In some embodiments, a second gate dielectric layer (not shown) is formed over the first doped gate dielectric layer 112, the second doped gate dielectric layer 118, and the third doped gate dielectric layer 126. The second gate dielectric layer may include a same high-k material with the first gate dielectric layer 104 may is free of dipole dopants. The second gate dielectric layer is a non-doped gate dielectric layer, such as free of the first dipole dopant and the second dipole dopant. In some embodiments, the second gate dielectric layer has a thickness similar to the first gate dielectric layer. The first doped gate dielectric layer 112, the second doped gate dielectric layer 118, the third doped gate dielectric layer 126, and the second gate dielectric layer (if exists) may be collectively referred to as the gate dielectric layer 142 (see FIG. 1). In some embodiments, the second gate dielectric layer may increase the capacitance equivalent thickness (CET) of the gate dielectric layer 142.

FIGS. 28A-29B illustrate the formation of gate electrodes 153A-153C. The gate electrodes 153A-153C may each comprise a conductive layer and a filling layer. For example, in FIGS. 28A and 28B, a conductive layer 150 is deposited over the first doped gate dielectric layer 112, the second doped gate dielectric layer 118, and the third doped gate dielectric layer 126 and along the first recesses 86. In some embodiments, the conductive layer 150 includes TiN, TiAlN, TiAlC, TaN, the like, or combinations thereof. In some embodiments, the conductive layer 150 is a single layer, such as a single TiN layer. In some embodiments, the conductive layer 150 is a composite layer, such as a TiN/TaN bi-layered structure. Because the threshold voltages of the gate structures in the first region 50A, the second region 50B, and the third region 50C may be adjusted by the dipole dopants, the conductive layer 150 may have a uniform thickness in the first region 50A, the second region 50B, and third region 50C without separately forming the conductive layer of different materials and/or thicknesses in each of the different regions. In some embodiments, the conductive layer 150 may have a function of being an adhesive layer, a work function layer and/or a barrier layer.

Figure 29A:
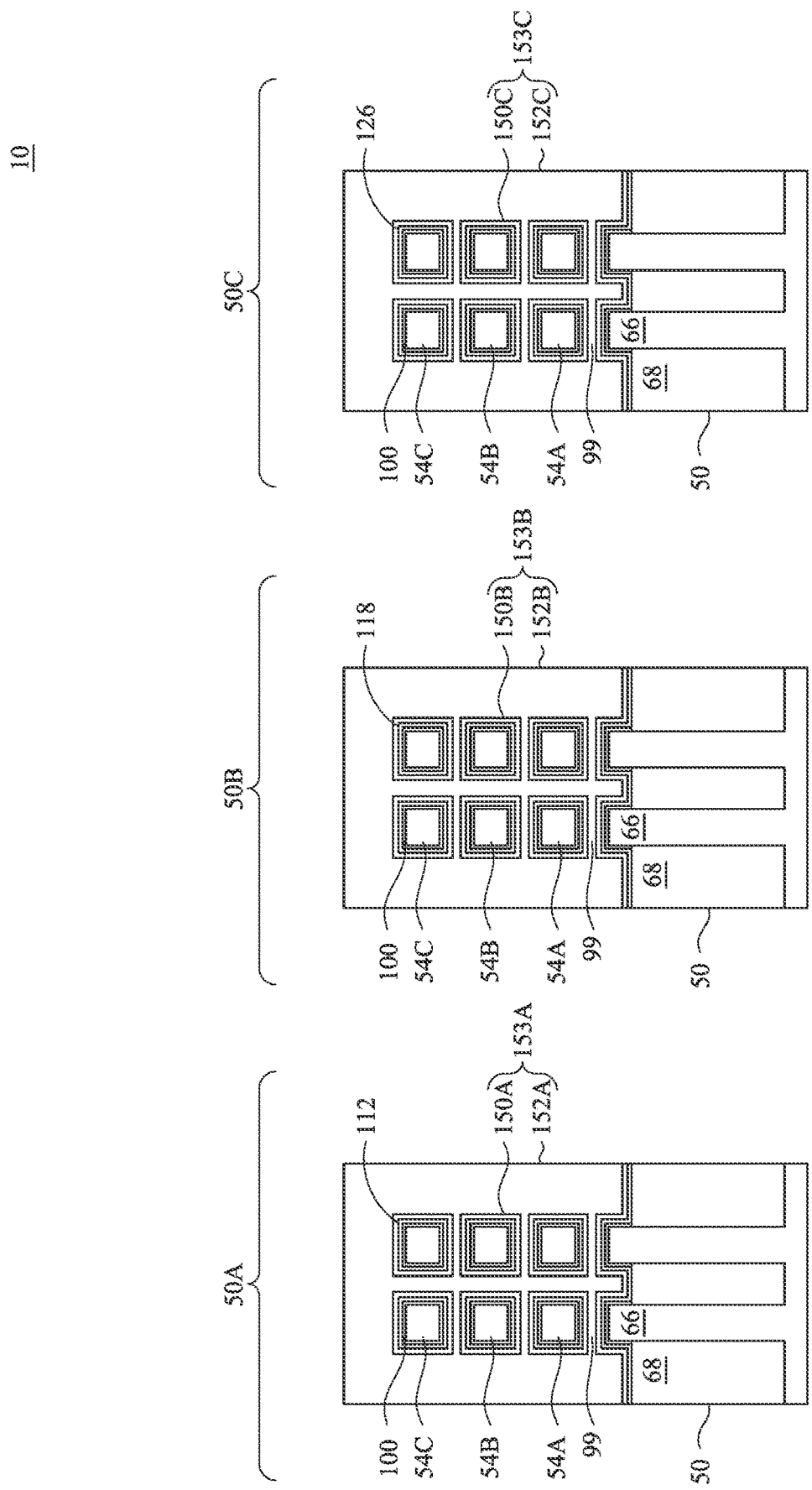
Figure 29B:
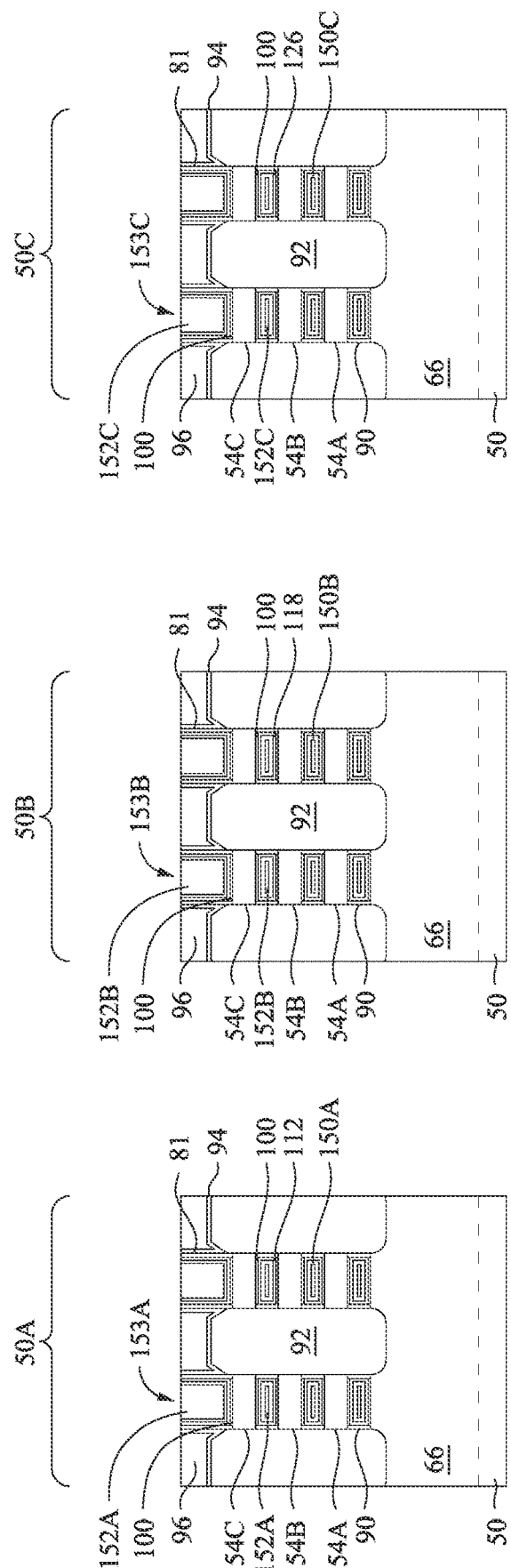

In FIGS. 29A and 29B, a filling layer 152 fills the remaining portions of the second recesses 98 and openings 99. The filling layer 152 may include, tungsten, cobalt, ruthenium, aluminum, the like, or combinations thereof. After the filling of the second recesses 98, a planarization process, such as a CMP, may be performed to remove the excess portions (e.g., portions over the top surface of the first ILD 96) of the gate dielectric layer 142, the conductive layer 150, and the filling layer 152, thereby forming a conductive layer 150A and a filling layer 152A in the first region 50A, a conductive layer 150B and a filling layer 152B in the second region 50B, and a conductive layer 150C and a filling layer 152C in the third region 50C. The respective one of conductive layers 150A-150C and the respective one of filling layers 152A-152C may be collectively referred to as a gate electrode 153A, 153B, or 153C, respectively. The gate electrodes 153A, 153B, and 153C may be collectively referred to as gate electrode 153 (e.g., see FIG. 1). In some embodiments, the device in the first region 50A and the device in the third region 50C may have a threshold voltage difference greater than 300 mV.

Figure 30A:
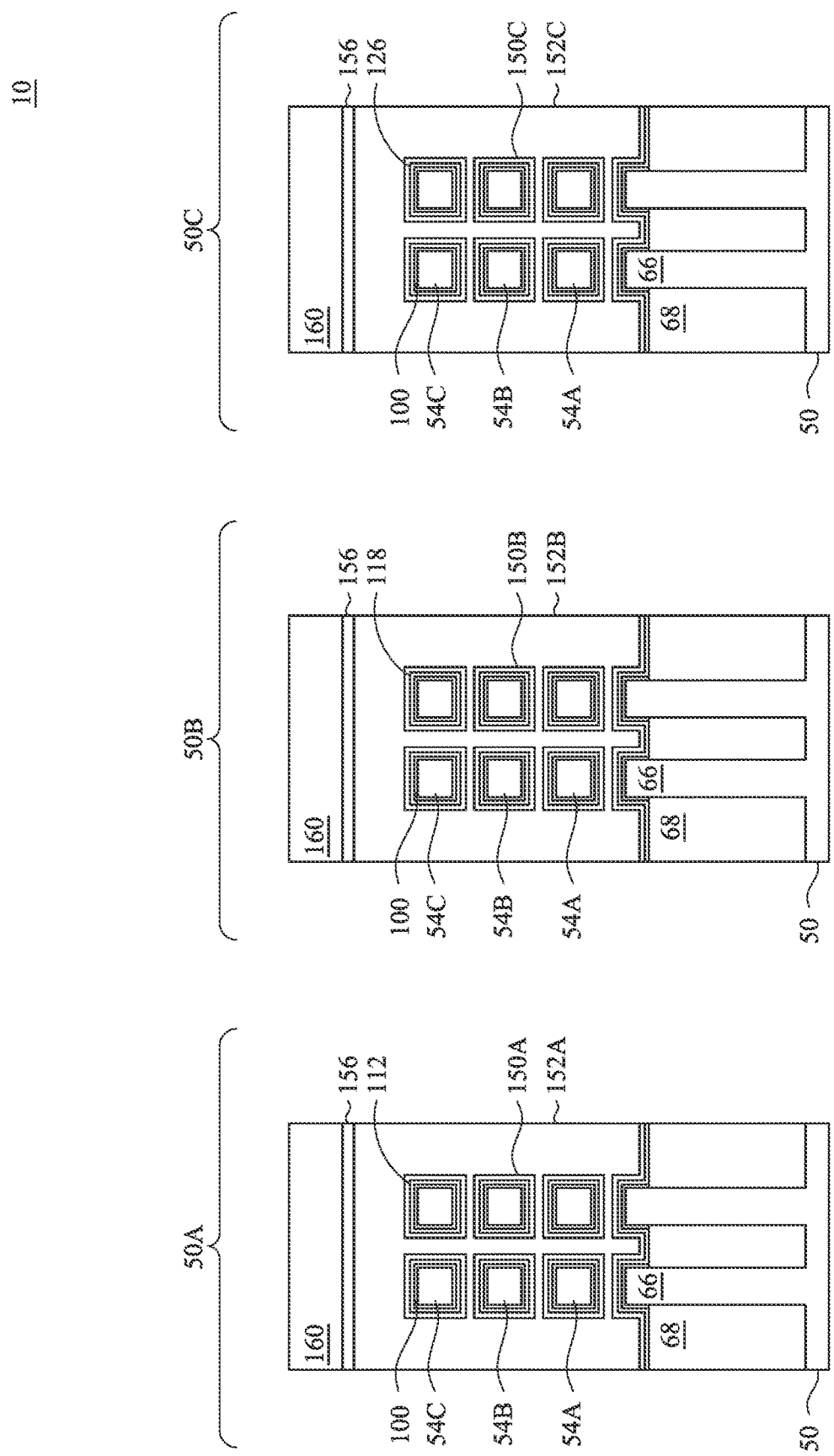
Figure 30B:
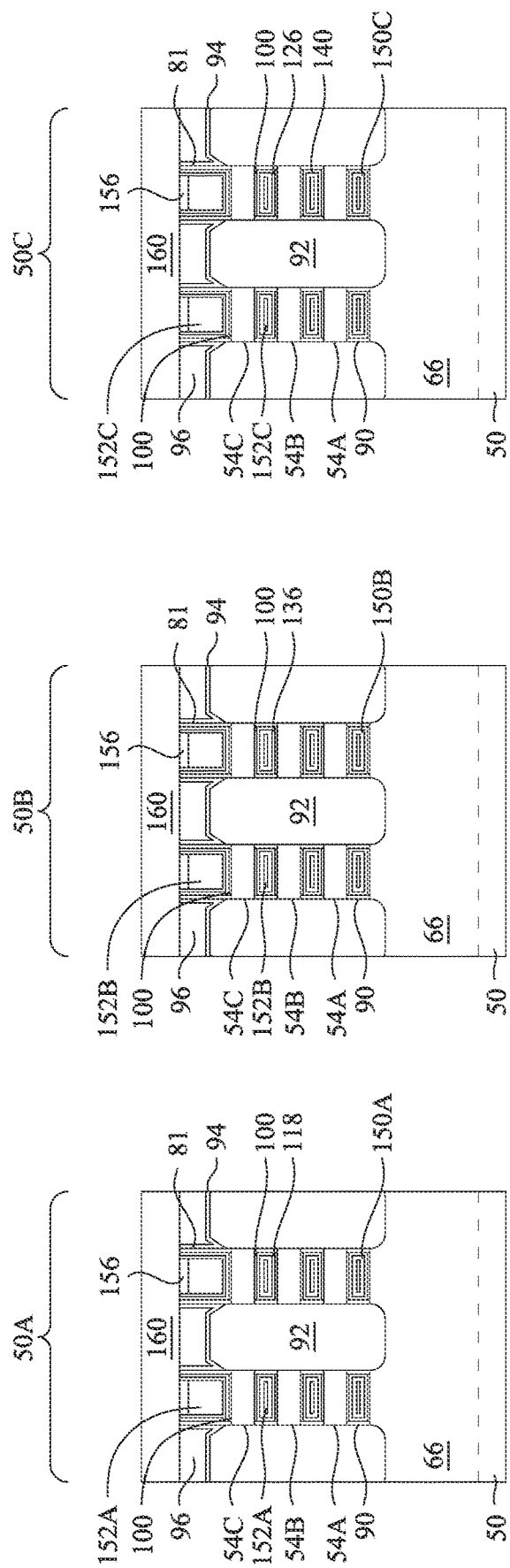
Figure 30C:
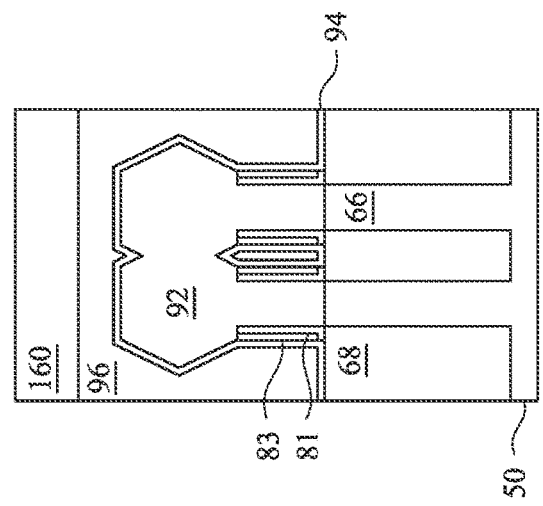

In FIGS. 30A-30C, the gate electrodes 153 and the gate dielectric layer 142 (e.g., the first doped gate dielectric layer 112, the second doped gate dielectric layer 118, and the third doped gate dielectric layer 126) are recessed, so that a recess is formed directly over the gate electrodes 153 and the gate dielectric layer 142 and between opposing portions of first spacers 81. A gate mask 156 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as contacts 172, discussed below with respect to FIGS. 28A-28B) penetrate through the gate mask 156 to contact the top surface of the recessed gate electrode 153.

As further illustrated by FIGS. 30A-30C, a second ILD 160 is deposited over the first ILD 96 and over the gate mask 156. In some embodiments, the second ILD 160 is a flowable film formed by FCVD. In some embodiments, the second ILD 160 is formed of a dielectric material such as PSG, BSG, BPSG, USG, or the like, and may be deposited by any suitable method, such as CVD, PECVD, or the like.

Figure 31A:
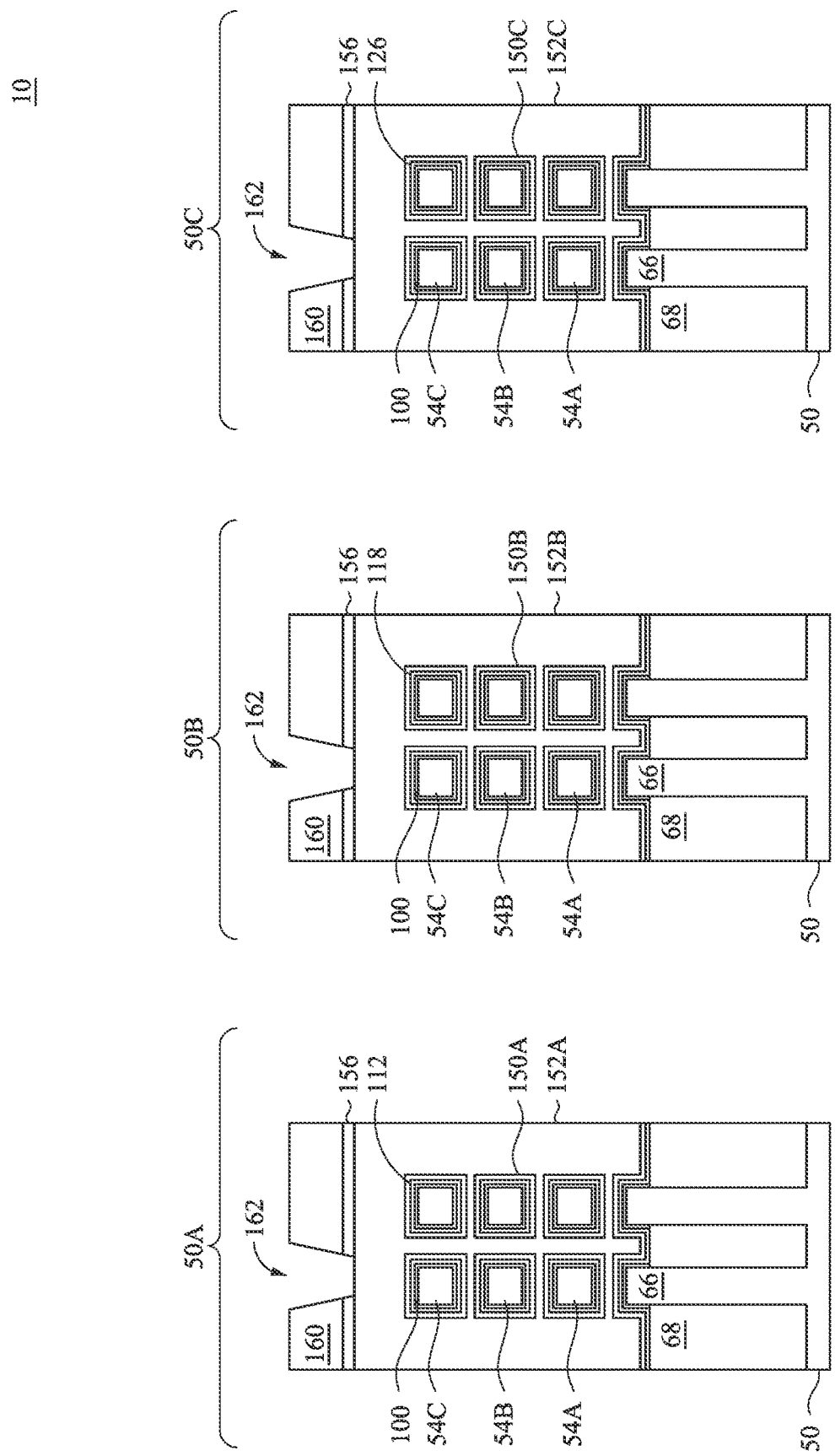
Figure 31B:
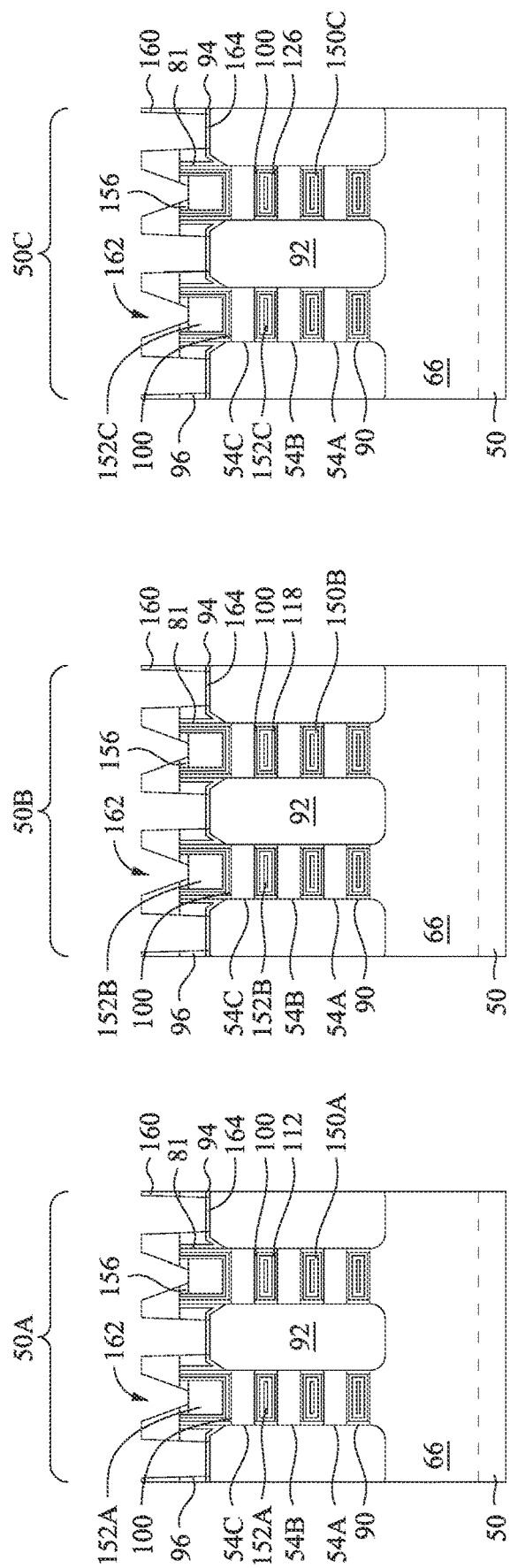
Figure 31C:
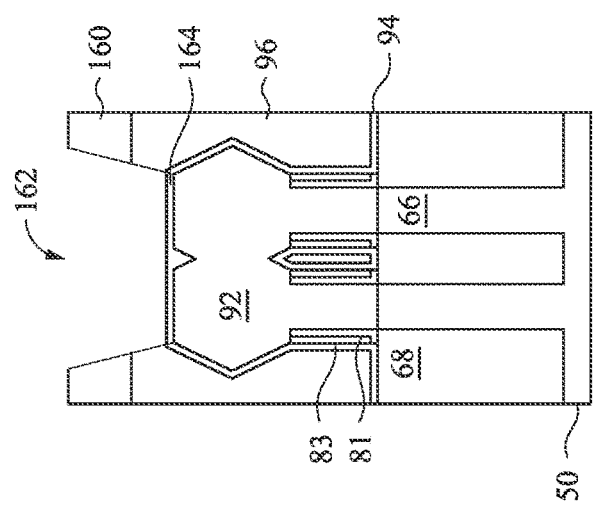
Figure 34A:
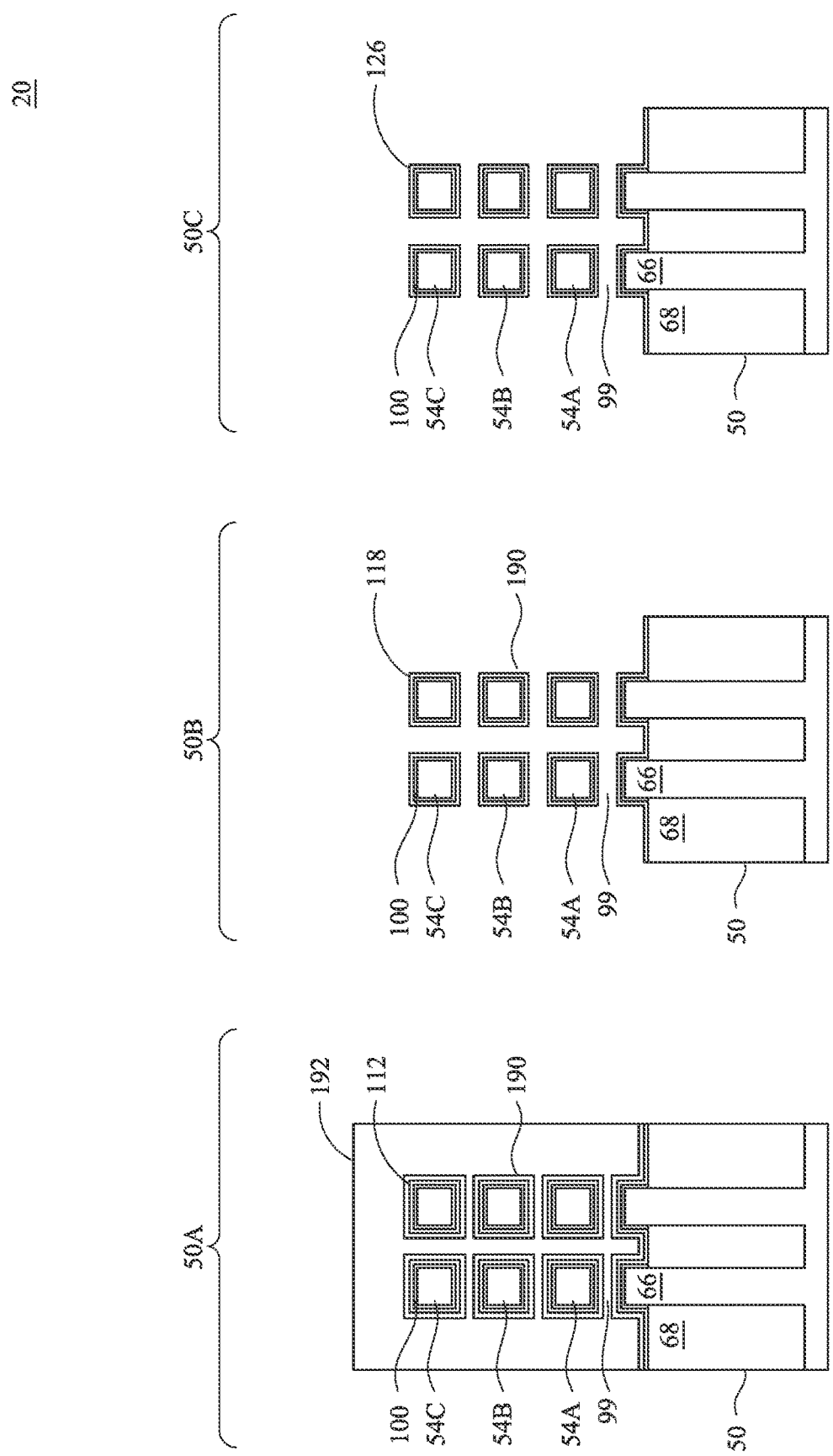
Figure 34B:
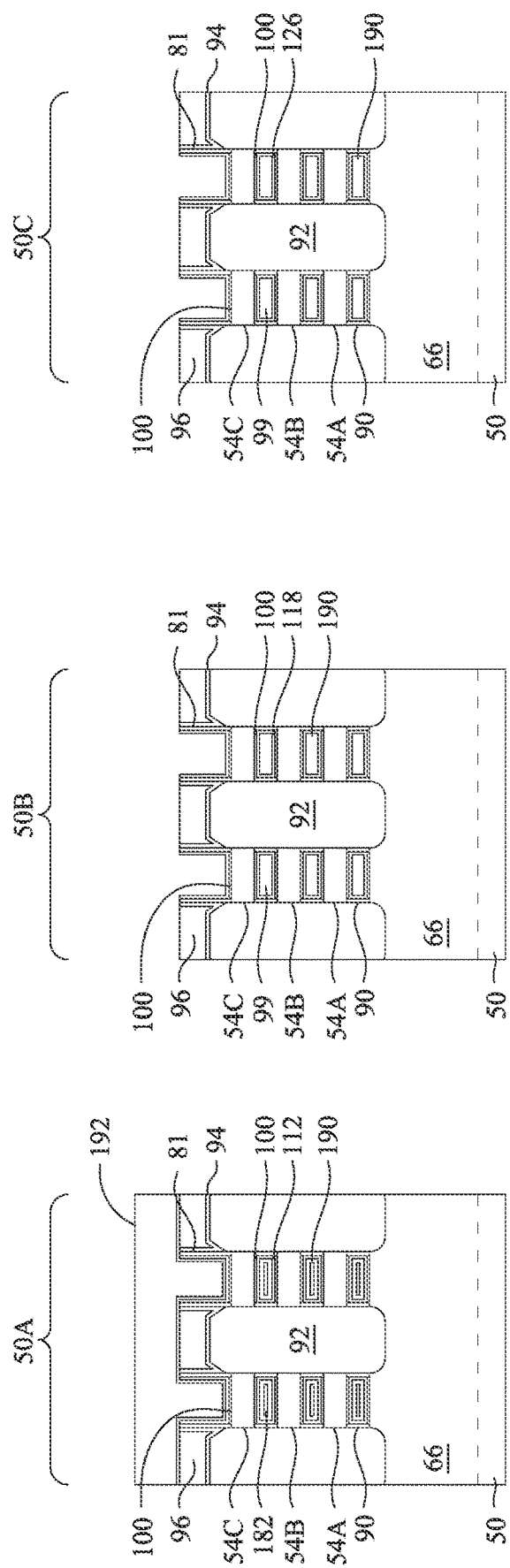
Figure 35A:
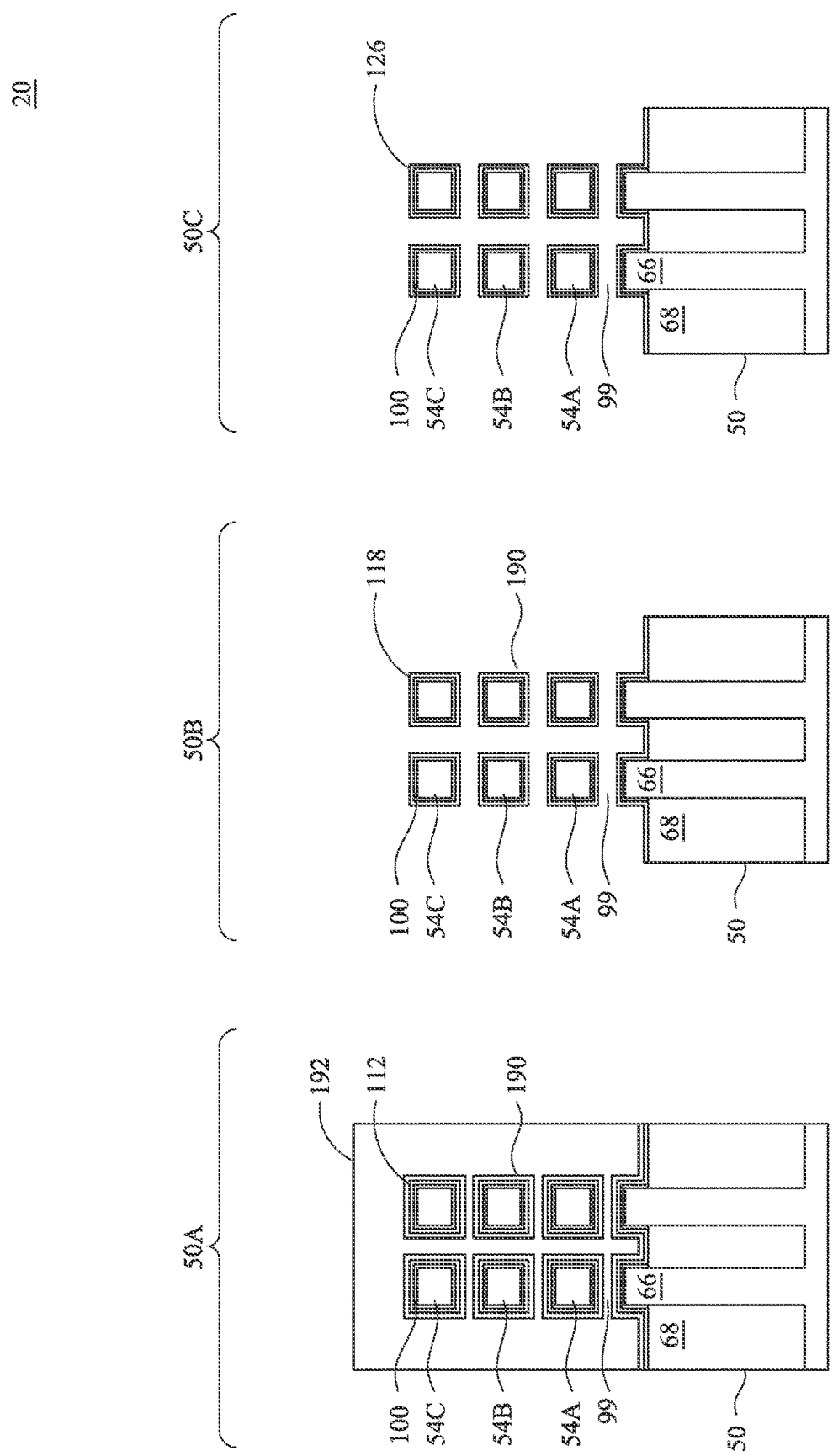
Figure 35B:
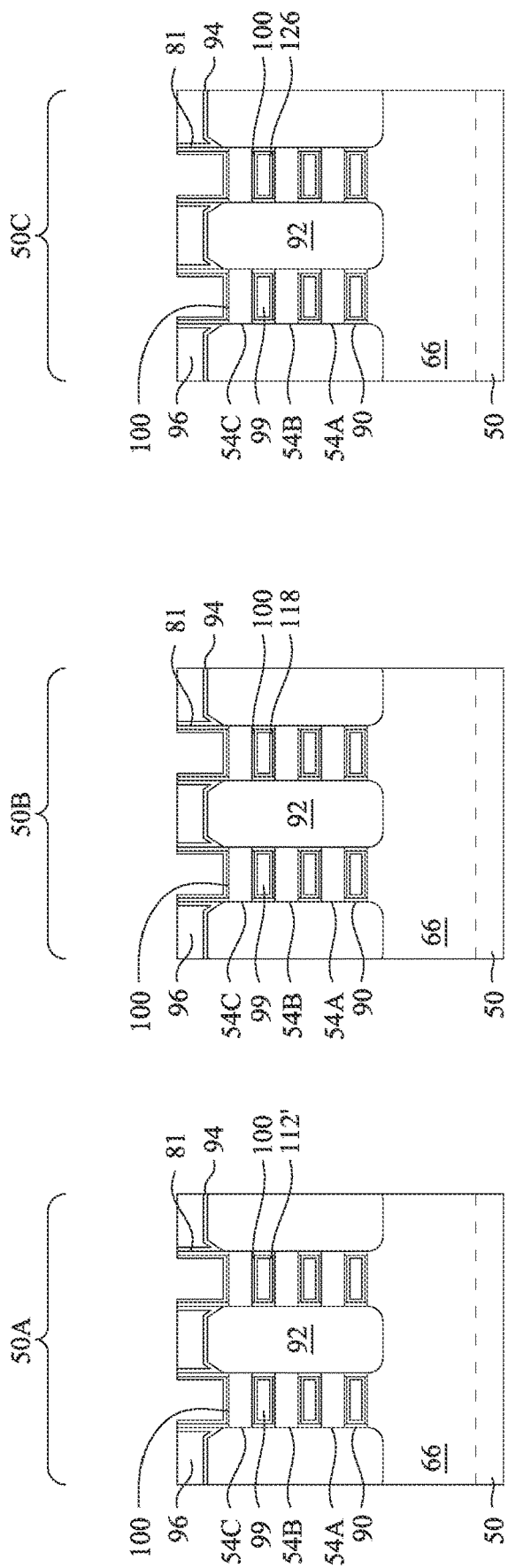

In FIGS. 31A-31C, the second ILD 160, the first ILD 96, the CESL 94, and the gate masks 156 are etched to form third recesses 162 exposing surfaces of the epitaxial source/drain regions 92 and/or the gate electrodes 153. The third recesses 162 may be formed by etching using an anisotropic etching process, such as RIE, NBE, or the like. In some embodiments, the third recesses 162 may be etched through the second ILD 160 and the first ILD 96 using a first etching process; may be etched through the gate masks 156 using a second etching process; and may then be etched through the CESL 94 using a third etching process. A mask, such as a photoresist, may be formed and patterned over the second ILD 160 to mask portions of the second ILD 160 from the first etching process and the second etching process. In some embodiments, the etching process may over-etch, and therefore, the third recesses 162 extend into the epitaxial source/drain regions 92 and/or the gate electrodes 153, and a bottom of the third recesses 162 may be level with (e.g., at a same level, or having a same distance from the substrate), or lower than (e.g., closer to the substrate) the epitaxial source/drain regions 92 and/or the gate electrodes 153. Although FIG. 34B illustrate the third recesses 162 as exposing the epitaxial source/drain regions 92 and the gate electrodes 153 in a same cross-section, in various embodiments, the epitaxial source/drain regions 92 and the gate electrodes 153 may be exposed in different cross-sections, thereby reducing the risk of shorting subsequently formed contacts. After the third recesses 162 are formed, silicide regions 164 are formed over the epitaxial source/drain regions 92. In some embodiments, the silicide regions 164 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 164. The un-reacted portions of the deposited metal are then removed, e.g., by an etching process. Although silicide regions 164 are referred to as silicide regions, silicide regions 164 may also be germanide regions, or silicon germanide regions (e.g., regions comprising silicide and germanide). In an embodiment, the silicide region 164 comprises TiSi, and has a thickness in a range between about 2 nm and about 10 nm.

Figure 32A:
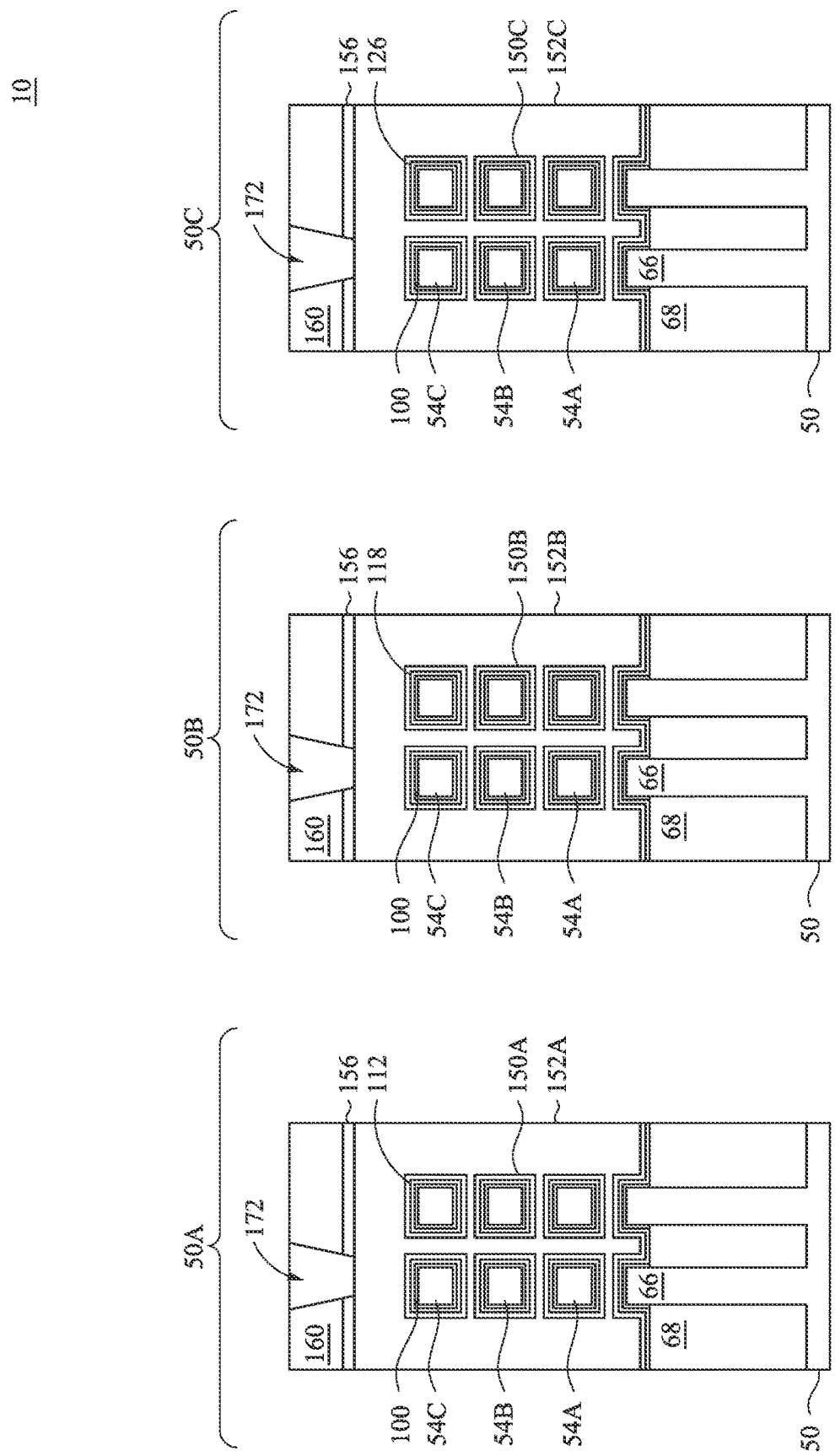
Figure 32B:
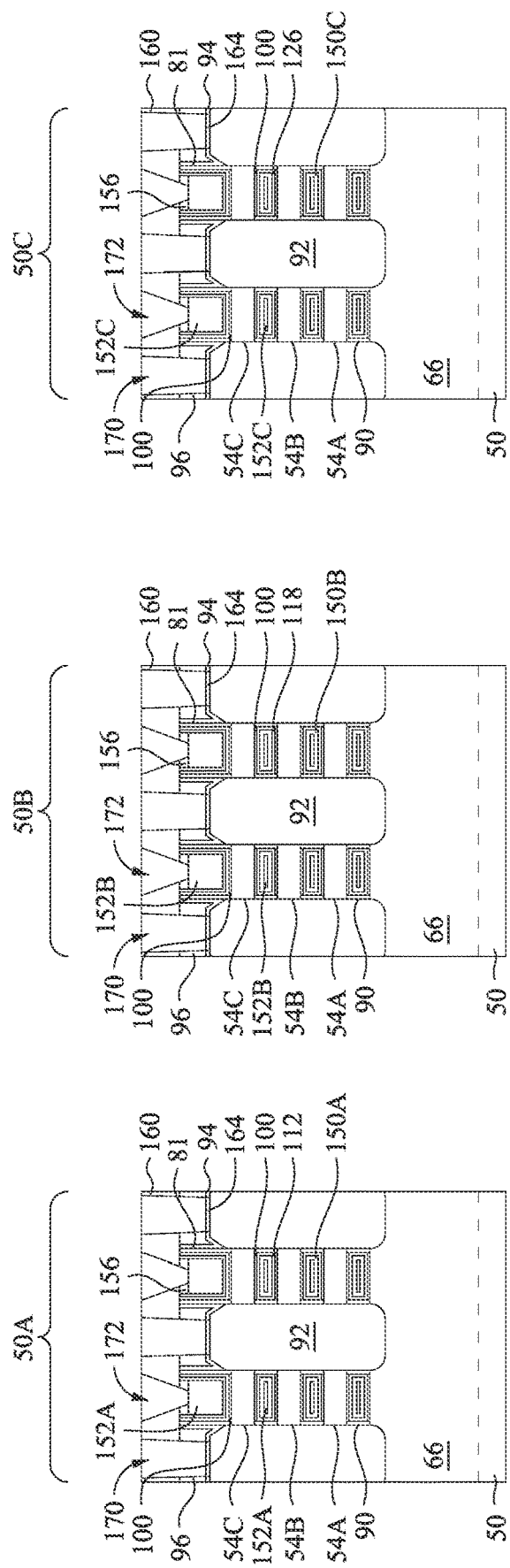
Figure 32C:
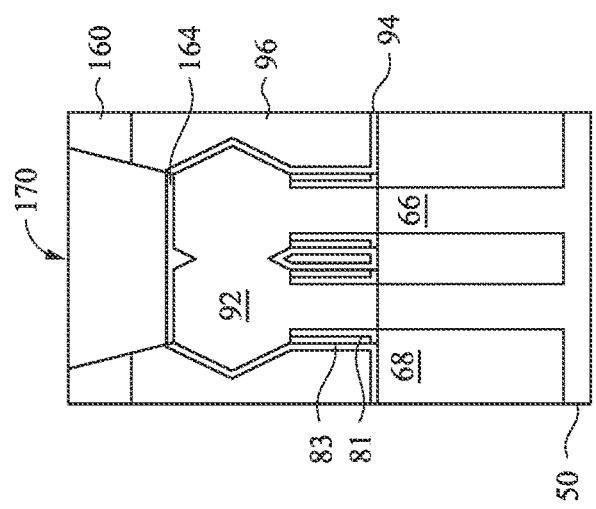
Figure 33A:
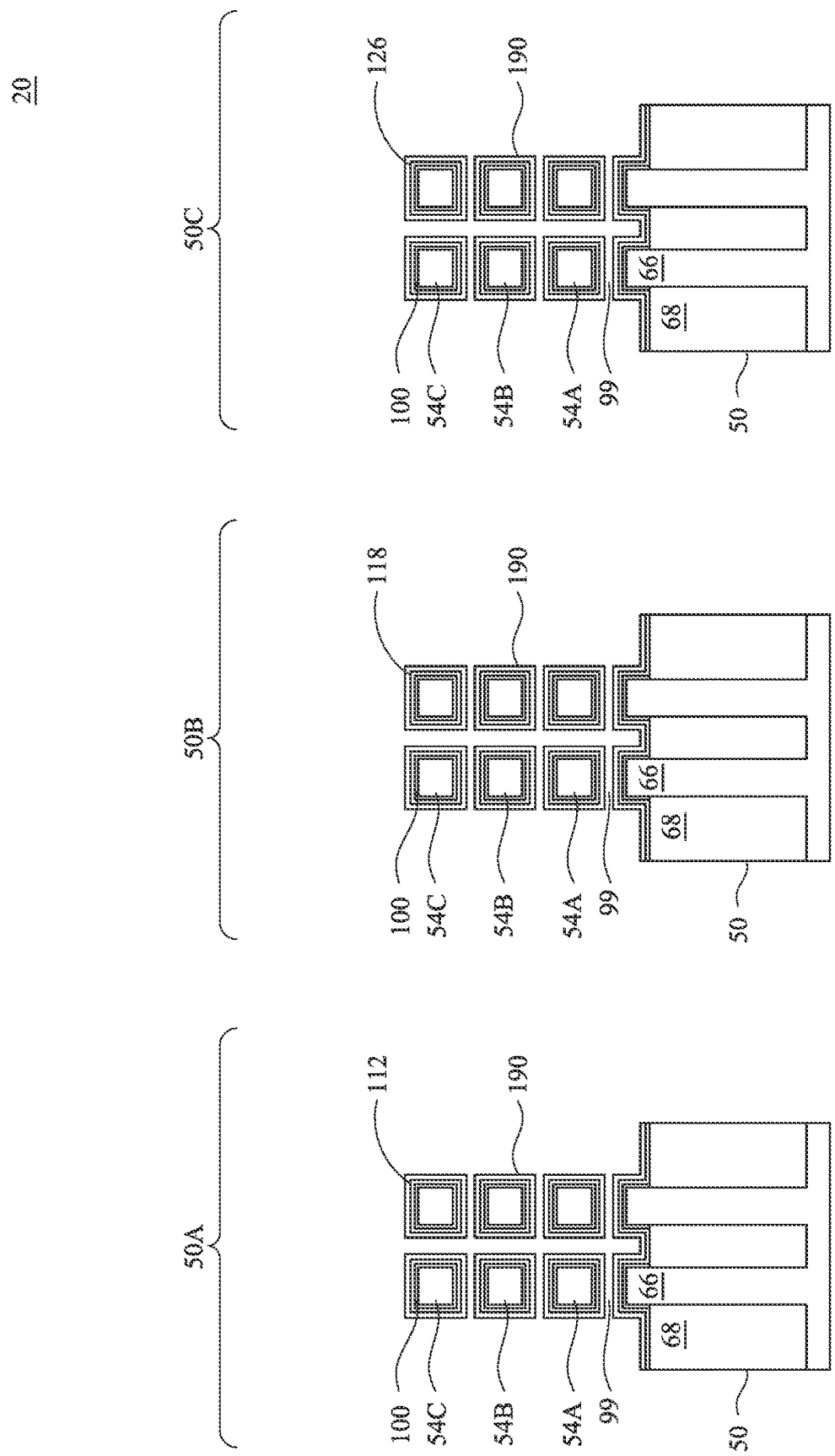
Figure 33B:
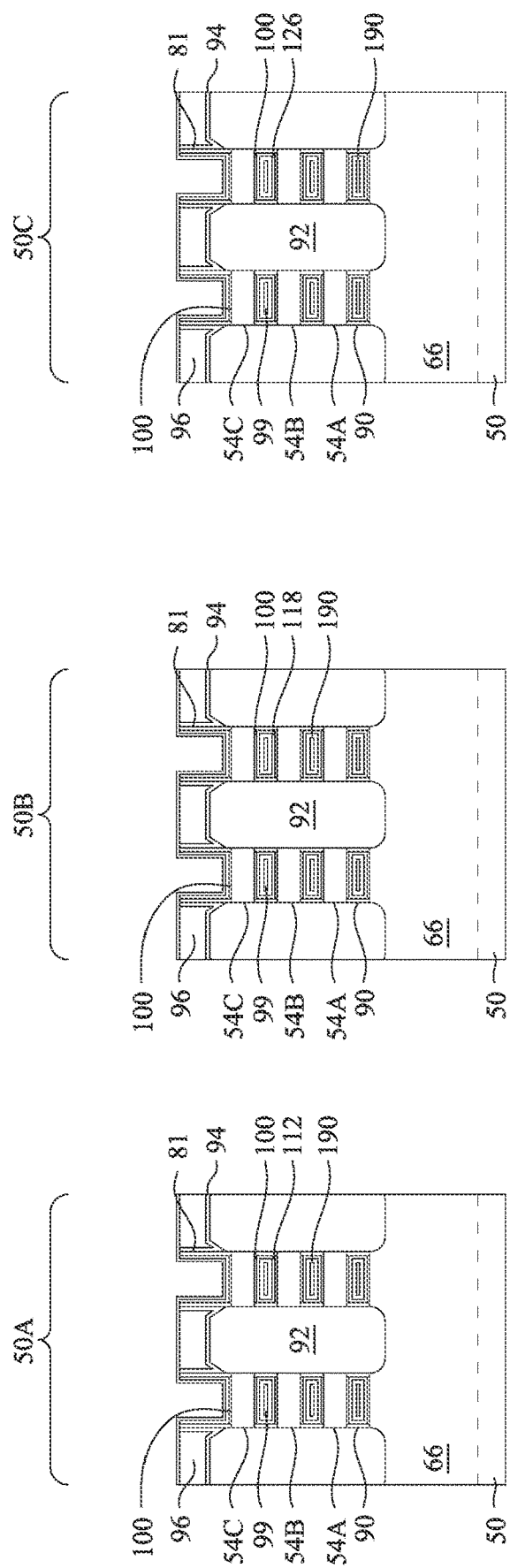

Next, in FIGS. 32A-32C, contacts 170 and 172 (may also be referred to as contact plugs) are formed in the third recesses 162. The contacts 170 and 172 may each comprise one or more layers, such as barrier layers, diffusion layers, and fill materials. For example, in some embodiments, the contacts 170 and 172 each include a barrier layer and a conductive material, and is electrically coupled to the underlying conductive feature (e.g., gate electrode 153 and/or silicide region 164 in the illustrated embodiment). The contacts 172 are electrically coupled to the gate electrodes 153 (e.g., the filling layer 152 and the conductive layer 150) may be referred to as gate contacts, and the contacts 170 are electrically coupled to the silicide regions 164 and may be referred to as source/drain contacts. The barrier layer may include titanium, titanium nitride, tantalum, tantalum nitride, or the like. The conductive material may be copper, copper alloy, silver, gold, tungsten, cobalt, aluminum, nickel, or the like. A planarization process, such as a CMP, may be performed to remove excess material from a surface of the second ILD 160.

FIGS. 33A to 35B illustrate cross-sectional views of intermediate stages in the manufacturing of a nano-FETs 20 in accordance with some embodiments. The manufacturing of the nano-FETs 20 is similar to those of the nano-FETs 10, wherein like reference numerals refer to like elements. For example, the processing of manufacturing the nano-FETs 20 as illustrated in FIGS. 33A-35B assumes the processing illustrated in FIGS. 2 to 27B performed prior. Accordingly, after the processing discussed above with reference to FIGS. 2 to 27B, processing may proceed to FIGS. 33A and 33B.

In some embodiments, one or more dipole doping loops may be performed on at least one of the first region 50A, the second region 50B, and the third region 50C, or other regions. Any number of the additional doping loops may be performed to at least one of the first region 50A, the second region 50B, and the third region 50C and is not limited by the narrow space between the nanostructures 55 because each of the dipole layers is removed in each dipole loop. For example, referring to FIGS. 33A-35B, a third dipole dopant different from the first dipole dopant and the second dipole dopant may be doped to the first doped gate dielectric layer 112 to fine-tune the gate threshold voltage of the gate structure 154A in the first region 50A in accordance with some embodiments. The third dipole dopant may be an n-type dipole dopant or a p- type dipole dopant. The fourth doping loop may include forming a fourth dipole layer 190 over the first doped gate dielectric layer 112, the second doped gate dielectric layer 118, and the third doped gate dielectric layer 126. The fourth dipole layer 190 may be patterned using a patterned mask 192. A fourth anneal process may be performed to diffuse the third dipole dopant into the first doped gate dielectric layer 112. A low concentration of the third dipole dopant in the first doped gate dielectric layer 112 may be sufficient to help fine-tune the operating characteristics. The third dipole layer 120 may have a thin thickness, such as being thinner than the thickness of the first dipole layer 106, or even thinner than the thicknesses of the second dipole layer 114 and the third dipole layer 120. The fourth anneal process may have a thermal budget less than the first anneal process, or even less than the thermal budget of the second anneal process and the third anneal process. Next, the manufacturing may proceed according to those similar to the processes as described in FIGS. 28A to 32C. A resulting structure of the nano-FETs 20 may be similar to the nano-FETs 10 as illustrated in FIGS. 32A-32C, where the first doped gate dielectric layer 112' of the nano-FETs 20 is doped with the first dipole dopant and the third dipole dopant.

According to embodiments of the present disclosure, a semiconductor device comprising gate dielectric layers doped with dipole dopant materials and methods of forming the semiconductor device are provided. The dipole dopant materials doped in the gate dielectric layers may adjust the threshold voltages of gate structures comprising the gate dielectric layers. In some embodiments, the one or more dipole dopant materials are doped into a gate dielectric layer by one or more individual doping loops, and each of the doping loops comprises an individual dipole layer formation and an individual anneal process. Accordingly, the concentration and concentration profiles of each dipole dopant material in one or more gate dielectric layers may be individually controlled, such as by controlling the thickness of the dipole layer or the temperature and/or time period of the anneal process in each doping loops. The methods according to some embodiments may also provide doping two or more dipole dopant materials in a single gate dielectric layer, with well-controlled concentration and concentration profiles of each of the dipole dopant materials, to provide fine-tuned threshold voltage.

In an embodiment, a semiconductor device includes a first channel region in a first device region, wherein the first device region has a first conductivity type; a second channel region in a second device region, wherein the second device region has the first conductivity type; a third channel region in a third device region, wherein the third device region has a second conductivity type different from the first conductivity type; a first doped gate dielectric layer disposed over the first channel region, wherein the first doped gate dielectric layer includes a high-k material doped with a first dipole dopant, wherein the first doped gate dielectric layer has a first concentration of the first dipole dopant, wherein the first doped gate dielectric layer has a first concentration profile of the first dipole dopant, wherein the first concentration profile has a first distance from a first concentration peak of the first dipole dopant to the first channel region, wherein the first dipole dopant is an n-type dipole dopant; a second doped gate dielectric layer disposed over the second channel region, wherein the second doped gate dielectric layer includes the high-k material doped with the first dipole dopant, wherein the second doped gate dielectric layer has a second concentration of the first dipole dopant, wherein the second doped gate dielectric layer has a second concentration profile of the first dipole dopant, wherein the second concentration profile has a second distance from a second concentration peak of the first dipole dopant to the second channel region, wherein the first concentration is greater than the second concentration, wherein the first distance is less than the second distance; a third doped gate dielectric layer disposed over the third channel region, wherein the third doped gate dielectric layer includes the high-k material doped with a second dipole dopant different from the first dipole dopant; a first gate electrode over the first doped gate dielectric layer, wherein the first gate electrode includes a first conductive layer and a first filling layer over the first conductive layer; a second gate electrode over the second doped gate dielectric layer; and a third gate electrode over the third doped gate dielectric layer, wherein the third gate electrode includes a second conductive layer and a second filling layer disposed over the second conductive layer, wherein the first filling layer and the second filling layer have a same width. In an embodiment, the first conductive layer is a single layer, wherein the first conductive layer is in physical contact with the first filling layer and the first doped gate dielectric layer, wherein the second conductive layer is a single layer, wherein the second conductive layer is in physical contact with the second filling layer and the third doped gate dielectric layer. In an embodiment, the first dipole dopant includes La, Mg, Sr, or Y, and the second dipole dopant includes Ti, Al, Ga, In, Nb, or Zn. In an embodiment, the first dipole dopant has a smaller thermal diffusivity than the second dipole dopant. In an embodiment, the semiconductor device further includes a first non-doped gate dielectric layer between the first doped gate dielectric layer and the first gate electrode; a second non-doped gate dielectric layer between the second doped gate dielectric layer and the second gate electrode; and a third non-doped gate dielectric layer between the third doped gate dielectric layer and the third gate electrode. In an embodiment, the first doped gate dielectric layer further includes a third dipole dopant different from the first dipole dopant and the second dipole dopant.

In an embodiment, a method of manufacturing a semiconductor device includes forming a first gate dielectric layer over a first channel region in a first device region, a second channel region in a second device region, and a third channel region in a third device region, wherein the first device region and the second device region have a first conductivity type, and wherein the third device region has a second conductivity type different from the first conductivity type; forming a first dipole layer including a first dipole dopant over the first gate dielectric layer in the first device region; performing a first anneal process to transform the first gate dielectric layer in the first device region to a first doped gate dielectric layer including the first dipole dopant, wherein the first anneal process has a first thermal budget; removing remaining portions of the first dipole layer; after removing remaining portions of the first dipole layer, forming a second dipole layer including the first dipole dopant over the first gate dielectric layer in the second device region, wherein the second dipole layer has a thickness thinner than a thickness of the first dipole layer; performing a second anneal process to transform the first gate dielectric layer in the second device region to a second doped gate dielectric layer including the first dipole dopant, wherein the second anneal process has a second thermal budget different than the first thermal budget; removing remaining portions of the second dipole layer; transforming the first gate dielectric layer in the third device region to a third doped gate dielectric layer, wherein the third doped gate dielectric layer includes a second dipole dopant different from the first dipole dopant; and forming a first gate electrode over the first doped gate dielectric layer, a second gate electrode over the second doped gate dielectric layer, and a third gate electrode over the third doped gate dielectric layer, wherein each of the first gate electrode, the second gate electrode, and the third gate electrode includes a conductive layer and a filling layer filling over the conductive layer, wherein each of the filling layers has a substantially same width. In an embodiment, the first anneal process and the second anneal process are different. In an embodiment, the second anneal process has a same temperature as the first anneal process and has a shorter period than that of the first anneal process. In an embodiment, the second anneal process has a same time period as the first anneal process and has a lower temperature than that of the first anneal process. In an embodiment, the second dipole dopant has a thermal diffusivity greater than the first dipole dopant. In an embodiment, the method further includes doping a third dipole dopant into the first gate dielectric layer before forming the first gate electrode, the second gate electrode, and the third gate electrode. In an embodiment, the first dipole layer is an oxide or a nitride of the first dipole dopant.

In an embodiment, a method of manufacturing a semiconductor device includes forming a first gate dielectric layer over a first channel region in a first p-type region, over a second channel region in a second p-type region, and over a third channel region in an n-type region; performing a first doping loop to transform the first gate dielectric layer in the first p-type region to a first doped gate dielectric layer, wherein the first doping loop includes: forming a first dipole layer over the first gate dielectric layer in the first p-type region over the first gate dielectric layer, wherein the first dipole layer includes a first dipole dopant and has a first thickness; and performing a first anneal; after the first doping loop, performing a second doping loop to transform the first gate dielectric layer in the second p-type region to a second doped gate dielectric layer, wherein the second doping loop includes: forming a second dipole layer over the first gate dielectric layer in the second p-type region, wherein the second dipole layer includes the first dipole dopant and has a second thickness different from the first thickness; and performing a second anneal; performing a third doping loop to transform the first gate dielectric layer in the n-type region to a third doped gate dielectric layer, wherein the third doping loop includes: forming a third dipole layer including a second dipole dopant different from the first dipole dopant; and performing a third anneal; and forming a first gate electrode over the first doped gate dielectric layer, a second gate electrode over the second doped gate dielectric layer, and a third gate electrode over the third doped gate dielectric layer. In an embodiment, the first dipole dopant has a smaller thermal diffusivity than the second dipole dopant. In an embodiment, the method further includes forming a second gate dielectric layer over the first doped gate dielectric layer, the second doped gate dielectric layer, and the third doped gate dielectric layer before forming the first gate electrode, the second gate electrode, and the third gate electrode, wherein the second gate dielectric layer is substantially free of the first dipole dopant and the second dipole dopant, wherein each of the first gate electrode, the second gate electrode, and the third gate electrode is in physical contact with the second gate dielectric layer. In an embodiment, the first anneal and the second anneal have a same temperature and a same time period. In an embodiment, the first anneal is a soak anneal or a spike anneal. In an embodiment, a thermal budget of the second anneal is smaller than a thermal budget of the first anneal. In an embodiment, the method further includes performing a fourth doping loop to dope a third dipole dopant into the first doped gate dielectric layer, wherein the third dipole dopant is different from the first dipole dopant and the second dipole dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first channel region in a first device region, wherein the first device region has a first conductivity type;
    a second channel region in a second device region, wherein the second device region has the first conductivity type;
    a third channel region in a third device region, wherein the third device region has a second conductivity type different from the first conductivity type;
    a first doped gate dielectric layer disposed over the first channel region, wherein the first doped gate dielectric layer comprises a high-k material doped with a first dipole dopant, wherein the first doped gate dielectric layer has a first concentration of the first dipole dopant, wherein the first doped gate dielectric layer has a first concentration profile of the first dipole dopant, wherein the first concentration profile has a first distance from a first concentration peak of the first dipole dopant to the first channel region, wherein the first dipole dopant is an n-type dipole dopant;
    a second doped gate dielectric layer disposed over the second channel region, wherein the second doped gate dielectric layer comprises the high-k material doped with the first dipole dopant, wherein the second doped gate dielectric layer has a second concentration of the first dipole dopant, wherein the second doped gate dielectric layer has a second concentration profile of the first dipole dopant, wherein the second concentration profile has a second distance from a second concentration peak of the first dipole dopant to the second channel region, wherein the first concentration is greater than the second concentration, wherein the first distance is less than the second distance;
    a third doped gate dielectric layer disposed over the third channel region, wherein the third doped gate dielectric layer comprises the high-k material doped with a second dipole dopant different from the first dipole dopant;
    a first gate electrode over the first doped gate dielectric layer, wherein the first gate electrode comprises a first conductive layer and a first filling layer over the first conductive layer;
    a second gate electrode over the second doped gate dielectric layer; and
    a third gate electrode over the third doped gate dielectric layer, wherein the third gate electrode comprises a second conductive layer and a second filling layer disposed over the second conductive layer, wherein the first filling layer and the second filling layer have a same width.

2. The semiconductor device of claim 1, wherein the first conductive layer is a single layer, wherein the first conductive layer is in physical contact with the first filling layer and the first doped gate dielectric layer, wherein the second conductive layer is a single layer, wherein the second conductive layer is in physical contact with the second filling layer and the third doped gate dielectric layer.

3. The semiconductor device of claim 1, wherein the first dipole dopant comprises La, Mg, Sr, or Y, and the second dipole dopant comprises Ti, Al, Ga, In, Nb, or Zn.

4. The semiconductor device of claim 1, wherein the first dipole dopant has a smaller thermal diffusivity than the second dipole dopant.

5. The semiconductor device of claim 1, further comprising:
    a first non-doped gate dielectric layer between the first doped gate dielectric layer and the first gate electrode;
    a second non-doped gate dielectric layer between the second doped gate dielectric layer and the second gate electrode; and
    a third non-doped gate dielectric layer between the third doped gate dielectric layer and the third gate electrode.

6. The semiconductor device of claim 1, wherein the first doped gate dielectric layer further comprises a third dipole dopant different from the first dipole dopant and the second dipole dopant.

7. A method of manufacturing a semiconductor device, the method comprising:
    forming a first gate dielectric layer over a first channel region in a first device region, a second channel region in a second device region, and a third channel region in a third device region, wherein the first device region and the second device region have a first conductivity type, and wherein the third device region has a second conductivity type different from the first conductivity type;
    forming a first dipole layer comprising a first dipole dopant over the first gate dielectric layer in the first device region;
    performing a first anneal process to transform the first gate dielectric layer in the first device region to a first doped gate dielectric layer comprising the first dipole dopant, wherein the first anneal process has a first thermal budget;
    removing remaining portions of the first dipole layer;
    after removing remaining portions of the first dipole layer, forming a second dipole layer comprising the first dipole dopant over the first gate dielectric layer in the second device region, wherein the second dipole layer has a thickness thinner than a thickness of the first dipole layer;

performing a second anneal process to transform the first gate dielectric layer in the second device region to a second doped gate dielectric layer comprising the first dipole dopant, wherein the second anneal process has a second thermal budget different than the first thermal budget;

removing remaining portions of the second dipole layer;

transforming the first gate dielectric layer in the third device region to a third doped gate dielectric layer, wherein the third doped gate dielectric layer comprises a second dipole dopant different from the first dipole dopant; and forming a first gate electrode over the first doped gate dielectric layer, a second gate electrode over the second doped gate dielectric layer, and a third gate electrode over the third doped gate dielectric layer, wherein each of the first gate electrode, the second gate electrode, and the third gate electrode comprises a conductive layer and a filling layer over the conductive layer, wherein each of the filling layers has a substantially same width.

8. The method of claim 7, wherein the first anneal process and the second anneal process are different.

9. The method of claim 7, wherein the second anneal process has a same temperature as the first anneal process and has a shorter period than that of the first anneal process.

10. The method of claim 7, wherein the second anneal process has a same time period as the first anneal process and has a lower temperature than that of the first anneal process.

11. The method of claim 7, wherein the second dipole dopant has a thermal diffusivity greater than the first dipole dopant.

12. The method of claim 7, further comprising doping a third dipole dopant into the first gate dielectric layer before forming the first gate electrode, the second gate electrode, and the third gate electrode.

13. The method of claim 7, wherein the first dipole layer is an oxide or a nitride of the first dipole dopant.

14. A method of manufacturing a semiconductor device, the method comprising:
    forming a first gate dielectric layer over a first channel region in a first p-type region, over a second channel region in a second p-type region, and over a third channel region in an n-type region;
    performing a first doping loop to transform the first gate dielectric layer in the first p-type region to a first doped gate dielectric layer, wherein the first doping loop comprises:
        forming a first dipole layer over the first gate dielectric layer in the first p-type region, wherein the first dipole layer comprises a first dipole dopant and has a first thickness; and
        performing a first anneal;
    after the first doping loop, performing a second doping loop to transform the first gate dielectric layer in the second p-type region to a second doped gate dielectric layer, wherein the second doping loop comprises:
        forming a second dipole layer over the first gate dielectric layer in the second p-type region, wherein the second dipole layer comprises the first dipole dopant and has a second thickness different from the first thickness; and
        performing a second anneal;
    performing a third doping loop to transform the first gate dielectric layer in the n-type region to a third doped gate dielectric layer, wherein the third doping loop comprises:
        forming a third dipole layer comprising a second dipole dopant different from the first dipole dopant; and
        performing a third anneal; and
    forming a first gate electrode over the first doped gate dielectric layer, a second gate electrode over the second doped gate dielectric layer, and a third gate electrode over the third doped gate dielectric layer.

15. The method of claim 14, wherein the first dipole dopant has a smaller thermal diffusivity than the second dipole dopant.

16. The method of claim 14, further comprising forming a second gate dielectric layer over the first doped gate dielectric layer, the second doped gate dielectric layer, and the third doped gate dielectric layer before forming the first gate electrode, the second gate electrode, and the third gate electrode, wherein the second gate dielectric layer is substantially free of the first dipole dopant and the second dipole dopant, wherein each of the first gate electrode, the second gate electrode, and the third gate electrode is in physical contact with the second gate dielectric layer.

17. The method of claim 14, wherein the first anneal and the second anneal have a same temperature and a same time period.

18. The method of claim 14, wherein the first anneal is a soak anneal or a spike anneal.

19. The method of claim 14, wherein a thermal budget of the second anneal is smaller than a thermal budget of the first anneal.

20. The method of claim 14, further comprising performing a fourth doping loop to dope a third dipole dopant into the first doped gate dielectric layer, wherein the third dipole dopant is different from the first dipole dopant and the second dipole dopant.

* * * * *